(12) United States Patent
Nakano

(10) Patent No.: US 9,947,536 B2
(45) Date of Patent: Apr. 17, 2018

(54) SEMICONDUCTOR POWER DEVICE AND METHOD FOR PRODUCING SAME

(71) Applicant: ROHM CO., LTD., Kyoto (JP)

(72) Inventor: Yuki Nakano, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 15/257,991

(22) Filed: Sep. 7, 2016

(65) Prior Publication Data
US 2016/0379825 A1    Dec. 29, 2016

Related U.S. Application Data

(62) Division of application No. 13/983,206, filed as application No. PCT/JP2012/052290 on Feb. 1, 2012, now Pat. No. 9,472,405.

(30) Foreign Application Priority Data

Feb. 2, 2011   (JP) .................................. 2011-020729

(51) Int. Cl.
    *H01L 23/31*      (2006.01)
    *H01L 23/495*     (2006.01)
    (Continued)

(52) U.S. Cl.
CPC ........ *H01L 21/049* (2013.01); *H01L 21/0217* (2013.01); *H01L 21/02164* (2013.01); *H01L 21/02178* (2013.01); *H01L 21/02241* (2013.01); *H01L 21/02255* (2013.01); *H01L 21/02271* (2013.01); *H01L 21/044* (2013.01); *H01L 21/28008* (2013.01); *H01L 21/28264* (2013.01); *H01L 27/04* (2013.01); *H01L 29/0619* (2013.01); *H01L 29/1602* (2013.01); *H01L 29/1608* (2013.01); *H01L 29/2003* (2013.01); *H01L 29/4236* (2013.01); *H01L 29/42368* (2013.01); *H01L 29/513* (2013.01); *H01L 29/517* (2013.01); *H01L 29/518* (2013.01);
(Continued)

(58) Field of Classification Search
CPC ................... H01L 29/1608; H01L 21/28008
See application file for complete search history.

(56) References Cited

U.S. PATENT DOCUMENTS

| 7,265,388 B2 | 9/2007 | Fukuda et al. |
| 2003/0104706 A1* | 6/2003 | Mitsuhashi ....... H01L 21/28185 438/756 |

(Continued)

FOREIGN PATENT DOCUMENTS

| JP | S62-291121 | 12/1987 |
| JP | H04-188877 | 7/1992 |

(Continued)

*Primary Examiner* — Moazzam Hossain
(74) *Attorney, Agent, or Firm* — Rabin & Berdo, P.C.

(57) ABSTRACT

A method for producing a semiconductor power device includes forming a gate trench from a surface of the semiconductor layer toward an inside thereof. A first insulation film is formed on the inner surface of the gate trench. The method also includes removing a part on a bottom surface of the gate trench in the first insulation film. A second insulation film having a dielectric constant higher than SiO2 is formed in such a way as to cover the bottom surface of the gate trench exposed by removing the first insulation film.

12 Claims, 40 Drawing Sheets

(51) Int. Cl.

| | | |
|---|---|---|
| H01L 23/00 | (2006.01) | |
| H01L 21/48 | (2006.01) | |
| H01L 21/56 | (2006.01) | |
| H01L 21/04 | (2006.01) | |
| H01L 29/861 | (2006.01) | |
| H01L 29/872 | (2006.01) | |
| H01L 21/28 | (2006.01) | |
| H01L 27/04 | (2006.01) | |
| H01L 29/66 | (2006.01) | |
| H01L 29/06 | (2006.01) | |
| H01L 29/16 | (2006.01) | |
| H01L 21/02 | (2006.01) | |
| H01L 29/20 | (2006.01) | |
| H01L 29/423 | (2006.01) | |
| H01L 29/51 | (2006.01) | |

(52) U.S. Cl.
CPC .... H01L 29/6606 (2013.01); H01L 29/66045 (2013.01); H01L 29/66068 (2013.01); H01L 29/66446 (2013.01); H01L 29/8611 (2013.01); H01L 29/872 (2013.01); H01L 2224/0603 (2013.01)

(56) References Cited

U.S. PATENT DOCUMENTS

| | | |
|---|---|---|
| 2005/0077591 A1 | 4/2005 | Fukuda et al. |
| 2005/0218472 A1 | 10/2005 | Okada et al. |
| 2006/0060916 A1 | 3/2006 | Girdhar et al. |
| 2006/0065899 A1 | 3/2006 | Hatakeyama et al. |
| 2006/0209887 A1* | 9/2006 | Bhalla .................. H01L 29/407 370/466 |
| 2006/0231841 A1 | 10/2006 | Okuno et al. |
| 2007/0090481 A1* | 4/2007 | Richieri .................. H01L 29/47 257/473 |
| 2008/0211034 A1 | 9/2008 | Tsuchiya et al. |
| 2008/0216957 A1 | 9/2008 | Ogasawara et al. |
| 2009/0050899 A1 | 2/2009 | Ikeda et al. |
| 2009/0218619 A1 | 9/2009 | Hebert et al. |
| 2009/0256197 A1* | 10/2009 | Nakazawa .......... H01L 29/0878 257/334 |
| 2010/0013009 A1* | 1/2010 | Pan ..................... H01L 29/7397 257/330 |
| 2010/0059797 A1* | 3/2010 | Ngai ................... H01L 21/6835 257/255 |
| 2010/0193883 A1 | 8/2010 | Hase |
| 2011/0018005 A1* | 1/2011 | Nakano ................. H01L 21/046 257/77 |
| 2011/0140194 A1 | 6/2011 | Bhalla et al. |
| 2011/0291186 A1 | 12/2011 | Yilmaz et al. |
| 2011/0310585 A1* | 12/2011 | Suwa ................... H05K 7/1432 361/820 |
| 2012/0037922 A1 | 2/2012 | Kono et al. |

FOREIGN PATENT DOCUMENTS

| | | |
|---|---|---|
| JP | H11-297995 | 10/1999 |
| JP | 2000-106428 A | 4/2000 |
| JP | 2005-079339 A | 3/2005 |
| JP | 2005-285913 A | 10/2005 |
| JP | 2008-226879 A | 9/2008 |
| JP | 2009-016530 A | 1/2009 |
| JP | 2009-054640 A | 3/2009 |
| JP | 2009-059912 A | 3/2009 |
| JP | 2009-224365 A | 10/2009 |

* cited by examiner

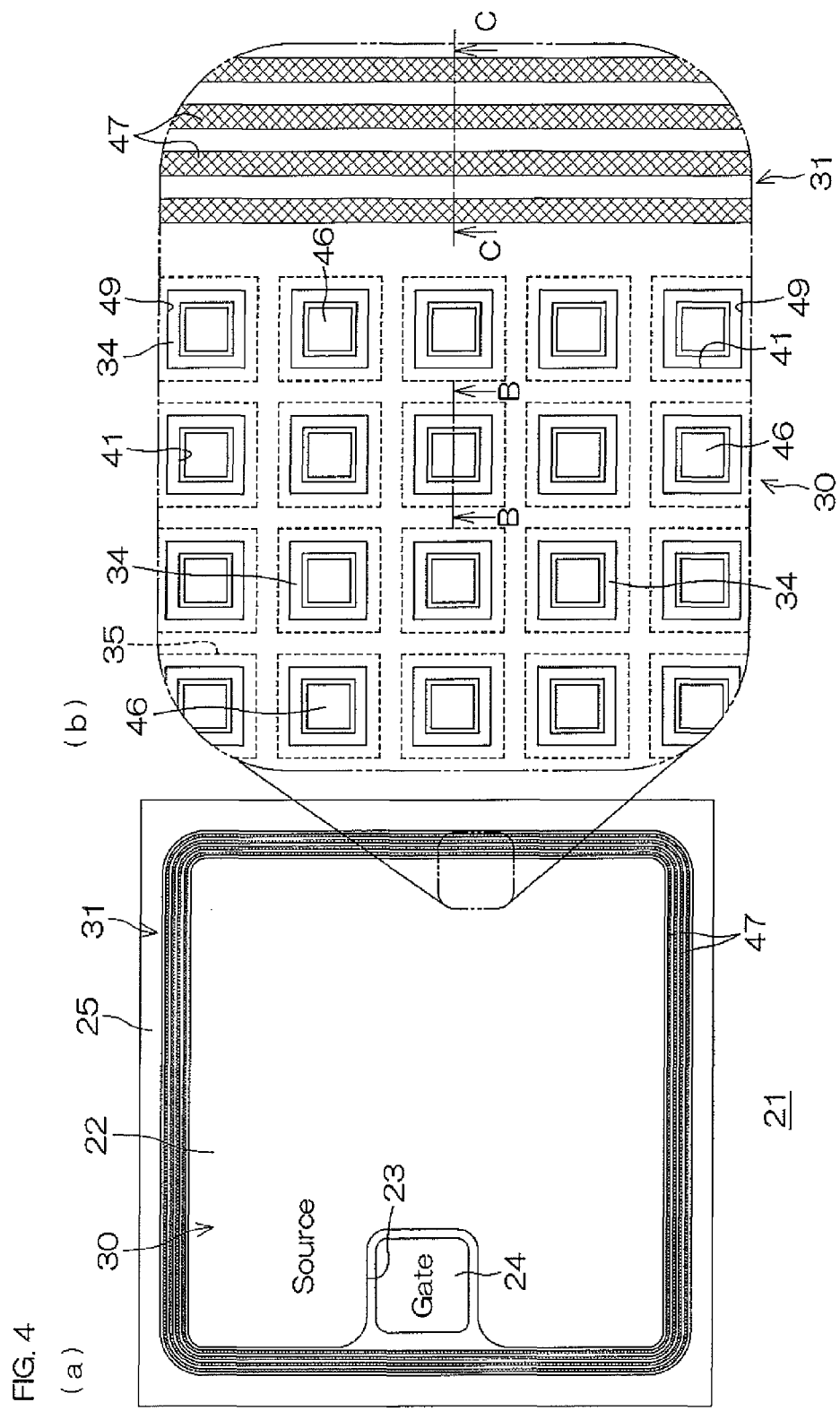

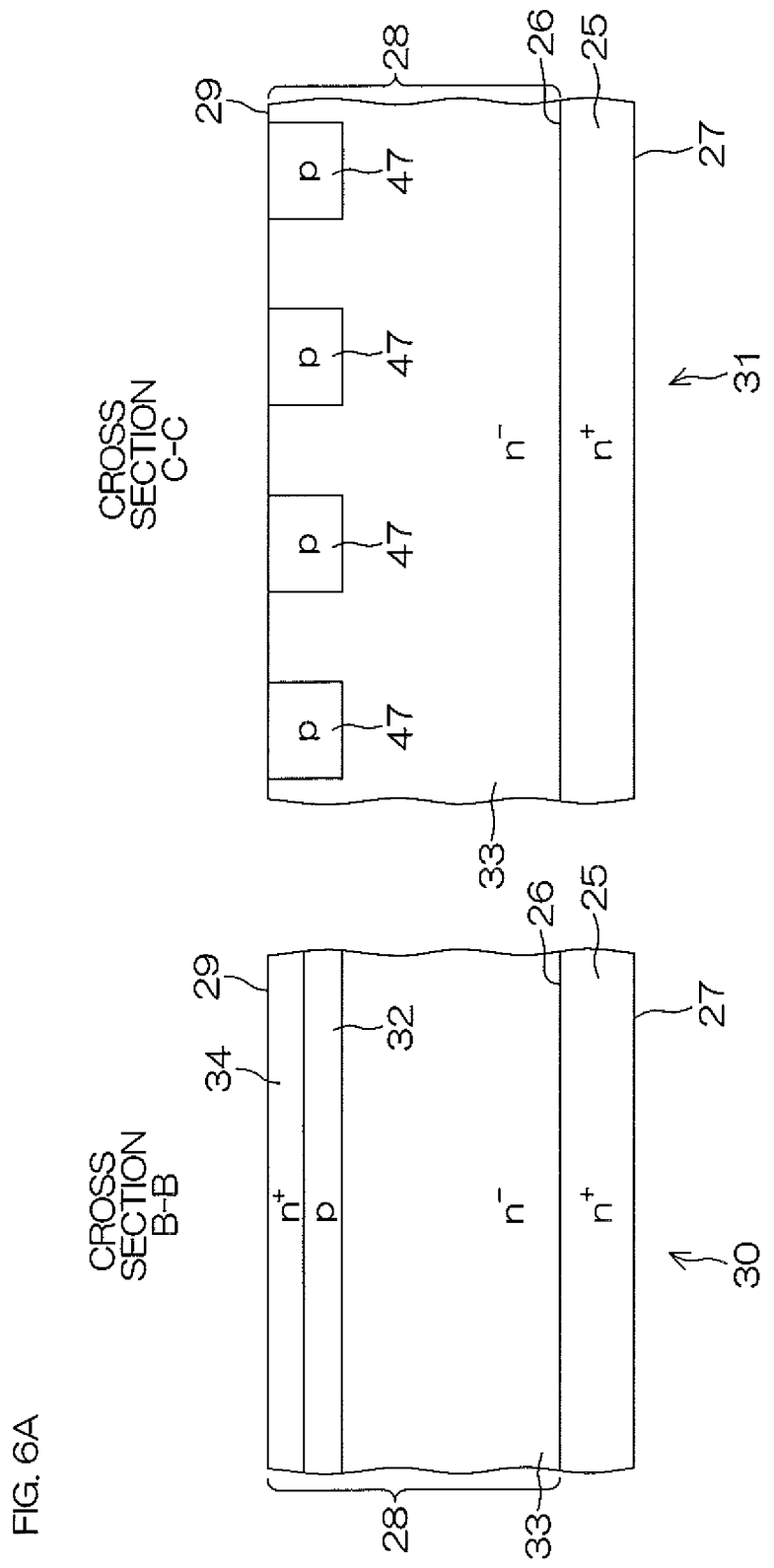

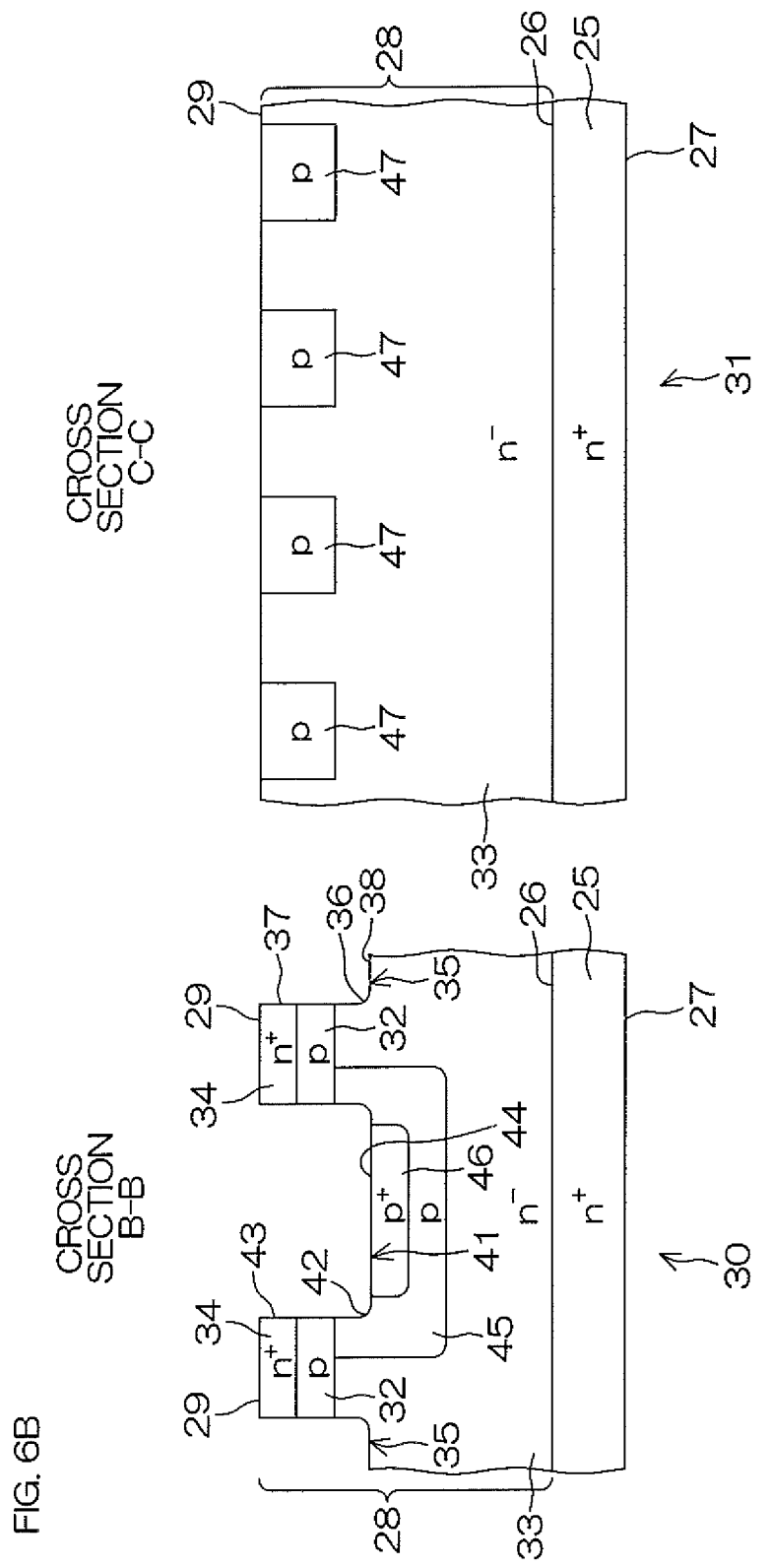

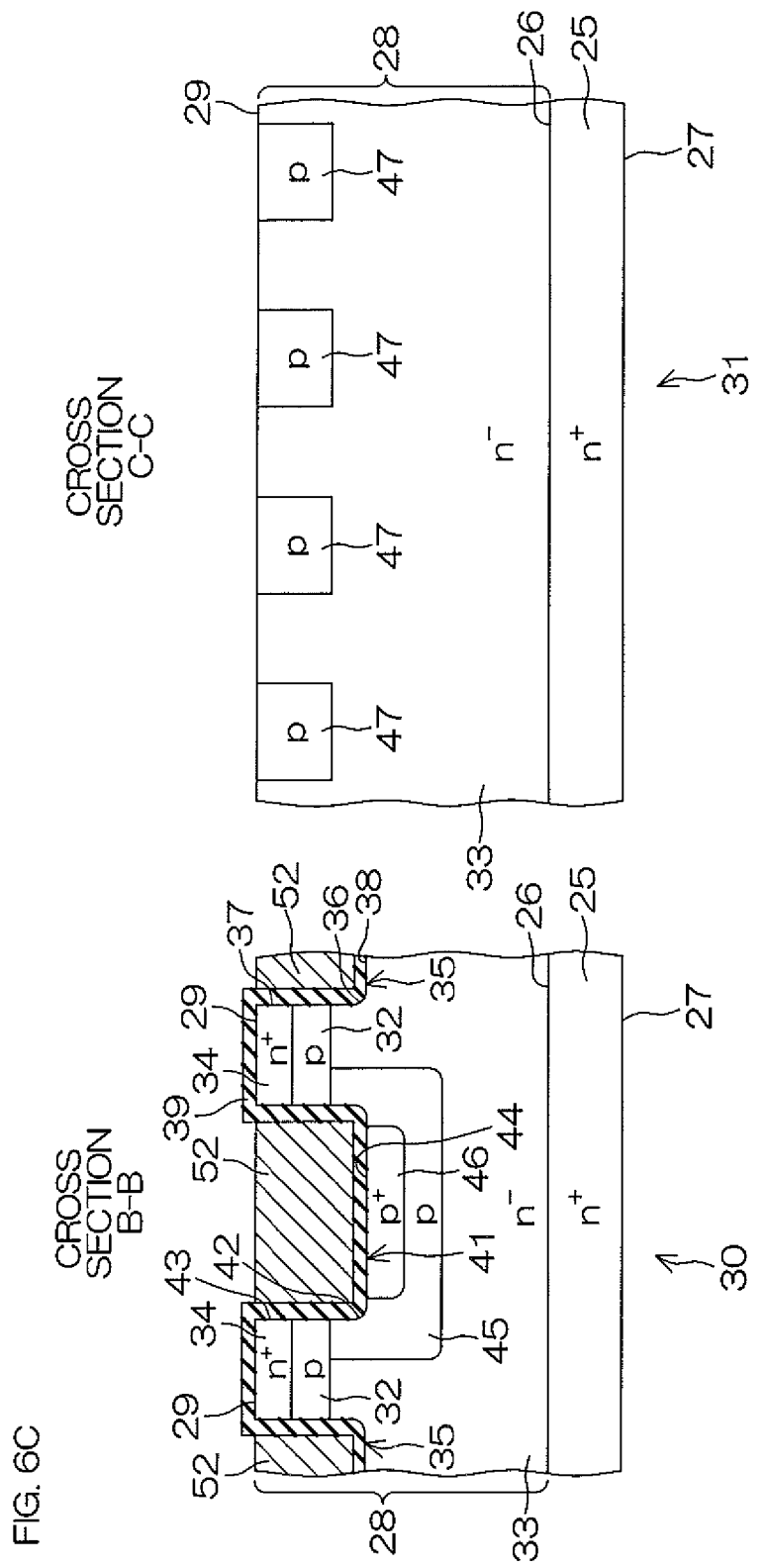

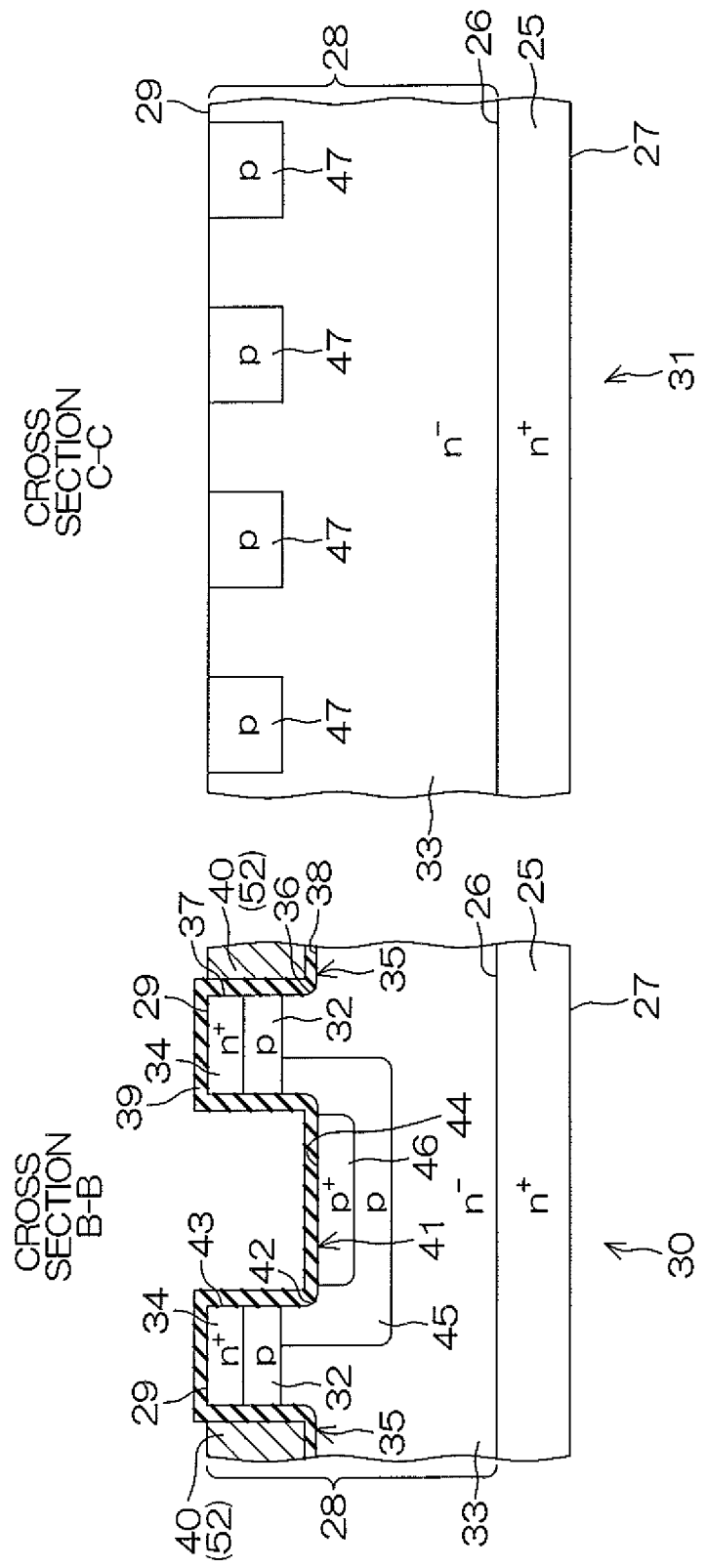

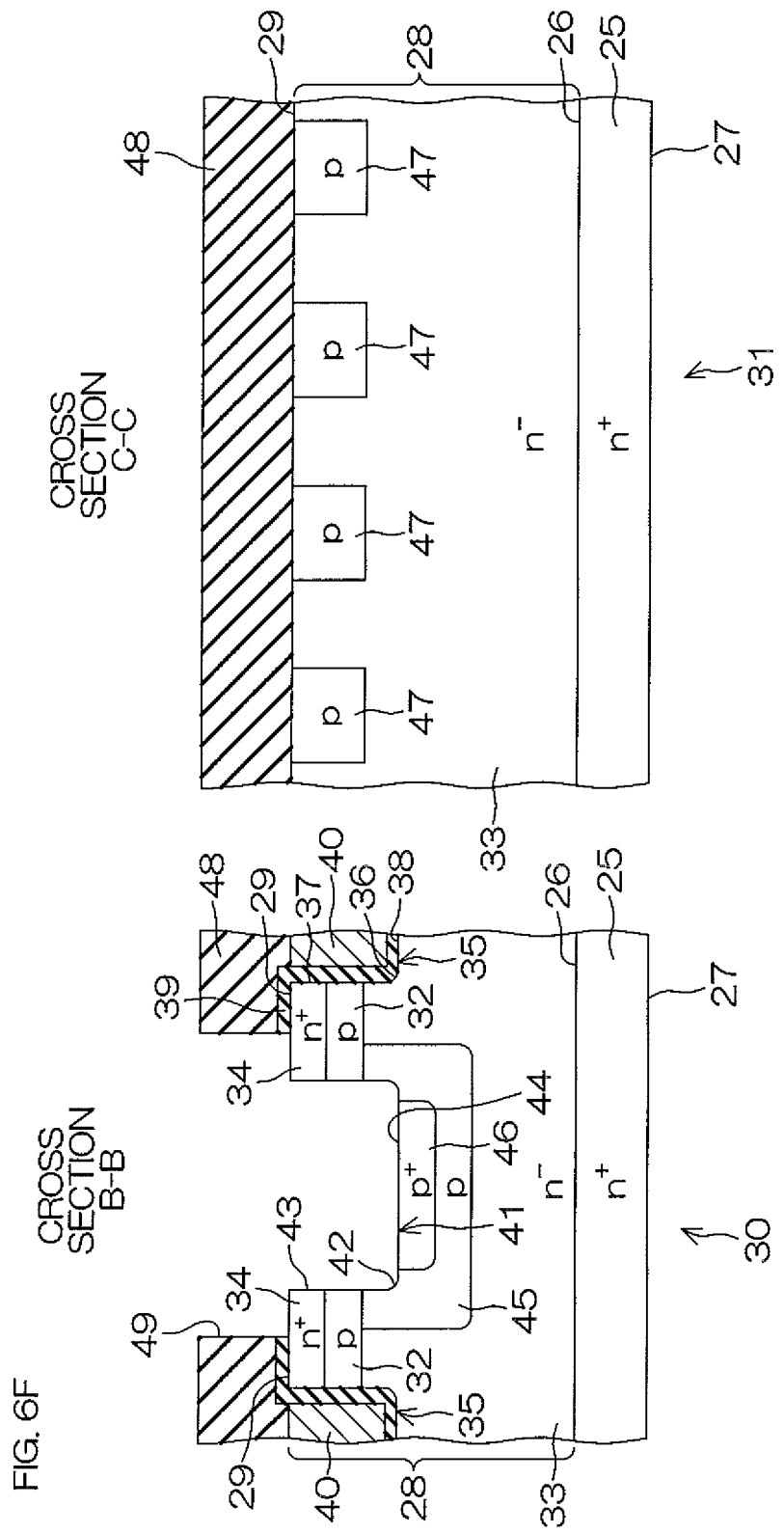

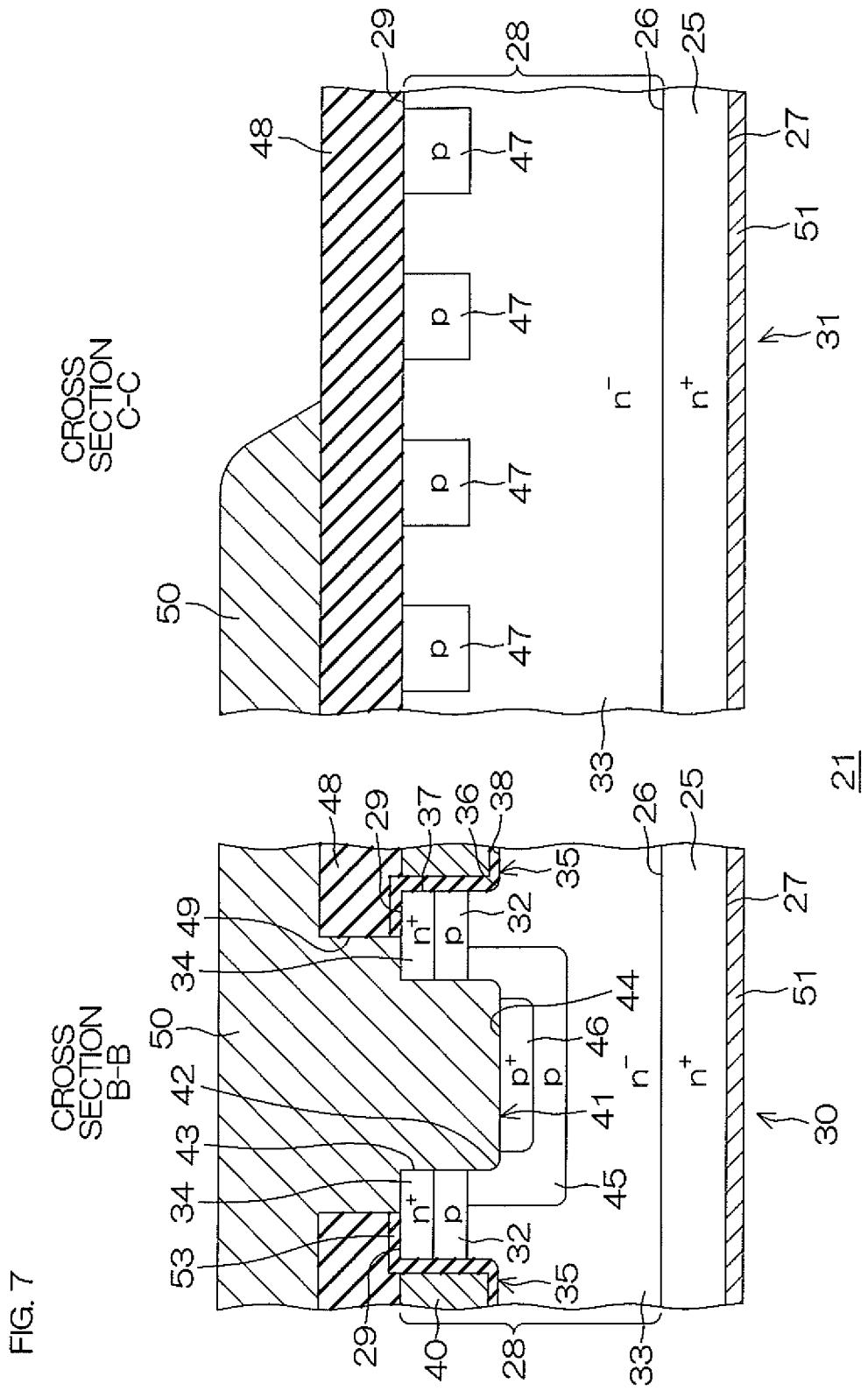

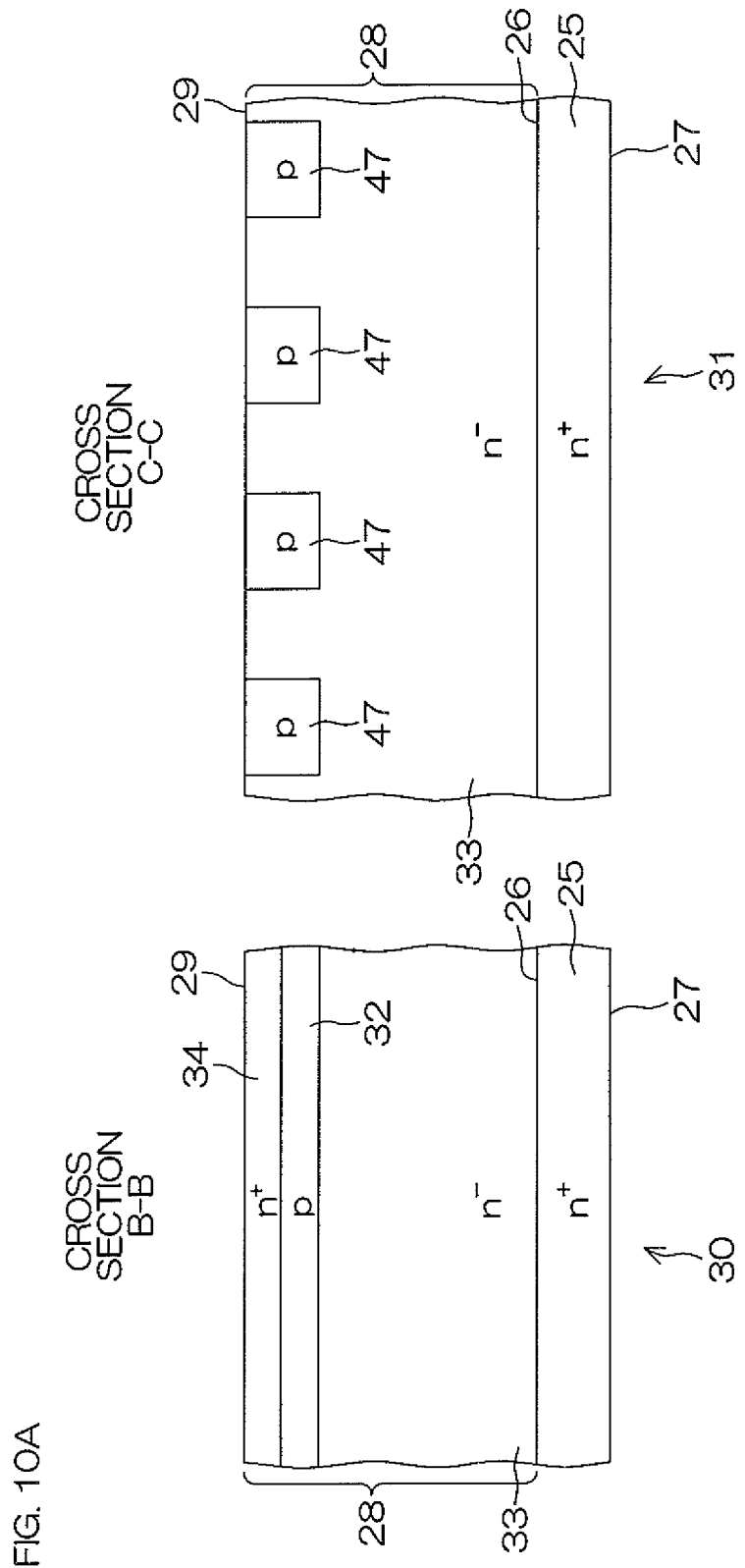

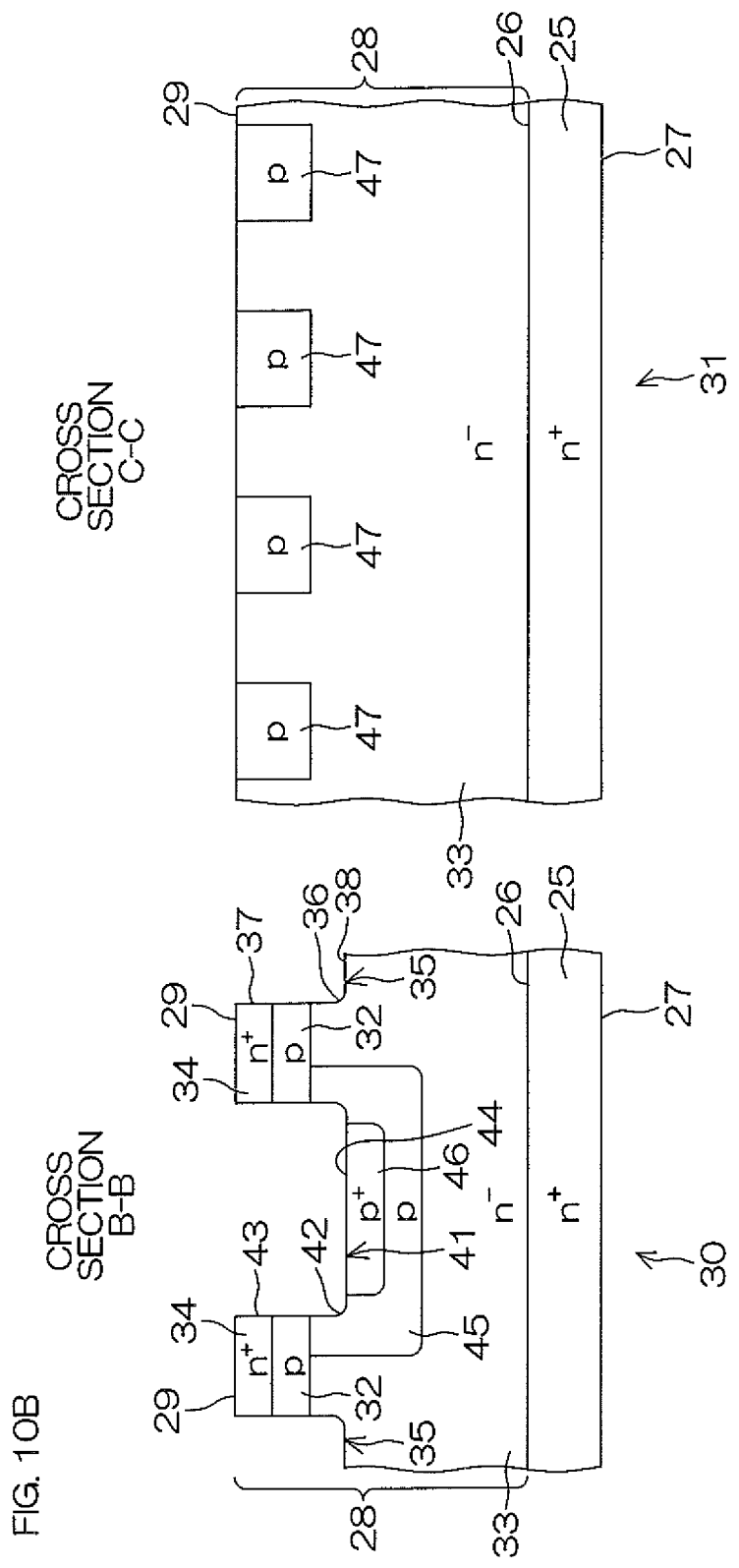

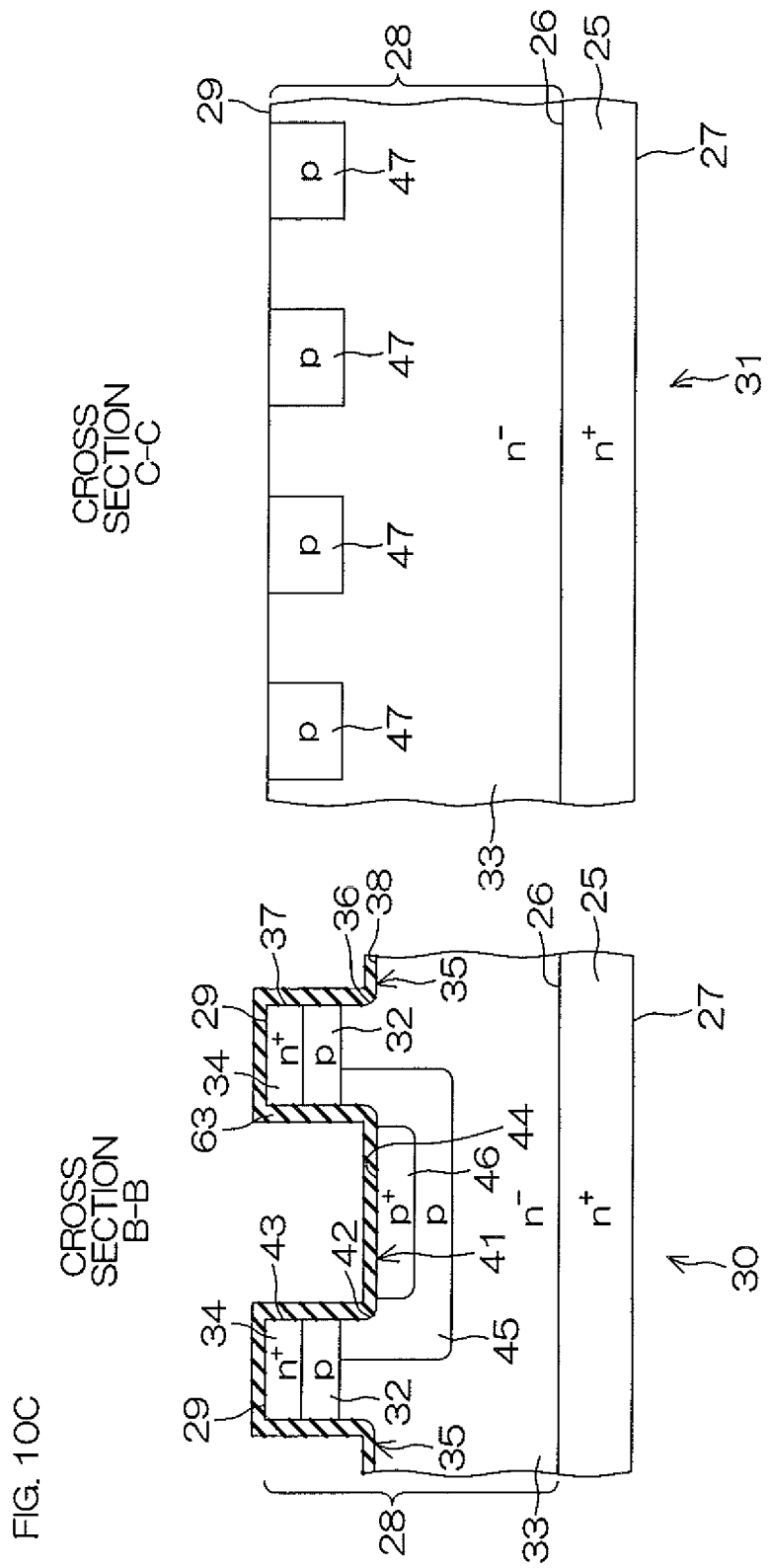

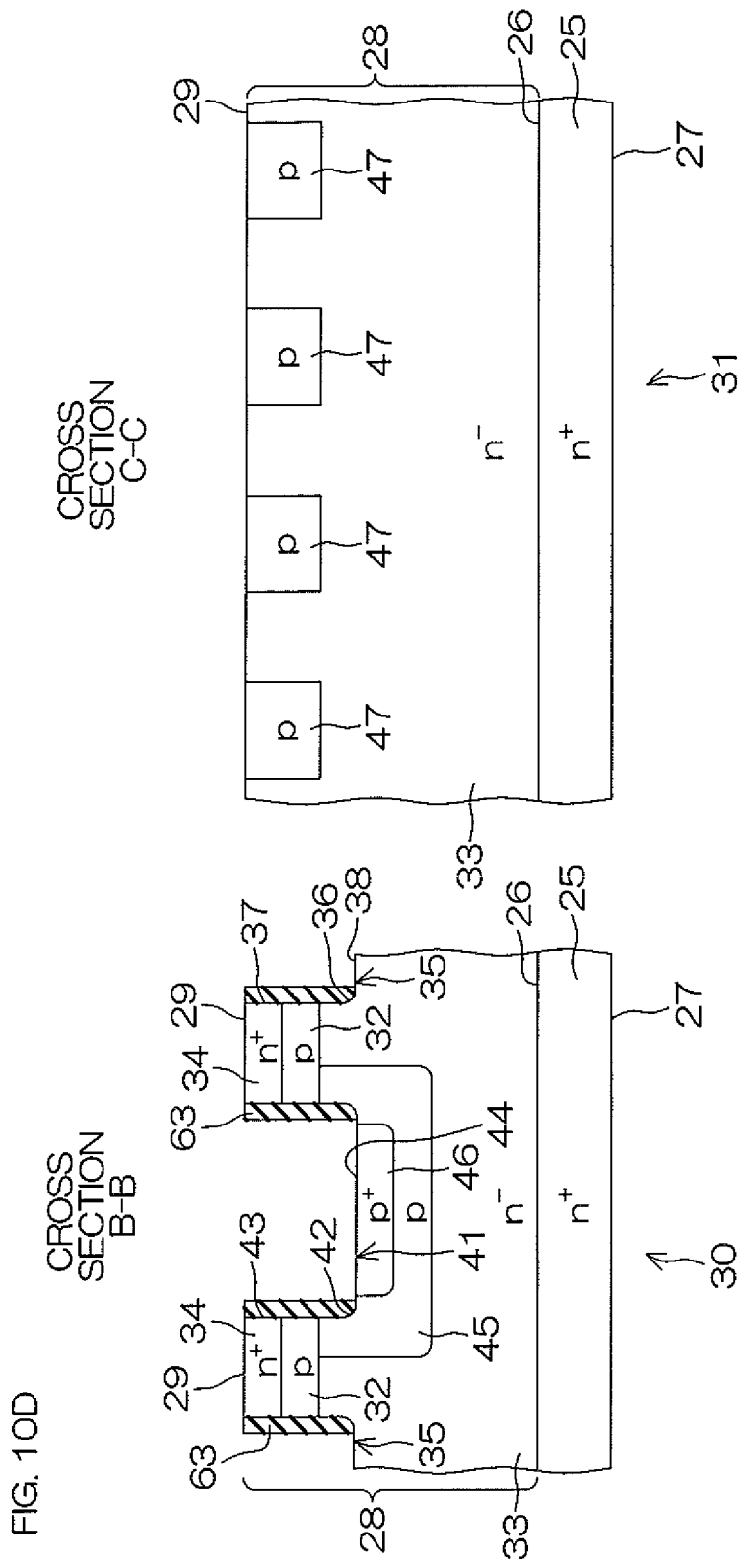

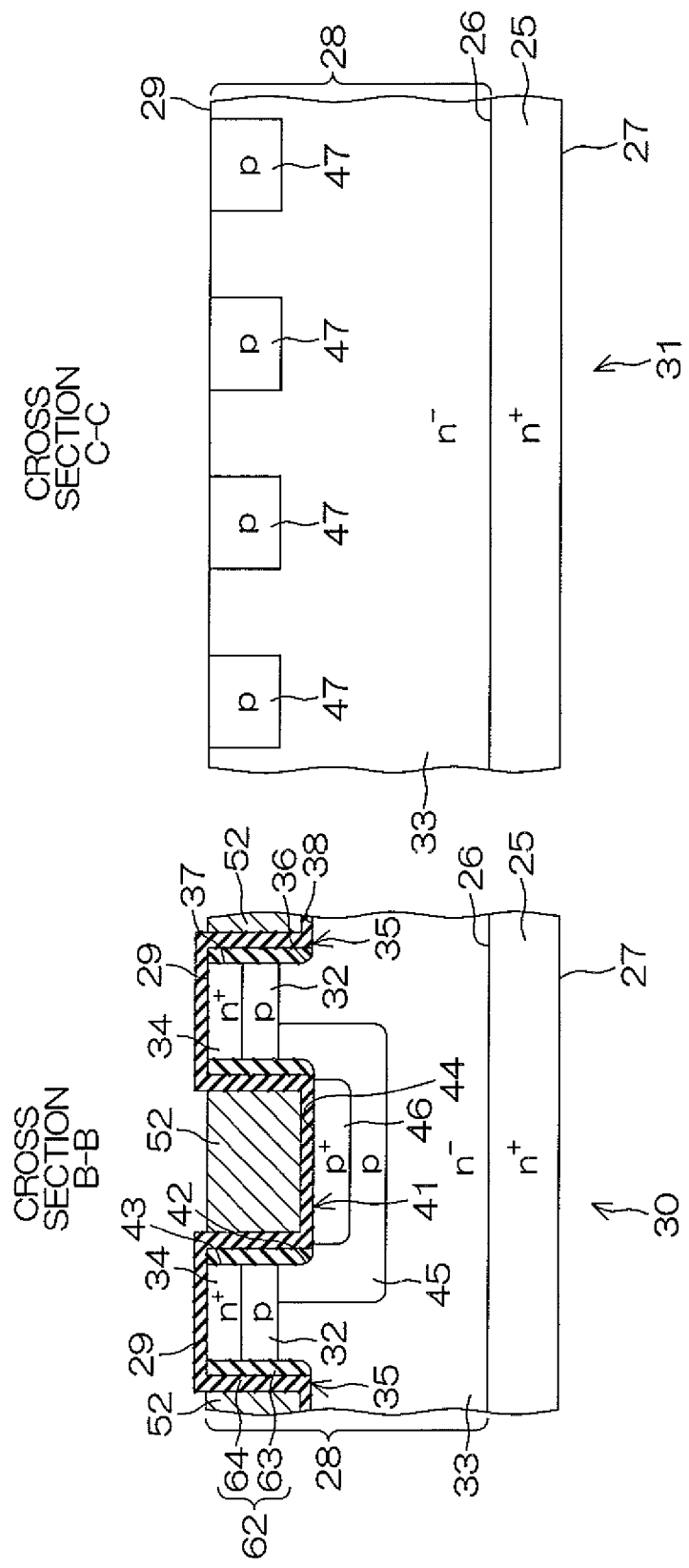

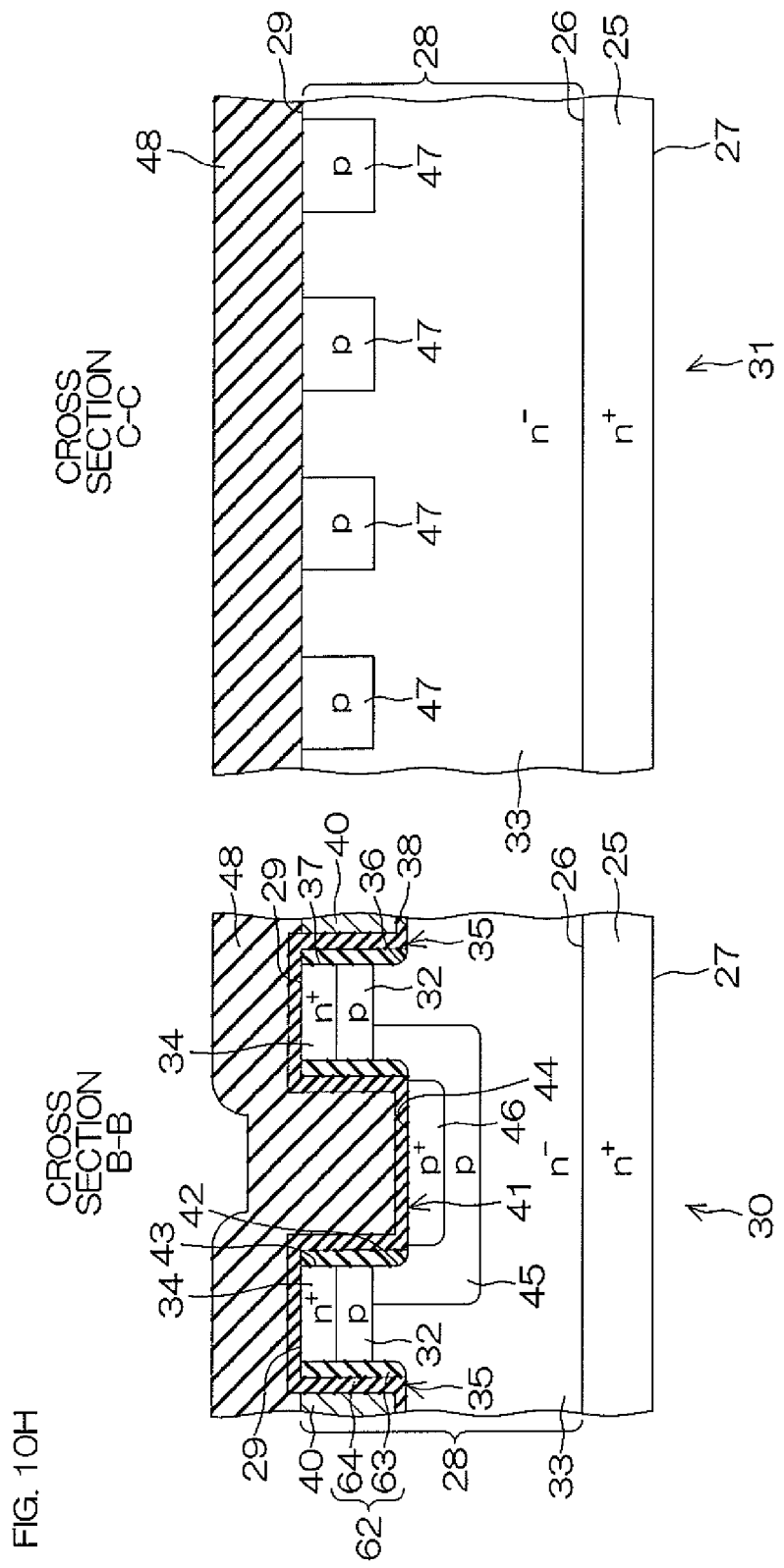

FIG. 12
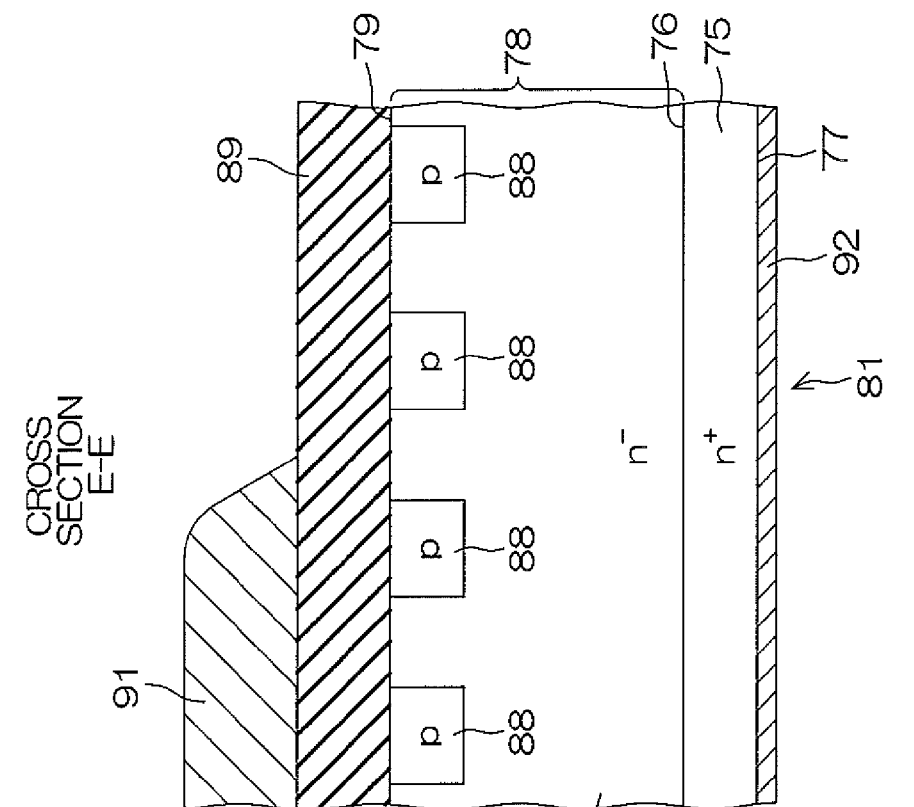
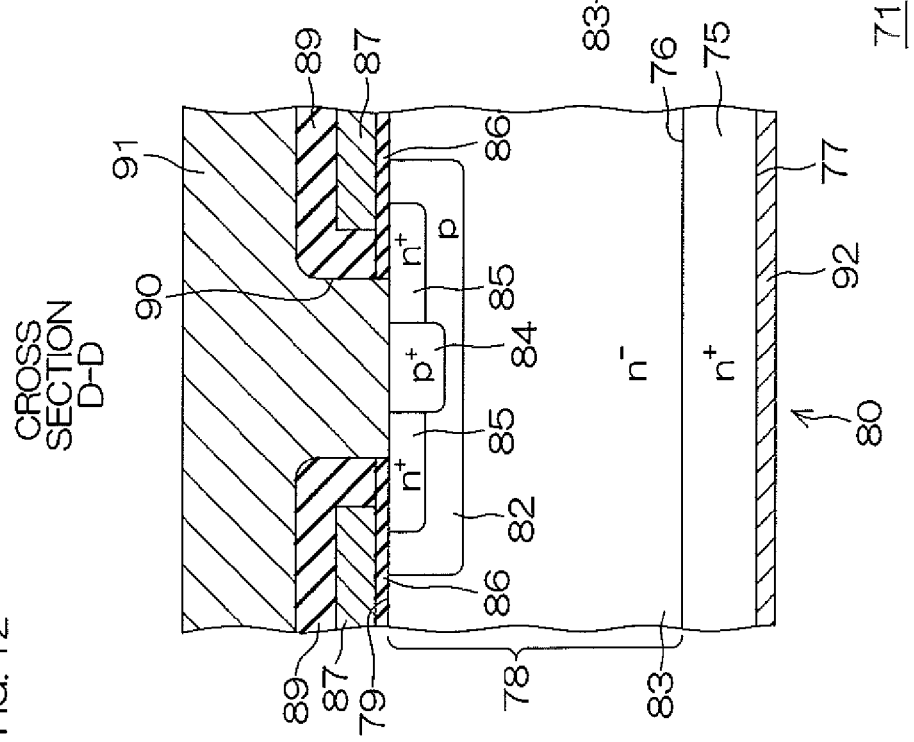

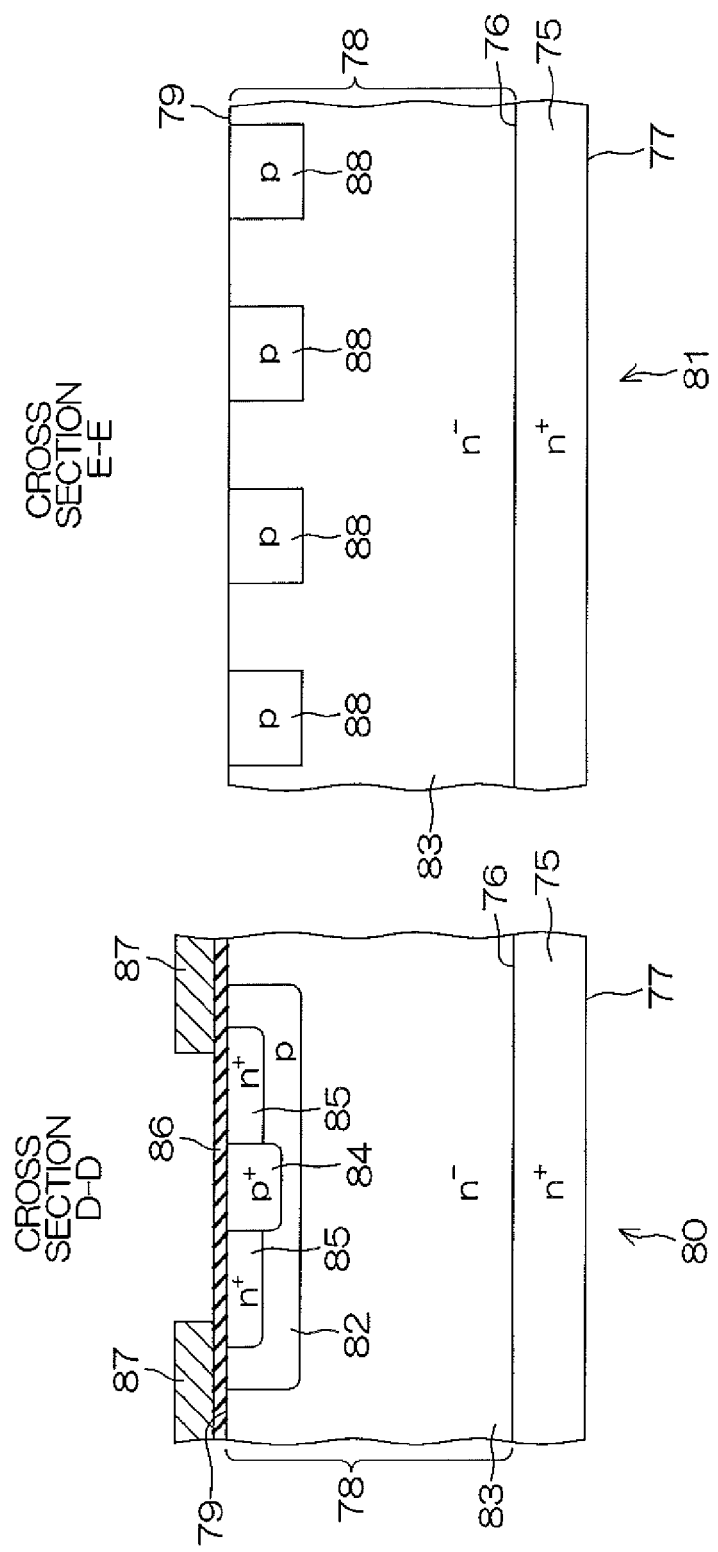

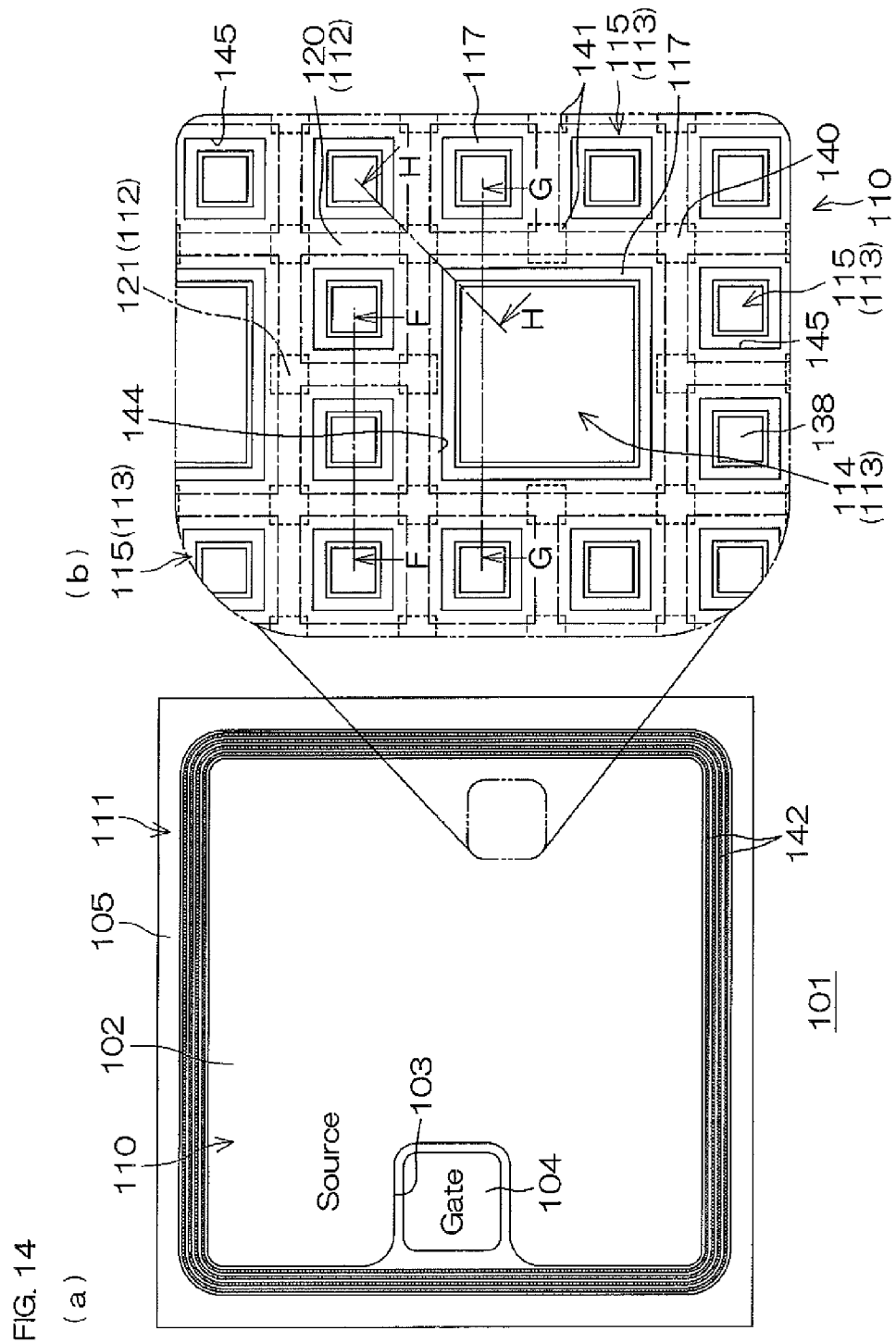

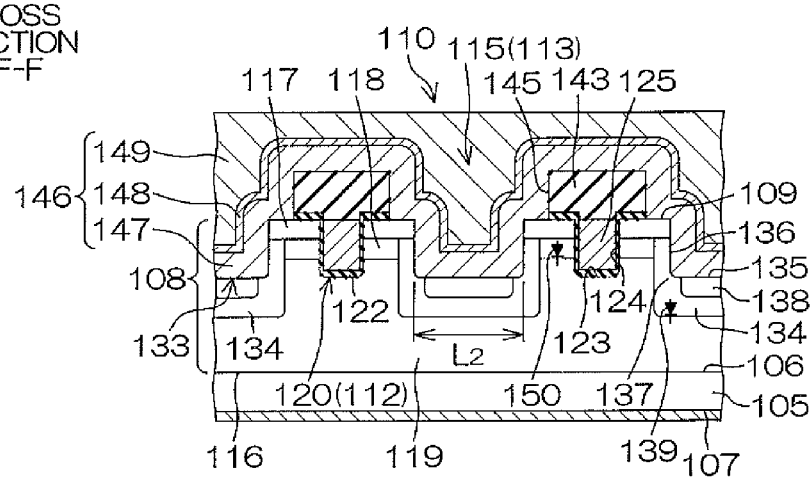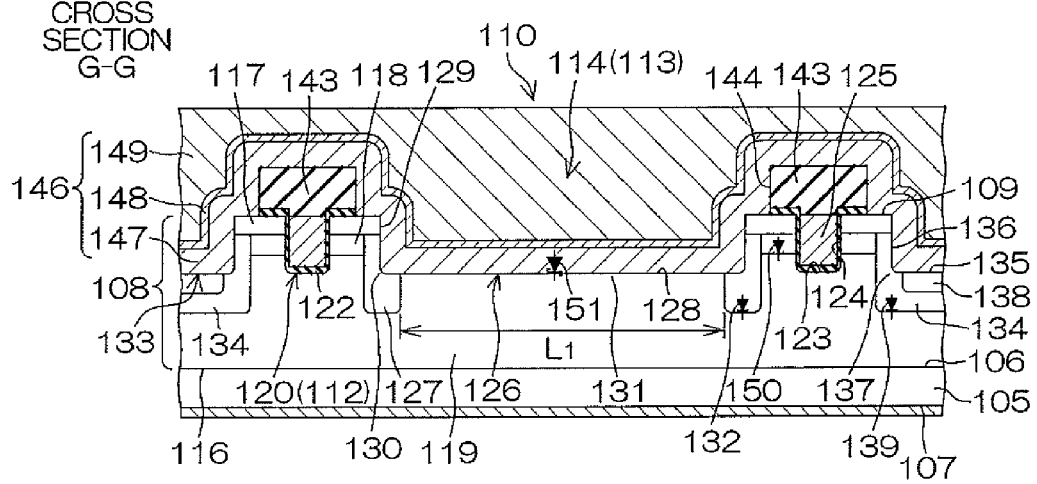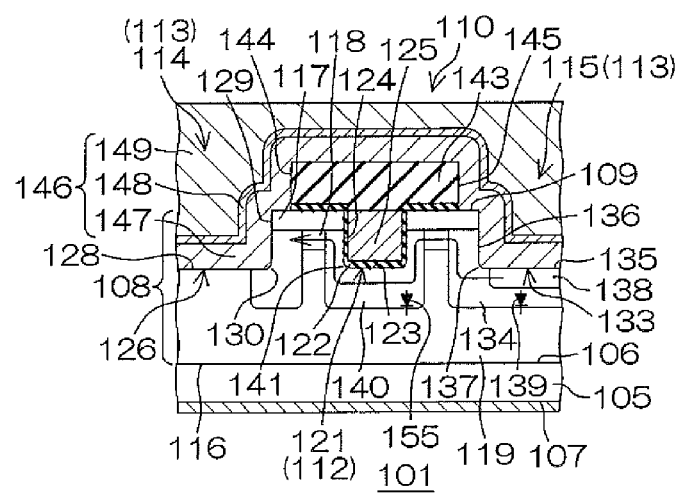

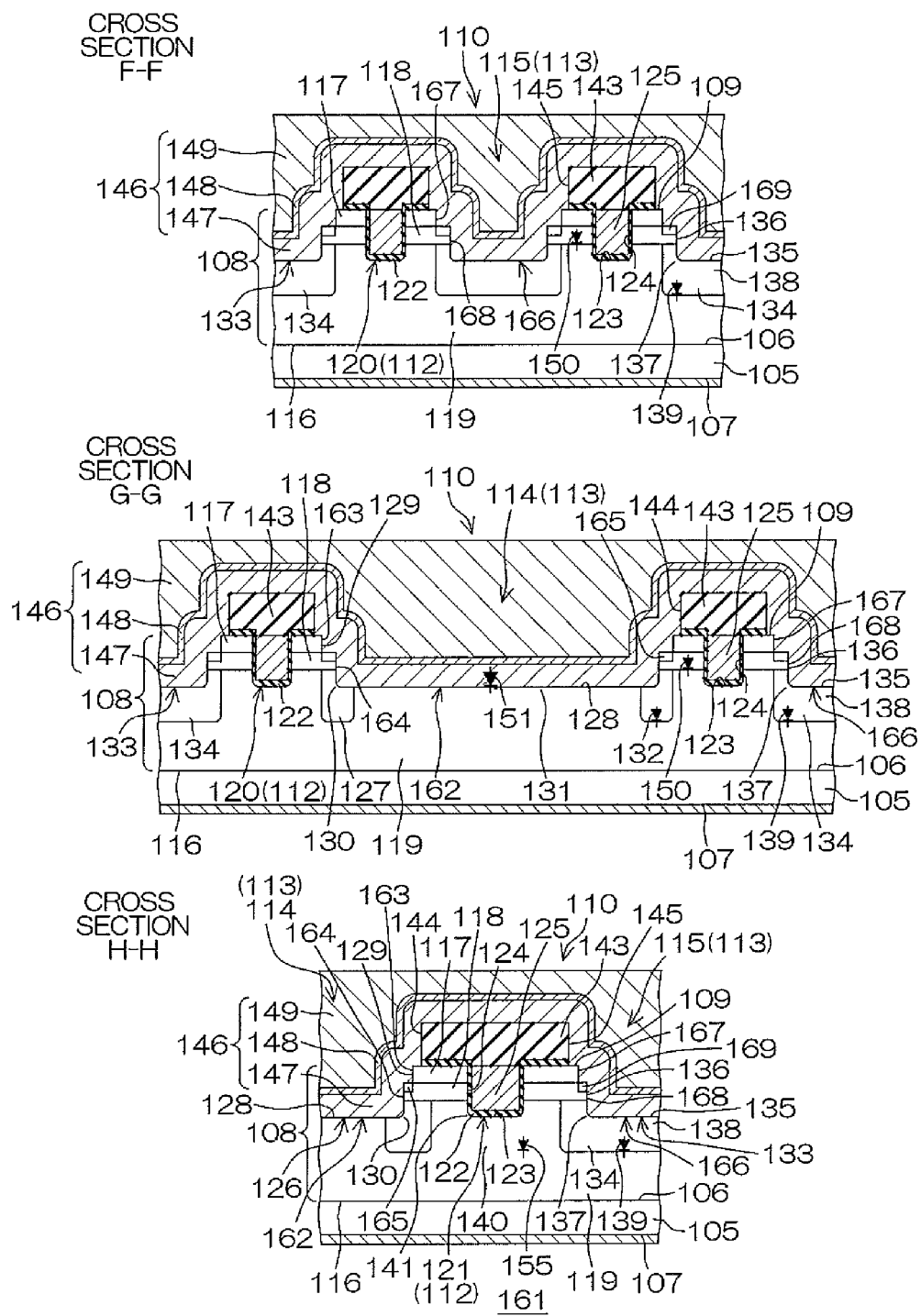

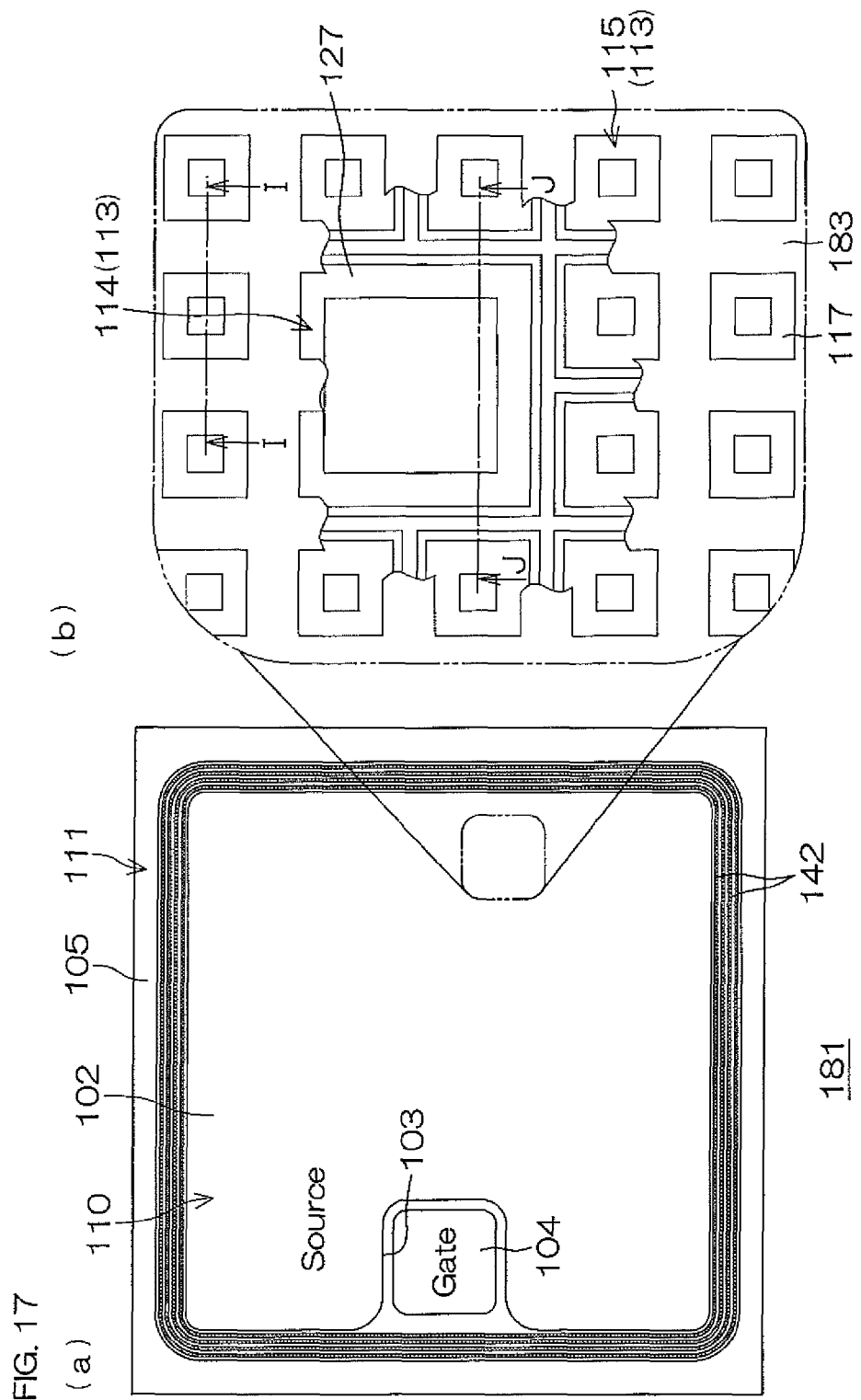

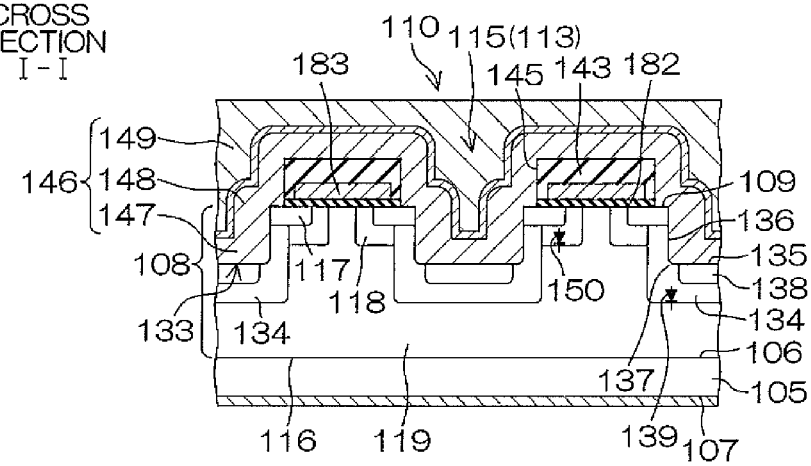
FIG. 18
CROSS SECTION I-I
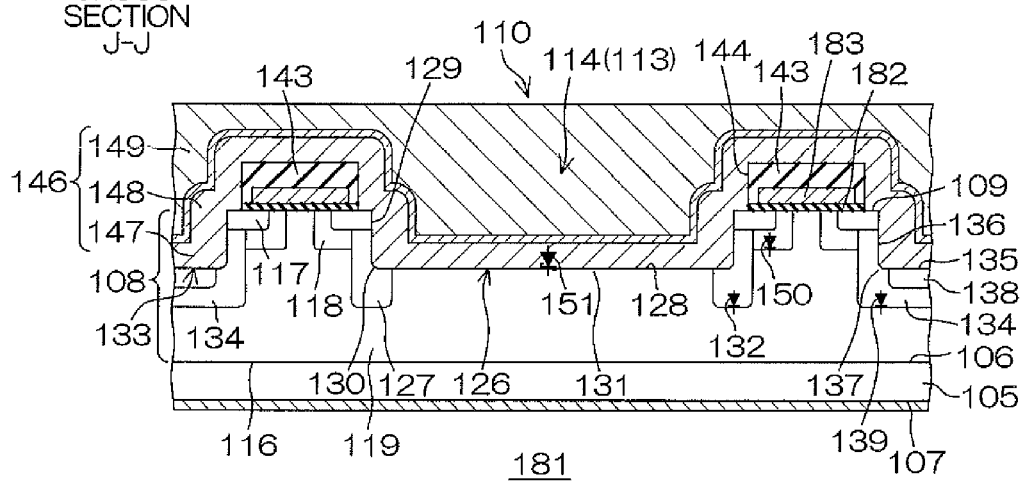
CROSS SECTION J-J

FIG. 20
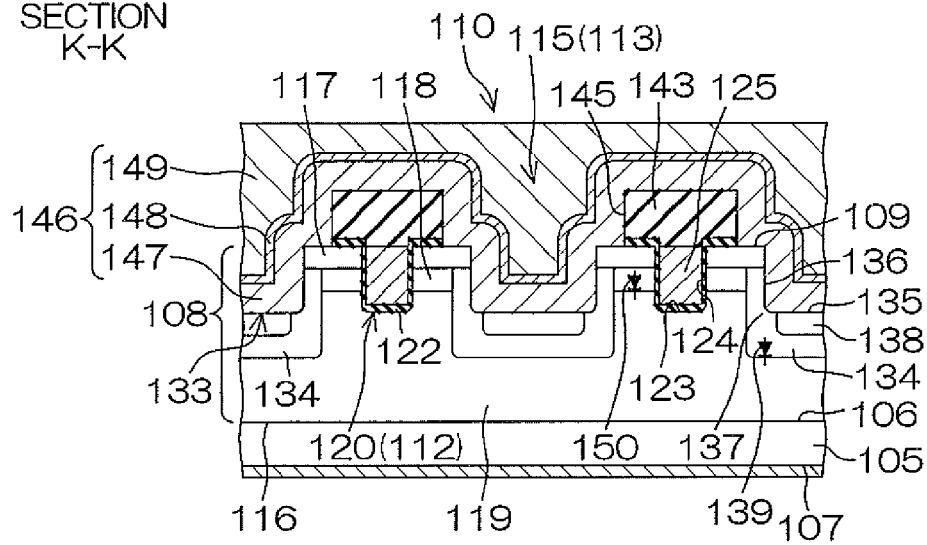
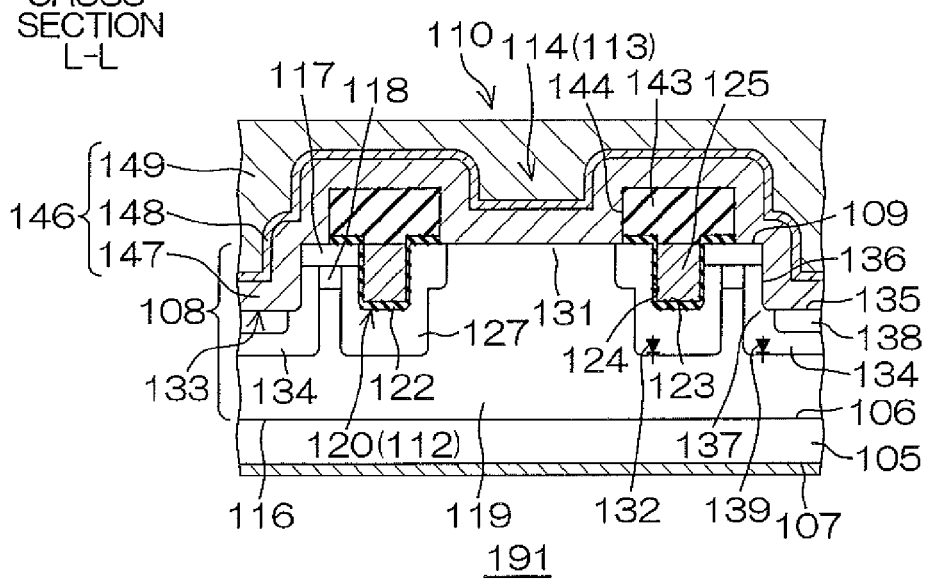

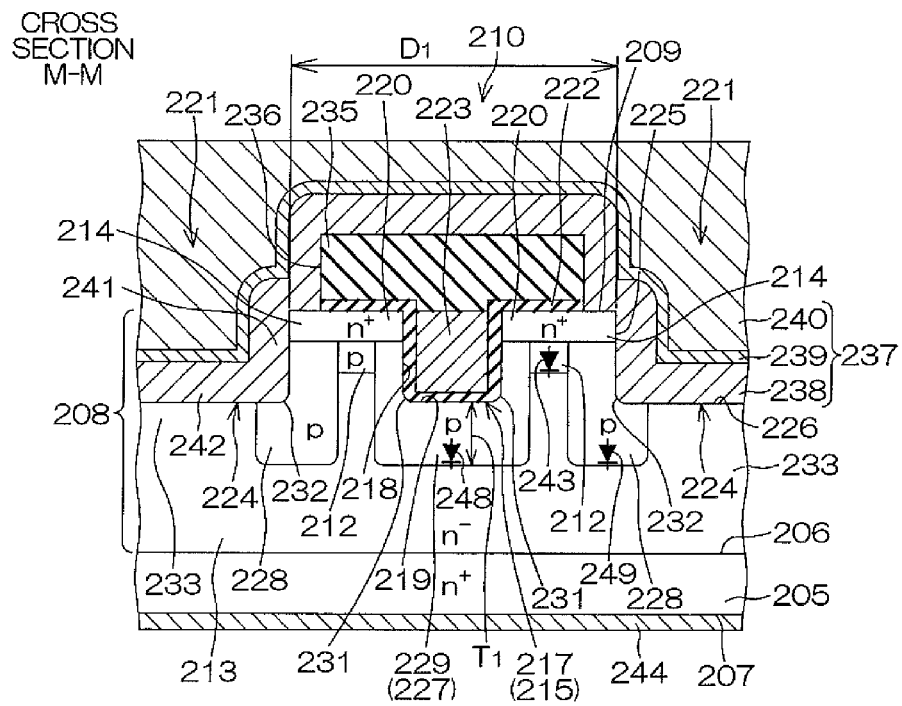
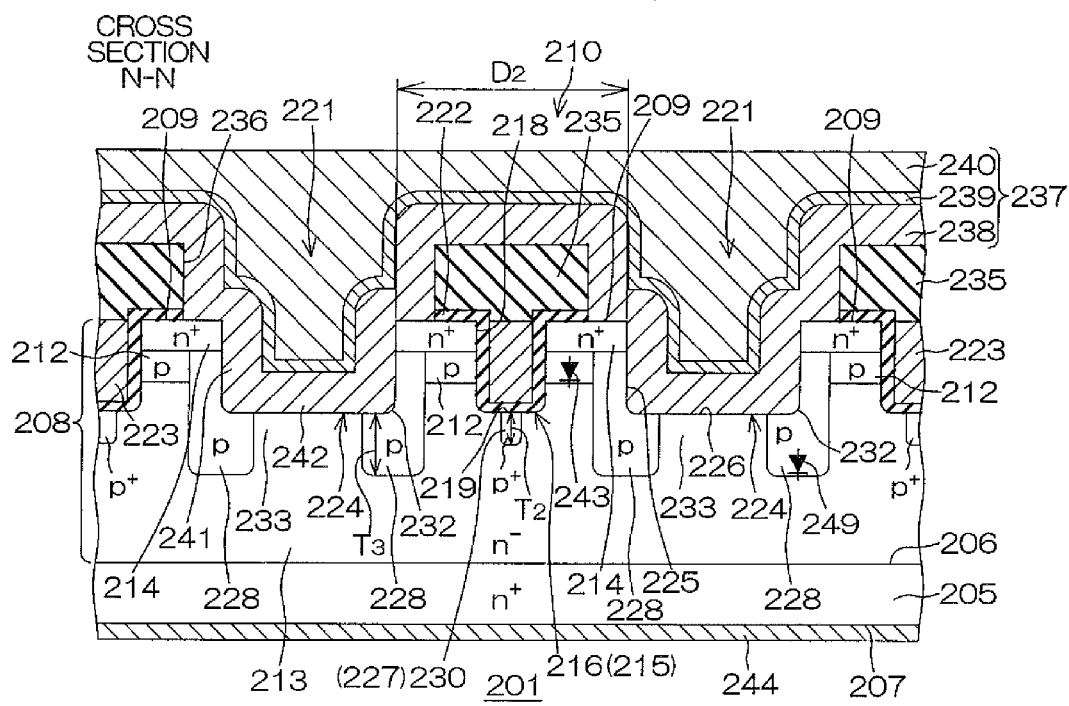
FIG. 23

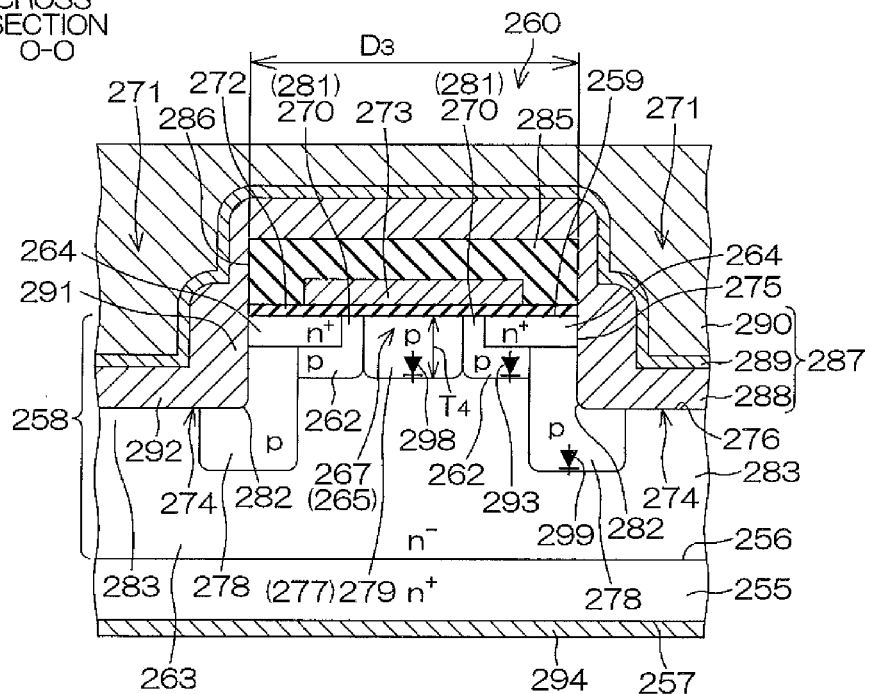
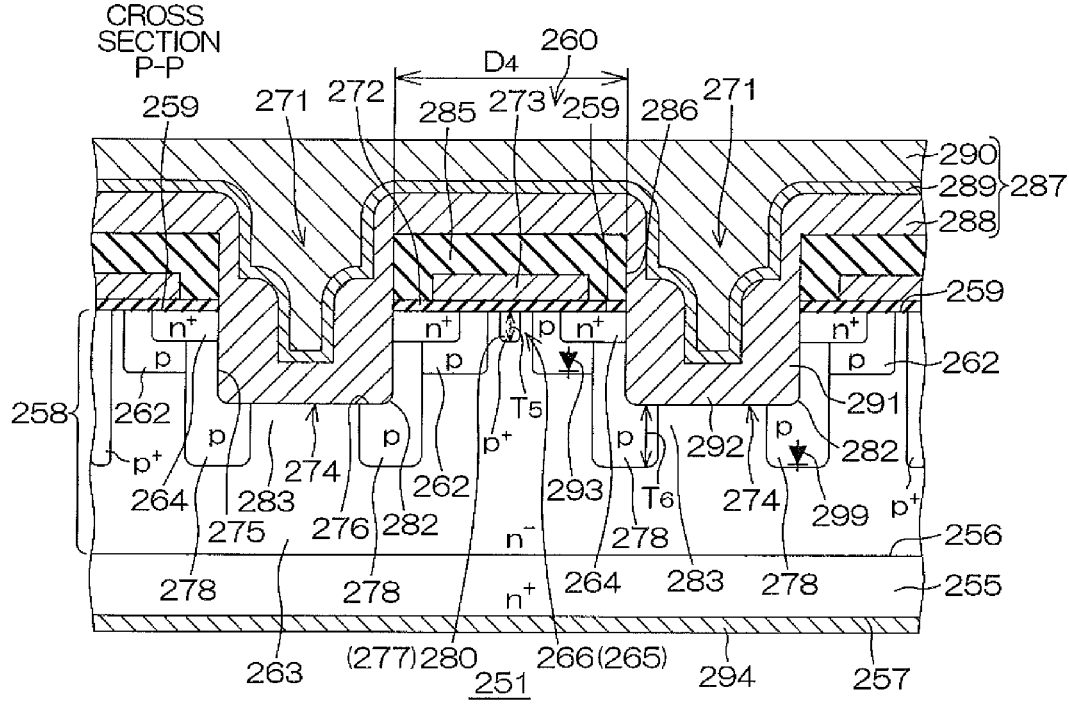

SEMICONDUCTOR POWER DEVICE AND METHOD FOR PRODUCING SAME

CROSS-REFERENCE TO RELATED APPLICATIONS

This is a divisional of U.S. application Ser. No. 13/983,206, which was filed on Aug. 1, 2013, and allowed on Jun. 7, 2016, which was a National Stage application of PCT/JP2012/052290, filed on Feb. 1, 2012. The prior US application and the present divisional application claim the benefit of priority of Japanese application 2011-020729, filed on Feb. 2, 2011. The disclosures of these prior US and foreign applications are incorporated herein by reference.

TECHNICAL FIELD

The present invention relates to a semiconductor power device and a method for producing the semiconductor power device.

BACKGROUND ART

Attention has heretofore been paid to a semiconductor power device for use chiefly in a system, such as a motor control system or a power conversion system, in various power electronics fields.

For example, FIG. 1 of Patent Literature 1 (PTL 1) discloses a Schottky barrier diode in which SiC is employed. This Schottky barrier diode is composed of an n type 4H—SiC bulk substrate, an n type epitaxial layer grown on the bulk substrate, an oxide film that is formed on a surface of the epitaxial layer and by which the surface of the epitaxial layer is partially exposed, and a Schottky electrode that is formed in an opening of the oxide film and that makes a Schottky junction with the epitaxial layer.

Additionally, FIG. 4 of Patent Literature 1 discloses a vertical MIS field-effect transistor in which SiC is employed. This vertical MIS field-effect transistor is composed of an n type 4H—SiC bulk substrate, an n type epitaxial layer grown on the bulk substrate, an n type impurity region (source region) formed on a surface part of the epitaxial layer, a p type well region formed contiguously to both sides of the n type impurity region, a gate oxide film formed on a surface of the epitaxial layer, and a gate electrode that faces the p type well region with the gate oxide film therebetween.

CITATION LIST

Patent Literature

PTL 1: Japanese Unexamined Patent Publication No. 2005-79339

SUMMARY OF INVENTION

Technical Problem

In the Schottky barrier diode and the transistor of Patent Literature 1, a greater electric field will be applied to a material contiguous to the SiC epitaxial layer than an electric field to be applied to the epitaxial layer if an avalanche breakdown occurs during the application of reverse bias.

For example, in accordance with Gauss law, an electric field $E_{SiO2}$ to be applied to the oxide film of the Schottky barrier diode is expressed as $E_{SiO2}=(\epsilon_{SiC}/\epsilon_{SiO2}) \cdot E_{SiC}=(10/3.9) E_{SiC}=$ about $2.5 E_{SiC}$ MV/cm. In other words, an electric field is applied to the oxide film, which is about 2.5 times as great as an electric field $E_{SiC}$ to be applied to SiC. In the formula, $\epsilon_{SiC}$ designates the relative dielectric constant of SiC with respect to a vacuum, and $\epsilon_{SiO2}$ designates the relative dielectric constant of $SiO_2$ with respect to a vacuum.

Therefore, when an avalanche breakdown occurs (when a high voltage is applied), the oxide film is liable to cause an insulation breakdown, thus bringing about a reduction in avalanche resistance.

It is an object of the present invention to provide a semiconductor power device capable of reducing the breakdown of an insulation film when a high voltage is applied to a breakdown voltage holding layer and to provide a method for producing the semiconductor power device.

Solution to Problem

The semiconductor power device of the present invention to achieve the aforementioned object includes a first electrode and a second electrode, a breakdown voltage holding layer that is made of a semiconductor having a predetermined thickness and a predetermined impurity concentration, to which the first electrode and the second electrode are joined, and that has an active region in which carriers to generate electric conduction between the first electrode and the second electrode move, and an insulation film that is formed on the breakdown voltage holding layer and that has a high dielectric-constant portion having a higher dielectric constant than $SiO_2$ at a part contiguous to the breakdown voltage holding layer.

According to this arrangement, the part contiguous to the breakdown voltage holding layer in the insulation film is made of the high dielectric-constant portion having a higher dielectric constant than $SiO_2$. Therefore, an electric field $E_{High-k}$ to be applied to the part contiguous to the breakdown voltage holding layer in the insulation film can be weakened in a state in which a high voltage has been applied between the first electrode and the second electrode.

For example, the relative dielectric constant of the high dielectric-constant portion with respect to a vacuum is designated by $\epsilon_{High-k}$, and the relative dielectric constant of the breakdown voltage holding layer with respect to a vacuum is designated by $\epsilon_0$, and the relative dielectric constant of $SiO_2$ with respect to a vacuum is designated by $\epsilon_{SiO2}$, and the electric field to be applied to the breakdown voltage holding layer is designated by $E_0$. In this case, in accordance with Gauss law, an electric field $E_{High-k}$ is expressed as $$E_{High-k}=(\epsilon_0/\epsilon_{High-k}) \cdot E_0 \qquad (1).$$

On the other hand, if the insulation film is made of $SiO_2$, an electric field $E_{SiO2}$ to be applied to the insulation film ($SiO_2$ film) is expressed as $$E_{SiO2}=(\epsilon_0/\epsilon_{SiO2}) \cdot E_0 \qquad (2).$$

From a comparison between Formulas (1) and (2), $\epsilon_{High-k} > \epsilon_{SiO2}$, and hence $E_{High-k} < E_{SiO2}$.

In other words, the electric field to be applied to the insulation film can be weakened by providing the high dielectric-constant portion at the part contiguous to the breakdown voltage holding layer in the insulation film. As a result, the breakdown of the insulation film can be reduced.

The insulation film formed on the breakdown voltage holding layer is merely required to have a part that is made of a high dielectric-constant material contiguous to the breakdown voltage holding layer, and may have a laminated structure including a high dielectric-constant insulation film that is the high dielectric-constant portion contiguous to the breakdown voltage holding layer and a low dielectric-constant insulation film that is stacked on the high dielectric-constant insulation film and that has a lower dielectric constant than the high dielectric-constant insulation film.

The high dielectric-constant portion may be formed to be contiguous to a device outer-peripheral part surrounding the active region.

This makes it possible to reduce the breakdown of the insulation film caused by an electric field even if the electric field concentrates at the device outer-peripheral part regardless of the kind of a device structure formed at the active region (e.g., Schottky barrier diode structure, MISFET structure, JFET structure, or bipolar transistor structure).

Preferably, the high dielectric-constant portion is made of SiN (relative dielectric constant $\in_{SiN}$=about 7.5) or $Al_2O_3$ (relative dielectric constant $\in_{Al2O3}$=about 8.5) or AlON (relative dielectric constant $\in_{AlON}$=about 6).

The breakdown voltage holding layer may be made of a wide bandgap semiconductor (bandgap Eg is, for example, 2 eV or more and, preferably, 2.5 eV to 7 eV), and, more specifically, may be made of SiC (bandgap $Eg_{SiC}$=about 3.2 eV) or GaN (bandgap $Eg_{GaN}$=about 3.4 eV) or diamond (bandgap $Eg_{dia}$=about 5.5 eV).

The breakdown voltage holding layer may be made of a compound semiconductor. The compound semiconductor includes a mixed-crystal semiconductor of a binary compound typified by, for example, a Group III-V compound showing high electron mobility and a Group II-VI compound that has many materials each of which has a wide bandgap, and a ternary or greater compound made thereof, and the compound semiconductor is partially overlapped with the aforementioned wide bandgap semiconductor.

Typical examples of Group III-V compounds are GaAs (bandgap $Eg_{GaAs}$=about 1.4 eV), AlAs (bandgap $Eg_{AlAs}$=about 2.1 eV), GaN (bandgap $Eg_{GaN}$=about 3.4 eV), and AlN (bandgap $Eg_{AlN}$=about 6.2 eV).

Typical examples of Group II-VI compounds are ZnSe (bandgap $Eg_{ZnSe}$=about 2.8 eV), ZnS (bandgap $Eg_{ZnS}$=about 3.8 eV), CdTe (bandgap $EgC_{dTe}$=about 1.6 eV), ZnTe (bandgap $Eg_{ZnSe}$=about 2.4 eV), and CdS (bandgap $Eg_{Cds}$=about 2.5 eV).

Preferably, the first electrode includes a Schottky electrode that penetrates the field insulation film and that makes a Schottky junction with the breakdown voltage holding layer, and, when the second electrode includes an ohmic electrode making an ohmic contact with the breakdown voltage holding layer, the insulation film includes a field insulation film formed on a surface of the breakdown voltage holding layer, and the field insulation film has the high dielectric-constant portion at a part contiguous to an outer peripheral area of the Schottky junction in the breakdown voltage holding layer.

This arrangement makes it possible to reduce the breakdown of the insulation film in the outer peripheral area (area near the terminal of the Schottky electrode) of the Schottky junction at which an electric field is relatively liable to concentrate.

Preferably, in the active region, the breakdown voltage holding layer has a field-effect transistor structure including a first conductivity type source region, a second conductivity type body region contiguous to the source region, and a first conductivity type drift region contiguous to the body region, and the first electrode includes a source electrode electrically connected to the source region, and, when the second electrode includes a drain electrode electrically connected to the drift region, the high dielectric-constant portion is formed to be contiguous to the drift region.

Preferably, when the field-effect transistor structure includes a vertical transistor structure in which the source region and the drift region are disposed apart from each other with the body region therebetween in a vertical direction perpendicular to the surface of the breakdown voltage holding layer, the vertical transistor structure includes a source trench that reaches the drift region from the surface of the breakdown voltage holding layer through the source region and the body region, and the source electrode is contiguous to the source region, the body region, and the drift region in the source trench.

According to this arrangement, the field-effect transistor structure is a vertical structure, and therefore a high electric current can be allowed to easily flow, and high withstanding voltage and low on-resistance can be easily secured.

Preferably, the field-effect transistor structure has a trench gate structure including a gate trench formed in such a way as to straddle the source region, the body region, and the drift region, and, when a gate electrode facing the body region is formed in the gate trench, the insulation film includes a gate insulation film interposed between the gate electrode and an inner surface of the gate trench, and has the high dielectric-constant portion at a part contiguous to a bottom surface of the gate trench in the gate insulation film and/or a corner portion of the gate trench.

This arrangement makes it possible to reduce the breakdown of the gate insulation film in the bottom portion and the corner portion of the gate trench at which an electric field is relatively liable to concentrate in the MISFET having a trench gate structure.

The thus formed gate insulation film is merely required to have a part that is made of a high dielectric-constant material contiguous to the bottom surface of the gate trench and/or the corner portion of the gate trench, and may have a laminated structure including a high dielectric-constant gate insulation film that is the high dielectric-constant portion at the part contiguous to the bottom surface of the gate trench and/or the corner portion of the gate trench and a low dielectric-constant gate insulation film that is stacked on the high dielectric-constant gate insulation film and that has a dielectric constant lower than the high dielectric-constant gate insulation film.

Preferably, when the breakdown voltage holding layer is made of SiC, the gate insulation film is made of $Al_2O_3$.

This arrangement makes it possible to make the dielectric constant of the gate insulation film higher than $SiO_2$ while maintaining a relatively high barrier height with respect to the breakdown voltage holding layer made of SiC. As a result, a leakage current near the body region caused by a quantum tunnel effect can be reduced.

In the gate insulation film, a part contiguous to the body region in a side surface of the gate trench may be made of an $SiO_2$ film. Preferably, if so, an insulation film that has a dielectric constant higher than $SiO_2$ is stacked on the $SiO_2$ film.

When the breakdown voltage holding layer is made of SiC having an Si (silicon) plane at its surface, the gate trench may be formed toward an inside of the breakdown voltage holding layer from the Si plane of the breakdown voltage holding layer made of SiC.

The high dielectric-constant portion may be formed only at the bottom surface of the gate trench in the gate insulation film and/or the corner portion of the gate trench.

Preferably, when the field-effect transistor structure has a planar gate structure in which a gate electrode faces the body region with a gate insulation film formed on the surface of the breakdown voltage holding layer therebetween, the insulation film includes an interlayer insulation film formed on the breakdown voltage holding layer in such a way that the gate electrode is covered therewith, and the interlayer insulation film has the high dielectric-constant portion at a part contiguous to a transistor periphery surrounding the planar gate structure.

This arrangement makes it possible to reduce the breakdown of the interlayer insulation film contiguous to the transistor periphery at which an electric field is relatively liable to concentrate in the MISFET having a planar gate structure.

A method for producing a semiconductor power device of the present invention is a method for producing the semiconductor power device having a semiconductor layer made of SiC and a trench-gate type transistor structure formed in the semiconductor layer, the trench-gate type transistor structure including a first conductivity type source region, a second conductivity type body region contiguous to the source region, a first conductivity type drift region contiguous to the body region, a gate trench formed in such a way as to straddle the source region, the body region, and the drift region, a gate insulation film formed on an inner surface of the gate trench, and a gate electrode facing the body region with the gate insulation film therebetween, and the method includes a step of forming the gate trench from an Si (silicon) plane of the semiconductor layer toward an inside thereof, a step of forming a first insulation film made of $SiO_2$ on the inner surface of the gate trench, a step of removing a part on a bottom surface of the gate trench in the first insulation film, and a step of forming a second insulation film having a dielectric constant higher than $SiO_2$ in such a way as to cover the bottom surface of the gate trench exposed by removing the first insulation film.

According to this method, the bottom surface of the gate trench is formed as an Si plane, and therefore, when the first insulation film ($SiO_2$ film) is formed, a part on the bottom surface (Si plane) of the gate trench in the $SiO_2$ film becomes thinner than a part on the side surface of the gate trench in the $SiO_2$ film. Therefore, the possibility of generating the breakdown of the insulation film in the bottom portion and the corner portion of the gate trench at which an electric field is relatively liable to concentrate will be enhanced if the bottom surface part of the first insulation film remains.

Therefore, in the present invention, a part on the bottom surface of the gate trench in the first insulation film is removed, and the second insulation film (high dielectric-constant film) is formed such that a part exposed by the removal is covered therewith. As a result, a part at which an electric field is liable to concentrate can be covered with the high dielectric-constant film.

On the other hand, the $SiO_2$ film can remain at the side surface of the gate trench, and therefore a gate insulation film made of $SiO_2$ can be formed between the channel and the gate electrode.

The step of forming the first insulation film may be a step of forming the first insulation film by a thermal oxidation method, and the step of forming the second insulation film may be a step of forming the second insulation film by a CVD method.

BRIEF DESCRIPTION OF DRAWINGS

FIG. 4(a) and FIG. 4(b) are schematic plan views of a trench-gate type MIS transistor according to a second preferred embodiment of the present invention, FIG. 4(a) being an overall view, FIG. 4(b) being an internal enlarged view.

FIG. 6A is schematic sectional views showing a part of steps of producing the trench-gate type MIS transistor of FIG. 5, and each view shows a cutting plane at the same position as in FIG. 5.

FIG. 6B is views showing a step subsequent to that of FIG. 6A.

FIG. 6C is views showing a step subsequent to that of FIG. 6B.

FIG. 6D is views showing a step subsequent to that of FIG. 6C.

FIG. 6F is views showing a step subsequent to that of FIG. 6E.

FIG. 7 is schematic sectional views showing a first modification of the trench-gate type MIS transistor of FIG. 5.

FIG. 12 is sectional views of the planar-gate type MIS transistor of FIG. 11, showing cutting planes along cutting-plane lines D-D and E-E of FIG. 11(b), respectively.

FIG. 13C is views showing a step subsequent to that of FIG. 13B.

FIG. 14(a) and FIG. 14(b) are schematic plan views of a trench-gate type MIS transistor according to a fifth preferred embodiment of the present invention, FIG. 14(a) being an overall view, FIG. 14(b) being an internal enlarged view.

FIG. 15 is sectional views of the trench-gate type MIS transistor of FIGS. 14(a) and 14(b), showing cutting planes along cutting-plane lines F-F, G-G, and H-H of FIG. 14(b), respectively.

FIG. 16 is schematic sectional views of a trench-gate type MIS transistor according to a sixth preferred embodiment of the present invention, and each view shows a cutting plane at the same position as in FIG. 15.

FIG. 17(a) and FIG. 17(b) are schematic plan views of a planar-gate type MIS transistor according to a seventh preferred embodiment of the present invention, FIG. 17(a) being an overall view, FIG. 17(b) being an internal enlarged view.

FIG. 18 is sectional views of the planar-gate type MIS transistor of FIGS. 17(a) and 17(b), showing cutting planes along cutting-plane lines I-I and J-J of FIG. 17(b), respectively.

FIG. 20 is sectional views of the trench-gate type MIS transistor of FIGS. 19(a) and 19(b), showing cutting planes along cutting-plane lines K-K and L-L of FIG. 19(b), respectively.

FIG. 23 is sectional views of the trench-gate type MIS transistor of FIGS. 22(a) and 22(b), showing cutting planes along cutting-plane lines M-M and N-N of FIG. 22(b), respectively.

FIG. 25 is sectional views of the planar-gate type MIS transistor of FIGS. 24(a) and 24(b), showing cutting planes along cutting-plane lines O-O and P-P of FIG. 24(b), respectively.

DESCRIPTION OF EMBODIMENTS

Preferred embodiments of the present invention will be hereinafter described in detail with reference to the accompanying drawings.

Figure 1:
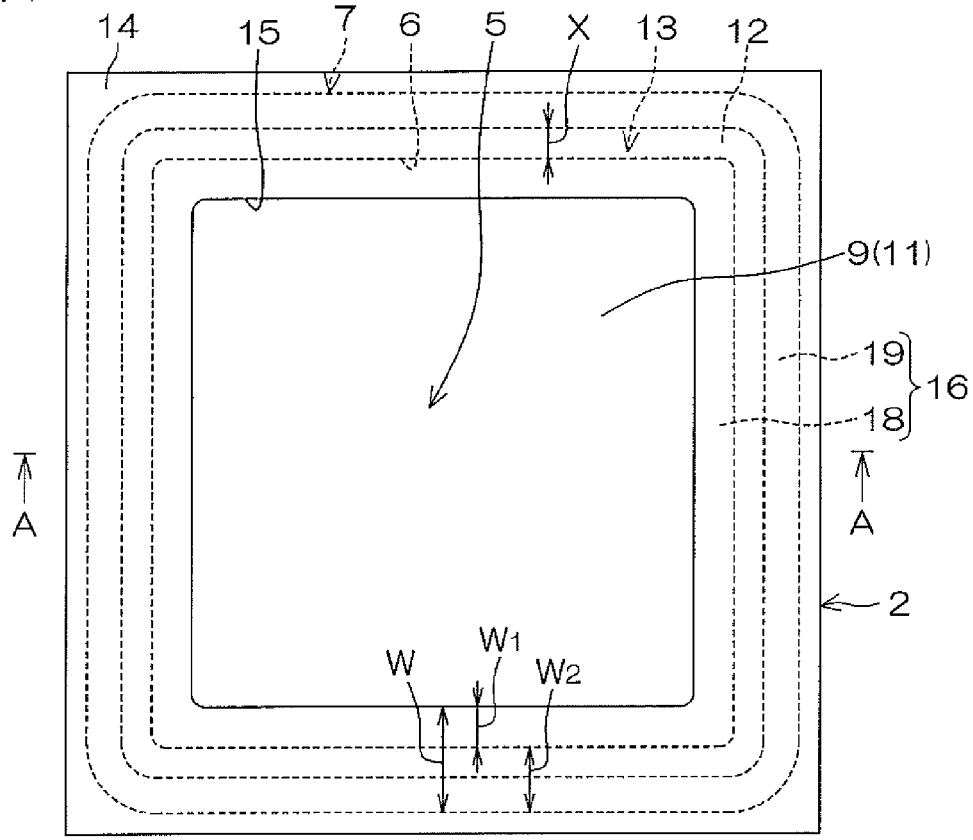
FIG. 1 is a schematic plan view of a Schottky barrier diode according to a first preferred embodiment of the present invention.
Figure 2:
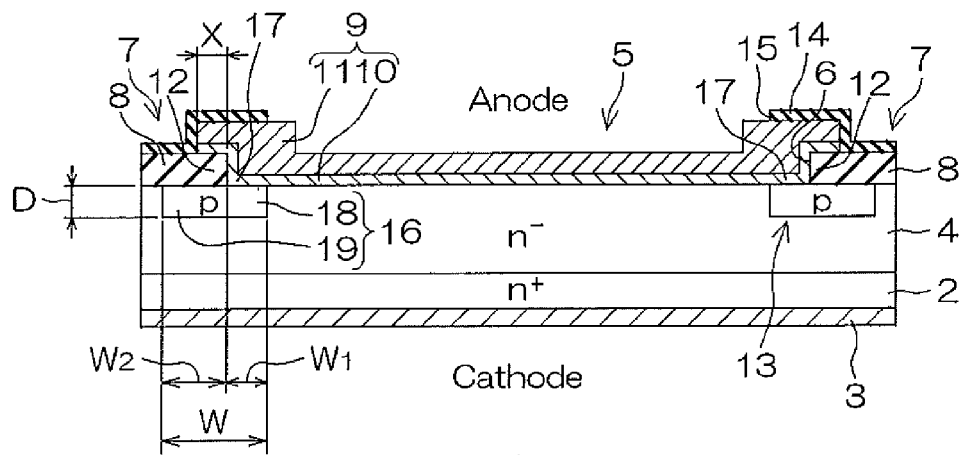
FIG. 2 is a sectional view of the Schottky barrier diode of FIG. 1, and shows a cutting plane along cutting-plane line A-A of FIG. 1.

FIG. 1 is a schematic plan view of a Schottky barrier diode according to a first preferred embodiment of the present invention. FIG. 2 is a sectional view of the Schottky barrier diode of FIG. 1, and shows a cutting plane along cutting-plane line A-A of FIG. 1.

The Schottky barrier diode 1 is a Schottky barrier diode that employs SiC (i.e., a wide bandgap semiconductor having a bandgap width of about 3.26 eV), and, for example, is a square chip when viewed planarly as shown in FIG. 1.

The chip-shaped Schottky barrier diode 1 has a length of several millimeters (mm) in each of up, down, right, and left directions in the sheet of FIG. 1.

The Schottky barrier diode 1 has an n+ type SiC substrate 2 (whose concentration is, for example, $1 \times 10^{18}$ to $1 \times 10^{21}$ cm$^{-3}$). A cathode electrode 3 serving as an ohmic electrode (second electrode) is formed on the reverse surface of the SiC substrate 2 in such a way as to cover the whole area of the reverse surface. The cathode electrode 3 is made of a metal (for example, Ni silicide or Co silicide) that comes into ohmic contact with n type SiC.

An n− type SiC epitaxial layer 4 (whose concentration is, for example, $1 \times 10^{15}$ to $1 \times 10^{17}$ cm$^{-3}$) having a lower concentration than the SiC substrate 2 is stacked on the surface of the SiC substrate 2. The thickness of the SiC epitaxial layer 4 serving as a breakdown voltage holding layer is, for example, 1 μm to 100 μm.

A field insulation film 8 is stacked on the surface of the SiC epitaxial layer 4. The field insulation film 8 has an opening 6 by which a part of the SiC epitaxial layer 4 is exposed as an active region 5. A field region 7 that is a device-outer peripheral part surrounding the active region 5 is covered with the field insulation film 8.

The field insulation film 8 is made of a high dielectric-constant insulation material (hereinafter, referred to as a "high-k material") having a dielectric constant (which denotes a relative dielectric constant $\in_r$ with respect to a vacuum and which is hereinafter referred to simply as a "relative dielectric constant $\in_r$") that is higher than SiO$_2$ (silicon oxide).

More specifically, the field insulation film 8 is made of SiN (silicon nitride), Al$_2$O$_3$ (alumina) or AlON (aluminum oxynitride). With regard to relative dielectric constants $\in_r$ of these materials, the relative dielectric constant $\in_{SiN}$ of SiN is 7.5, the relative dielectric constant $\in_{Al2O3}$ of Al$_2$O$_3$ is about 8.5, and the relative dielectric constant $\in_{AlON}$ of AlON is 6. The thickness of the field insulation film 8 is, for example, 1000 Å or more, and is, preferably, 3000 Å to 30000 Å.

An anode electrode 9 serving as a first electrode is formed on the field insulation film 8.

The anode electrode 9 has a two-layer structure consisting of a Schottky metal 10 joined to the SiC epitaxial layer 4 in the opening 6 of the field insulation film 8 and a contact metal 11 stacked on the Schottky metal 10.

The Schottky metal 10 is made of a metal (for example, Ni or Au) that makes a Schottky junction by being joined to an n type SiC. The Schottky metal 10 joined to SiC forms a Schottky barrier (potential barrier) having a height of, for example, 0.7 eV to 1.7 eV between the Schottky metal 10 and the SiC semiconductor.

The Schottky metal 10 projects outwardly from the opening 6 in a flange-like manner in such a way that a peripheral edge 12 of the opening 6 in the field insulation film 8 is covered therewith from above. In other words, the peripheral edge 12 of the field insulation film 8 is put from both of its upper and lower sides over the whole circumference by means of the SiC epitaxial layer 4 and the Schottky metal 10. Therefore, an outer peripheral area of the Schottky junction in the SiC epitaxial layer 4 (i.e., an inner edge 13 of the field region 7) is covered with the peripheral edge 12 of the field insulation film 8 made of SiC.

The amount X of protrusion of the field insulation film 8 from the end of the opening 6 of the anode electrode 9 with which the peripheral edge 12 of the field insulation film 8 is covered is, for example, 10 μm or more, and is, preferably, 10 μm to 100 μm.

The thickness of the Schottky metal 10 is, for example, 0.01 μm to 5 μm in the first preferred embodiment.

The contact metal 11 is a part that is exposed at the topmost surface of the Schottky barrier diode 1 in the anode electrode 9 and to which a bonding wire or the like is joined. The contact metal 11 is made of, for example, Al.

The contact metal 11 projects outwardly from the opening 6 in a flange-like manner in such a way that the peripheral edge 12 of the opening 6 in the field insulation film 8 is covered therewith from above in the same way as the Schottky metal 10.

The thickness of the contact metal 11 is greater than that of the Schottky metal 10, and is, for example, 0.5 μm to 10 μm in the first preferred embodiment.

A surface protection film 14 is formed on the topmost surface of the Schottky barrier diode 1. An opening 15 by which the contact metal 11 is exposed is formed at a central part of the surface protection film 14. A bonding wire or the like is joined to the contact metal 11 through the opening 15.

A p type guard ring 16 is formed on a surface layer part of the SiC epitaxial layer 4 so as to be contiguous to the Schottky metal 10 of the anode electrode 9. The guard ring 16 is formed along the outline of the opening 6 so as to straddle the inside and outside of the opening 6 of the field insulation film 8 (so as to straddle the active region 5 and the field region 7) when viewed planarly. Therefore, the guard ring 16 includes an inner part 18 that projects inwardly from the opening 6 and that is contiguous to an outer edge 17 serving as a terminal of the Schottky metal 10 in the opening 6 and an outer part 19 that projects outwardly from the opening 6 and that faces the anode electrode 9 (the Schottky metal 10) with the peripheral edge 12 of the field insulation film 8 therebetween.

The width $W_1$ of the inner part 18 of the guard ring 16 is 1 μm to 50 μm, and the width $W_2$ of the outer part 19 of the guard ring 16 is 1 μm to 500 μm. The overall width W of the guard ring 16 that is the total of these widths $W_1$ and $W_2$ is, for example, 5 μm to 550 μm. The depth D from the surface of the SiC epitaxial layer 4 of the guard ring 16 is, for example, 1000 Å or more, and is, preferably, 2000 Å to 7000 Å.

In the Schottky barrier diode 1, a forward bias state is reached in which a positive voltage is applied to the anode electrode 9 and in which a negative voltage is applied to the cathode electrode 3, and, as a result, electrons (carriers) move from the cathode electrode 3 to the anode electrode 9 through the active region 5 of the SiC epitaxial layer 4, and an electric current flows.

Figure 3A:
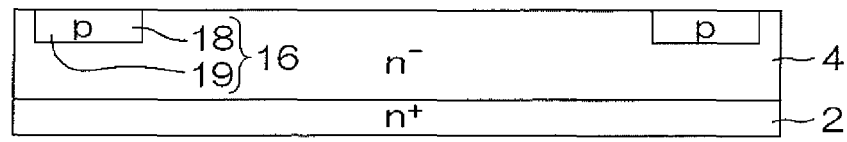
FIG. 3A is a schematic sectional view showing a part of steps of producing the Schottky barrier diode of FIG. 2, and shows a cutting plane at the same position as in FIG. 2.
Figure 3B:
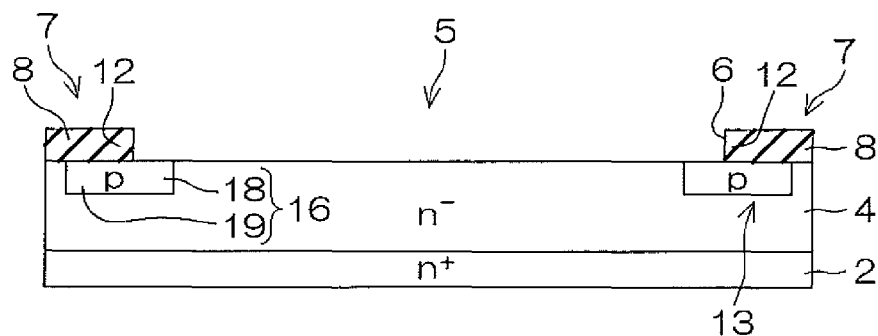
FIG. 3B is a view showing a step subsequent to that of FIG. 3A.
Figure 3C:
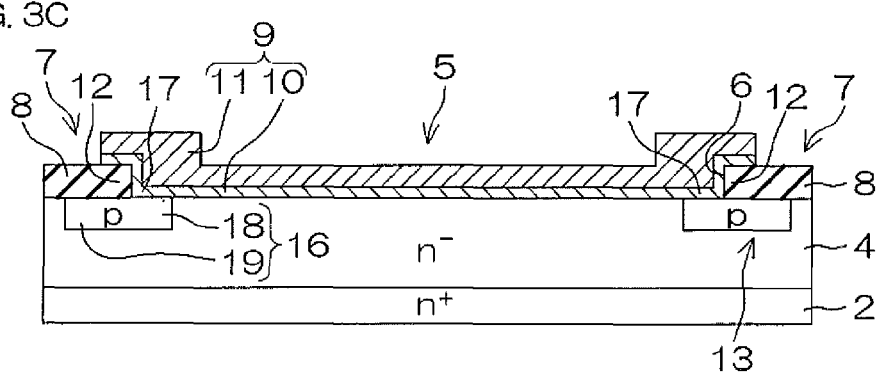
FIG. 3C is a view showing a step subsequent to that of FIG. 3B.

FIG. 3A to FIG. 3C are schematic sectional views showing a part of steps of producing the Schottky barrier diode of FIG. 2, and each view shows a cutting plane at the same position as in FIG. 2.

To produce the Schottky barrier diode 1, SiC crystals are grown on the surface (Si plane) of the SiC substrate 2 while being doped with n type impurities (for example, N (nitrogen), P (phosphorus), As (arsenic), etc.) according to an epitaxial growth method, such as a CVD (Chemical Vapor Deposition) method, an LPE (Liquid Phase Epitaxy) method, or an MBE (Molecular Beam Epitaxy) method, as shown in FIG. 3A. As a result, an n⁻ type SiC epitaxial layer 4 is formed on the SiC substrate 2.

Thereafter, p type impurities (for example, Al (aluminum), B (boron), etc.) are implanted into the SiC epitaxial layer 4 from the surface of the SiC epitaxial layer 4.

Thereafter, the SiC epitaxial layer 4 is heat-treated at, for example, 1400° C. to 2000° C. As a result, ions of the p type impurities implanted into the surface layer part of the SiC epitaxial layer 4 are activated, and the guard ring 16 is formed. The heat-treatment of the SiC epitaxial layer 4 can be performed, for example, by controlling a resistance heating furnace or a high frequency induction heating furnace at a suitable temperature.

Thereafter, as shown in FIG. 3B, the field insulation film 8 made of a high-k material is stacked on the SiC epitaxial layer 4 according to the CVD method.

Thereafter, the field insulation film 8 undergoes patterning according to a well-known patterning technique, and, as a result, the opening 6 by which the active region 5 of the SiC epitaxial layer 4 is exposed is formed.

Thereafter, as shown in FIG. 3C, a material for the Schottky metal 10 and a material for the contact metal 11 are stacked in this order according to a sputtering method or a vapor deposition method. Thereafter, these metals stacked on each other undergo patterning according to a well-known patterning technique, and the anode electrode 9 made of the Schottky metal 10 and the contact metal 11 is formed.

Thereafter, the cathode electrode 3 is formed on the reverse surface of the SiC substrate 2, and the surface protection film 14 is formed such that the surface of the SiC epitaxial layer 4 is covered therewith.

The Schottky barrier diode 1 of FIG. 2 is obtained through these steps.

As described above, according to the first preferred embodiment, the field insulation film 8 is made of the high-k material (e.g., SiN, $Al_2O_3$ or AlON). Therefore, a great reverse voltage is applied between the anode electrode 9 and the cathode electrode 3, and, even if an avalanche breakdown occurs, an electric field $E_{High-k}$ to be applied to the field insulation film 8 can be weakened.

For example, if the field insulation film 8 is made of $Al_2O_3$, an electric field $E_{High-k}$ to be applied to the field insulation film 8 is expressed as $$E_{Al2O3} = (\epsilon_{SiC}/\epsilon_{Al2O3}) \cdot E_{SiC} = (10/8.5) \cdot E_{SiC} = \text{about } 1.2 E_{SiC} \text{ MV/cm} \quad (1)$$

in accordance with Gauss law.

On the other hand, if the field insulation film 8 is made of $SiO_2$, an electric field $E_{SiO2}$ to be applied to the field insulation film ($SiO_2$ film) 8 is expressed as $$E_{SiO2} = (\epsilon_{SiC}/\epsilon_{SiO2}) \cdot E_{SiC} = (10/3.9) \cdot E_{SiC} = \text{about } 2.5 E_{SiC} \text{ MV/cm} \quad (2).$$

As a result of Formulas (1) and (2), the electric field $E_{High-k}$ in the field insulation film 8 made of $Al_2O_3$ can become about 0.48 times as low as the field insulation film 8 made of $SiO_2$. As a result, the breakdown of the field insulation film 8 can be reduced.

Particularly in the structure of the Schottky barrier diode 1 according to the first preferred embodiment, the electric field is liable to concentrate near the outer edge 17 (i.e., the inner edge 13 of the field region 7) of the anode electrode 9 (the Schottky metal 10).

Therefore, if the whole of the field insulation film 8 is made of a high-k material as in the first preferred embodiment, the field insulation film 8 made of the high-k material can also be brought into contact with the inner edge 13 of the field region 7. Therefore, the breakdown of the field insulation film 8 can be effectively reduced.

Figure 5:
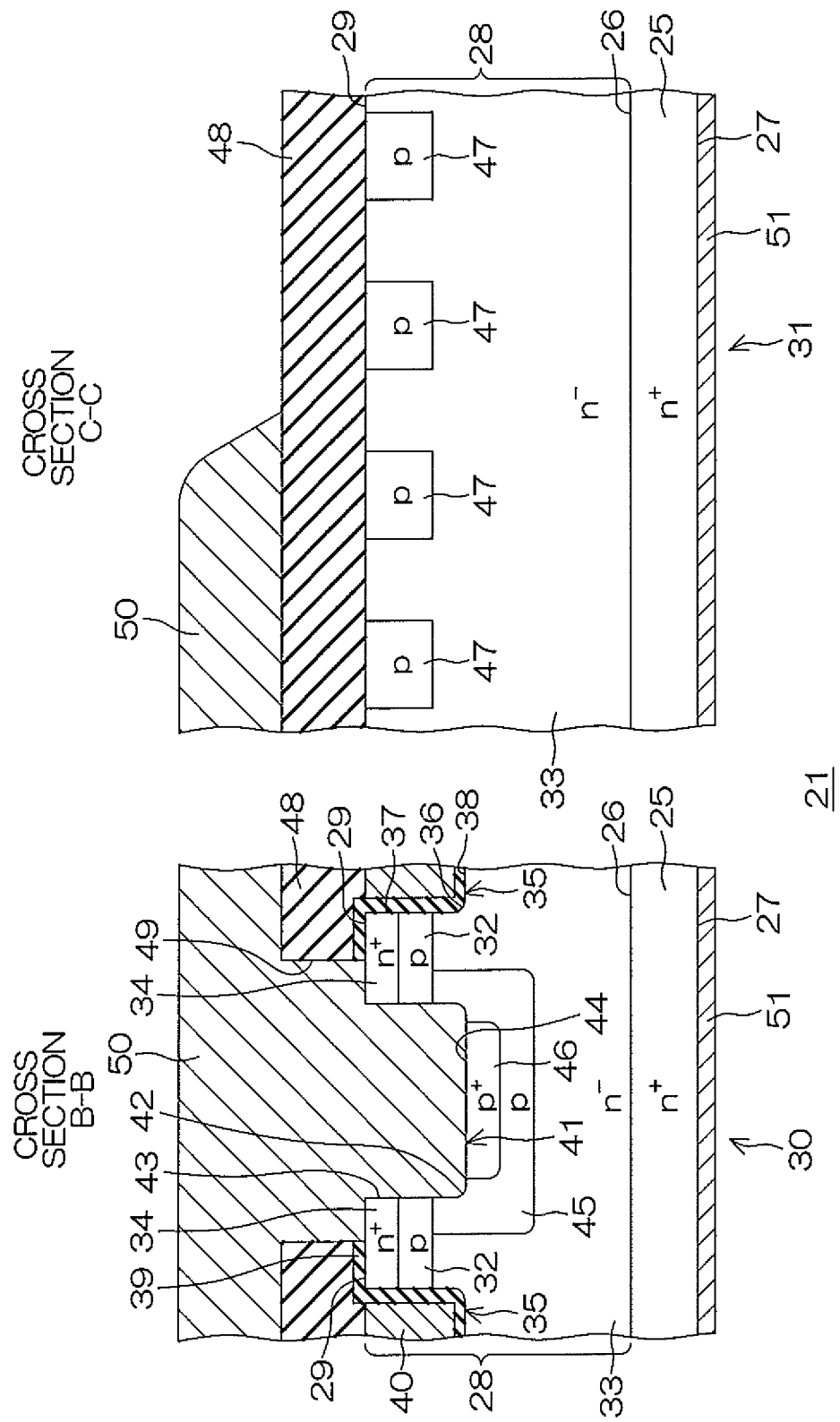
FIG. 5 is sectional views of the trench-gate type MIS transistor of FIG. 4, showing cutting planes along cutting-plane lines B-B and C-C of FIG. 4(b), respectively.

FIG. 4(a) and FIG. 4(b) are schematic plan views of a trench-gate type MIS transistor according to a second preferred embodiment of the present invention, FIG. 4(a) being an overall view, FIG. 4(b) being an internal enlarged view. FIG. 5 is sectional views of the trench-gate type MIS transistor of FIG. 4, showing cutting planes along cutting-plane lines B-B and C-C of FIG. 4(b), respectively.

The MIS transistor 21 is a trench-gate type DMISFET (Double diffused Metal Insulator Semiconductor Field Effect Transistor) in which SiC is employed, and, as shown in FIG. 4(a), is shaped like, for example, a square chip when viewed planarly. The chip-shaped MIS transistor 21 has a length of several millimeters (mm) in each of up, down, right, and left directions in the sheet of FIG. 4(a).

A source pad 22 is formed on the surface of the MIS transistor 21. The source pad 22 has a substantially square shape when viewed planarly in which its four corners are bent outwardly, and is formed such that substantially all area of the surface of the MIS transistor 21 is covered therewith. In the source pad 22, a removal region 23 is formed near the center of its one side. This removal region 23 is a region in which the source pad 22 is not formed.

A gate pad 24 is disposed in the removal region 23. A gap is made between the gate pad 24 and the source pad 22, which are insulated from each other.

Next, an internal structure of the MIS transistor 21 will be described.

The MIS transistor 21 includes an n$^+$ type SiC substrate 25 (whose concentration is, for example, $1 \times 10^{18}$ to $1 \times 10^{21}$ cm$^{-3}$). The SiC substrate 25 functions as a drain of the MIS transistor 21 in the second preferred embodiment, and its surface (upper surface) 26 is an Si plane, whereas its reverse surface (lower surface) 27 is a C plane.

An n$^-$ type SiC epitaxial layer 28 (whose concentration is, for example, $1 \times 10^{15}$ to $1 \times 10^{17}$ cm$^{-3}$) that has a lower concentration than the SiC substrate 25 is stacked on the surface 26 of the SiC substrate 25. The thickness of the SiC epitaxial layer 28 serving as a breakdown voltage holding layer is, for example, 1 µm to 100 µm. The SiC epitaxial layer 28 is formed on the SiC substrate 25 by means of so-called epitaxial growth. In the SiC epitaxial layer 28 formed on the surface 26 that is an Si plane, the Si plane is grown as a growth principal plane. Therefore, the surface 29 of the SiC epitaxial layer 28 formed by growth is an Si plane in the same way as the surface 26 of the SiC substrate 25.

As shown in FIG. 4(a), an active region 30 that is disposed at the central part of the SiC epitaxial layer 28 when viewed planarly and that functions as the MIS transistor 21 and a transistor-surrounding region 31 that surrounds the active region 30 are formed in the MIS transistor 21.

Many p type body regions 32 (whose concentration is, for example, $1.0 \times 10^{16}$ cm$^{-3}$ to $1.0 \times 10^{19}$ cm$^{-3}$) are formed and arranged at a surface layer part of the SiC epitaxial layer 28 in the active region 30 in a matrix manner in row-wise and column-wise directions at constant pitches. Each body region 32 has a square shape when viewed planarly, and has a length of, for example, about 7.2 µm in each of up, down, right, and left directions in the sheet of FIG. 4(b).

On the other hand, the region closer to the SiC substrate 25 than the body region 32 in the SiC epitaxial layer 28 is an n$^-$ type drift region 33 in which a state without being changed after epitaxial growth is maintained.

An n$^+$ type source region 34 (whose concentration is, for example, $1 \times 10^{18}$ to $1 \times 10^{21}$ cm$^{-3}$) is formed in a substantially whole area closer to the surface 29 in each body region 32.

A gate trench 35 that reaches the drift region 33 from the surface 29 of the SiC epitaxial layer 28 through each source region 34 and each body region 32 is formed in such a way as to surround each body region 32.

As a result, many unit cells each of which functions as a field-effect transistor and each of which has a rectangular parallelepiped shape (a square shape when viewed planarly) are formed in the SiC epitaxial layer 28. In the unit cell, the depth direction of the gate trench 35 is a gate length direction, and the circumferential direction of each unit cell perpendicular to the gate length direction is a gate width direction.

The gate trench 35 is shaped like the letter U in cross section in which corner portions 36 of both ends in a direction perpendicular to the gate width in its bottom portion (i.e., in a direction facing an adjoining unit cell) are bent toward the drift region 33 and in which a side surface 37 and a bottom surface 38 facing each other are continuous with each other through a curved plane. This makes it possible to disperse an electric field to be applied to the corner portions 36 of both ends in the bottom portion of the gate trench 35 to parts other than the corner portions 36 when the unit cell is turned off, and hence makes it possible to restrain the insulation breakdown of parts on the bottom surface 38 in a gate insulation film 39 (described later).

The gate insulation film 39 is formed on the inner surface of the gate trench 35 such that its whole area is covered therewith. The gate insulation film 39 is made of a high-k material (e.g., SiN, Al$_2$O$_3$, or AlON).

The inside of the gate insulation film 39 is completely filled with a polysilicon material doped with highly-concentrated n type impurities, and, as a result, a gate electrode 40 is buried in the gate trench 35. A vertical MIS transistor structure is thus created in which the source region 34 and the drift region 33 are arranged apart from each other with the body region 32 therebetween in a vertical direction perpendicular to the surface 29 of the SiC epitaxial layer 28.

A source trench 41 that reaches the drift region 33 from the surface 29 of the SiC epitaxial layer 28 through each source region 34 and each body region 32 is formed in the central part of each unit cell. The depth of the source trench 41 is the same as that of the gate trench 35 in the second preferred embodiment. In the same way as the gate trench 35, the source trench 41 is shaped like the letter U in cross section in which corner portions 42 of both ends in a direction perpendicular to the gate width in its bottom portion (i.e., in a direction facing an adjoining unit cell) are bent toward the drift region 33 and in which a side surface 43 and a bottom surface 44 facing each other are continuous with each other through a curved plane.

P type impurities (whose concentration is, for example, $1.0 \times 10^{16}$ cm$^{-3}$ to $1.0 \times 10^{19}$ cm$^{-3}$) are selectively injected into the drift region 33, and, as a result, a p type region 45 is formed at a part exposed in the source trench 41 of each unit cell. As a result, in a part closer to the SiC substrate 25 with respect to the source region 34 in the inner surface of the source trench 41 (i.e., in a part deeper than the lower end of the source region 34 in the bottom surface 44 and the side surface 43), its whole area is a p type region.

A $p^+$ type body contact region 46 (whose impurity concentration is, for example, $1.0 \times 10^{18}$ cm$^{-3}$ to $2.0 \times 10^{21}$ cm$^{-3}$) is formed at the central part of the bottom surface 44 of the source trench 41.

In the transistor-surrounding region 31, a plurality of p type guard rings 47 (four in the second preferred embodiment) are formed at the surface layer part of the SiC epitaxial layer 28 apart from the active region 30 in such a way as to surround the unit cells (the active region 30) arranged in a matrix manner. These guard rings 47 can be formed through the same ion implantation step as the step of forming the p type body region 32.

Each guard ring 47 is formed to have a planarly-viewed quadrangular annular shape along the outer periphery of the MIS transistor 21 when viewed planarly. The depth of the guard ring 47 from the surface 29 of the SiC epitaxial layer 28 is substantially the same as that of the body region 32, and is, for example, 2000 Å or more, and is, preferably, 3000 Å to 10000 Å.

An interlayer insulation film 48 is stacked on the SiC epitaxial layer 28 such that the gate electrode 40 is covered therewith. The interlayer insulation film 48 is made of a high-k material (e.g., SiN, $Al_2O_3$, or AlON).

A contact hole 49 larger in diameter than the source trench 41 is formed in the interlayer insulation film 48 and the gate insulation film 39. As a result, the whole of the source trench 41 of each unit cell (i.e., the side surface 43 and the bottom surface 44 of the source trench 41) and the peripheral edge of the source trench 41 in the surface 29 of the SiC epitaxial layer 28 are exposed in the contact hole 49, and a level difference corresponding to a difference in level between the surface 29 and the bottom surface 44 is made.

A source electrode 50 serving as a first electrode is formed on the interlayer insulation film 48. The source electrode 50 enters the source trenches 41 of all unit cells through each contact hole 49 in the lump, and, in each unit cell, is in contact with the body contact region 46, the p type region 45, the body region 32, and the source region 34 in order from the bottom side of the source trench 41. In other words, the source electrode 50 serves as a wire shared among all unit cells.

An interlayer insulation film (not shown) is formed on the source electrode 50, and the source electrode 50 is electrically connected to the source pad 22 (see FIG. 4(a)) through this interlayer insulation film (not shown). On the other hand, the gate pad 24 (see FIG. 4(a)) is electrically connected to the gate electrode 40 through a gate wire (not shown) laid on this interlayer insulation film (not shown).

The source electrode 50 has a structure in which, for example, a Ti/TiN layer and an Al layer are stacked in order from the contact side with the SiC epitaxial layer 28.

A drain electrode 51 serving as a second electrode is formed on the reverse surface 27 of the SiC substrate 25 such that the whole area of the reverse surface 27 is covered therewith. The drain electrode 51 is an electrode shared among all unit cells. A laminated structure (Ti/Ni/Au/Ag) in which, for example, Ti, Ni, Au, and Ag are stacked in order from the side of the SiC substrate 25 can be employed as the drain electrode 51.

In the MIS transistor 21, a voltage greater than a threshold voltage is applied to the gate electrode 40 in a state in which a predetermined potential difference has been generated between the source electrode 50 and the drain electrode 51 (at a source-drain interval). As a result, a channel is formed near an interface with the gate insulation film 39 in the body region 32 by means of an electric field from the gate electrode 40. Thus, electrons (carriers) move from the source electrode 50 to the drain electrode 51 through the source region 34, the channel, and the drift region 33 in the active region 30, and an electric current flows.

FIG. 6A to FIG. 6F are schematic sectional views showing a part of steps of producing the trench-gate type MIS transistor of FIG. 5, and each view shows a cutting plane at the same position as in FIG. 5.

To produce the MIS transistor 21, SiC crystals are grown on the surface (Si plane) 26 of the SiC substrate 25 while being doped with n type impurities (for example, N (nitrogen), P (phosphorus), As (arsenic), etc.) according to an epitaxial growth method, such as the CVD method, the LPE method, or the MBE method, as shown in FIG. 6A. As a result, an n$^-$ type SiC epitaxial layer 28 is formed on the SiC substrate 25.

Thereafter, p type impurities (for example, Al (aluminum), B (boron), etc.) are implanted into the SiC epitaxial layer 28 from the surface 29 of the SiC epitaxial layer 28.

Thereafter, n type impurities are implanted into the SiC epitaxial layer 28 from the surface 29 of the SiC epitaxial layer 28.

Thereafter, the SiC epitaxial layer 28 is heat-treated at, for example, 1400° C. to 2000° C. As a result, ions of the p type and n type impurities implanted into the surface layer part of the SiC epitaxial layer 28 are activated, and, in accordance with impurity-implanted areas, the body region 32, the source region 34, and the guard ring 47 are simultaneously formed. The drift region 33 maintaining a state without being changed after epitaxial growth is formed at a base layer part of the SiC epitaxial layer 28.

Thereafter, as shown in FIG. 6B, the SiC epitaxial layer 28 is etched by use of a mask that has an opening in an area in which the gate trench 35 and the source trench 41 are to be formed. As a result, the SiC epitaxial layer 28 undergoes dry etching from the surface (Si plane) 29, and the gate trench 35 and the source trench 41 are simultaneously formed. At the same time, many unit cells are formed in the SiC epitaxial layer 28. For example, a mixed gas ($SF_6/O_2$ gas) containing $SF_6$ (sulfur hexafluoride) and $O_2$ (oxygen) or a mixed gas ($SF_6/O_2$/HBr gas) containing $SF_6$, $O_2$, and HBr (hydrogen bromide) can be used as the etching gas.

Thereafter, p type impurities are implanted into the drift region 33 from the bottom surface 44 of the source trench 41. Implantation is performed at a first stage at which ions relatively low in dose amount are implanted and at a second stage at which ions relatively high in dose amount are implanted. Thereafter, the SiC epitaxial layer 28 is heat-treated at, for example, 1400° C. to 2000° C. As a result, ions of the p type impurities implanted into the drift region 33 are activated, and the p type region 45 and the body contact region 46 are simultaneously formed.

Thereafter, as shown in FIG. 6C, a high-k material is deposited from above the SiC epitaxial layer 28 according to the CVD method. As a result, the gate insulation film 39 is formed.

Thereafter, the doped polysilicon material 52 is deposited from above the SiC epitaxial layer 28 according to the CVD method. The polysilicon material 52 is continuously deposited until at least the gate trench 35 and the source trench 41 are completely filled therewith. Thereafter, the deposited polysilicon material 52 undergoes etchback until an etchback surface becomes flush with the surface 29 of the SiC epitaxial layer 28.

Thereafter, as shown in FIG. 6D, only the polysilicon material 52 remaining in the source trench 41 is removed by dry etching. As a result, the gate electrode 40 made of the polysilicon material 52 remaining in the gate trench 35 is formed.

Figure 6E:
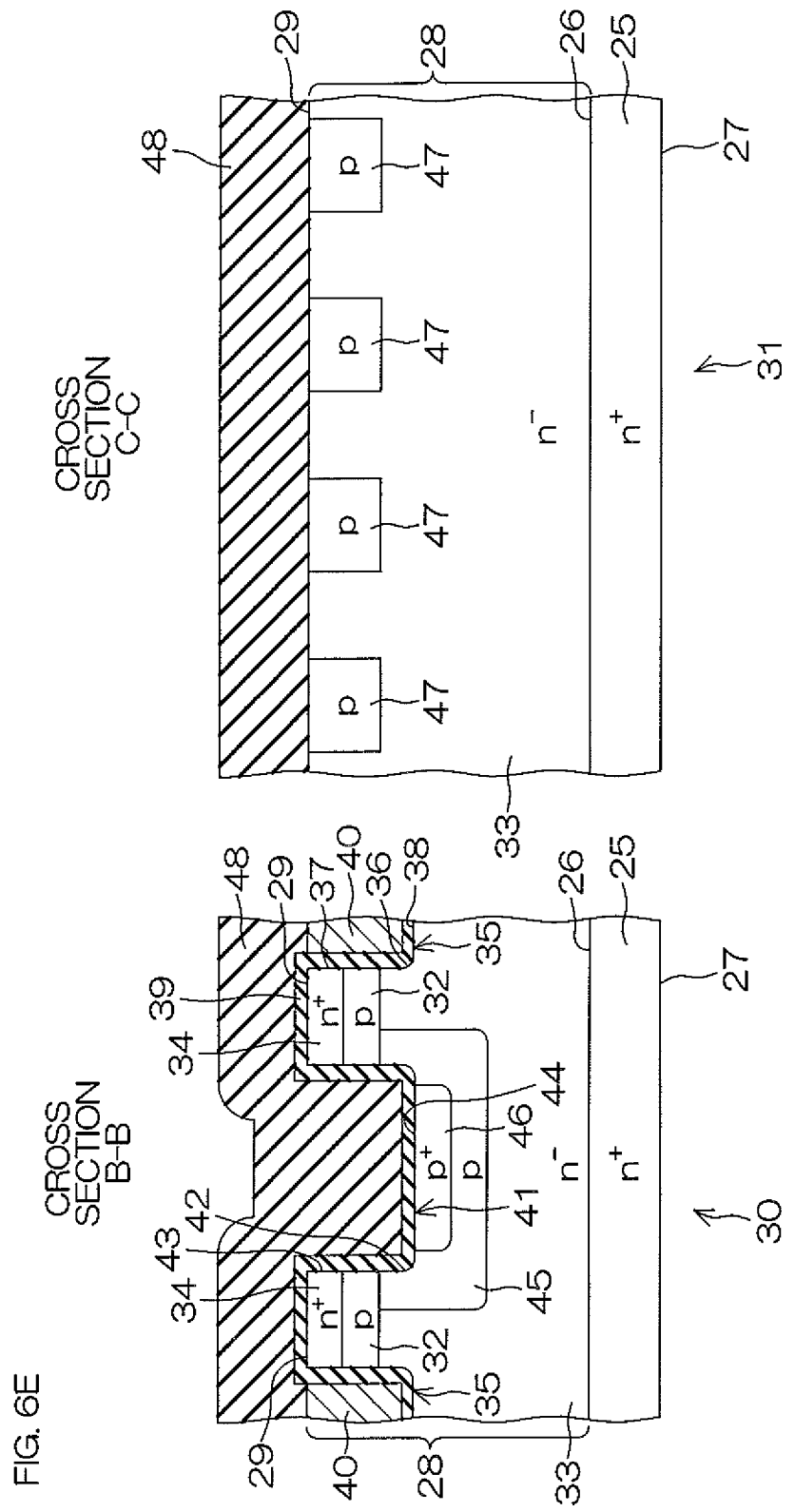
FIG. 6E is views showing a step subsequent to that of FIG. 6D.

Thereafter, as shown in FIG. 6E, a high-k material is deposited from above the SiC epitaxial layer 28 according to the CVD method. As a result, the interlayer insulation film 48 is formed.

Thereafter, as shown in FIG. 6F, the interlayer insulation film 48 and the gate insulation film 39 continuously undergo patterning by a well-known patterning technique. As a result, the contact hole 49 is formed in the interlayer insulation film 48 and the gate insulation film 39.

Thereafter, the source electrode 50, the drain electrode 51, etc., are formed, and, as a result, the MIS transistor 21 of FIG. 5 is obtained.

As described above, according to the second preferred embodiment, the gate insulation film 39 and the interlayer insulation film 48 that are contiguous to the SiC epitaxial layer 28 are made of a high-k material (e.g., SiN, $Al_2O_3$, or AlON). Therefore, as is proven by a comparison between Formulas (1) and (2) in the first preferred embodiment, an electric field $E_{High-k}$ to be applied to the gate insulation film 39 and to the interlayer insulation film 48 can be weakened even if a great reverse voltage is applied between the source electrodes 50 and the drain electrode 51 so that an avalanche breakdown occurs. As a result, the breakdown of the gate insulation film 39 and the breakdown of the interlayer insulation film 48 can be reduced. Therefore, a MIS transistor having high avalanche resistance can be provided.

Particularly in a trench-gate type structure, such as that of the MIS transistor 21 of the second preferred embodiment, an electric field is liable to concentrate at the corner portions 36 of both ends of the gate trench 35 and at the bottom surface 38.

Therefore, if the whole of the gate insulation film 39 is made of a high-k material as in the second preferred embodiment, the gate insulation film 39 made of the high-k material can also be brought into contact with the corner portions 36 of both ends of the gate trench 35 and with the bottom surface 38. Therefore, the breakdown of the gate insulation film 39 can be effectively reduced.

Additionally, in the second preferred embodiment, it is more preferable to employ $Al_2O_3$ as the material of the gate insulation film 39 although the high-k material of which the interlayer insulation film 48 is made is recommended to be selected from among various high-k materials.

If the material of the gate insulation film 39 is $Al_2O_3$, the dielectric constant of the gate insulation film 39 can be made greater than that of $SiO_2$ while maintaining a relatively high barrier height with respect to the SiC epitaxial layer 28. As a result, a leakage current near the channel (the body region 32) caused by a quantum tunnel effect can be reduced.

As a result of a diligent examination by the present inventor, it has been understood that $HfO_2$ and $ZrO_2$ known as high-k materials are unsuitable for the gate insulation film contiguous to SiC. In other words, it has been understood that if $HfO_2$ and $ZrO_2$ are used as the materials of the gate insulation film 39 and are directly formed on SiC, the barrier height between $HfO_2$/$ZrO_2$ and SiC will become small, and, disadvantageously, a leakage current caused by the quantum tunnel effect will increase near the channel.

More specifically, when $HfO_2$ (bandgap $Eg_{HfO2}$=about 5.7 eV, relative dielectric constant $\in_{HfO2}$=about 24) is brought into contact with SiC, the barrier height on the electron side and the barrier height on the hole side are 1.3 eV (electron side) and 1.2 (hole side), respectively. Likewise, when $ZrO_2$ (bandgap $Eg_{ZrO2}$=about 5.8 eV, relative dielectric constant $\in_{ZrO2}$=about 18) is brought into contact with SiC, the barrier height on the electron side and the barrier height on the hole side are 1.3 eV (electron side) and 1.2 (hole side), respectively. On the other hand, when $SiO_2$ (bandgap $Eg_{SiO2}$=about 9 eV, relative dielectric constant $\in_{SiO2}$=about 3.9) is brought into contact with SiC, the barrier height on the electron side and the barrier height on the hole side are 3.0 eV (electron side) and 2.8 (hole side), respectively. Therefore, it has been understood that, when $HfO_2$ and $ZrO_2$ are used as the materials of the gate insulation film 39 and are directly formed on SiC, a leakage current becomes made greater than when $SiO_2$ is used as the material of the gate insulation film 39.

On the other hand, when $Al_2O_3$ is brought into contact with SiC, the barrier height on the electron side and the barrier height on the hole side are 2.6 eV (electron side) and 2.2 (hole side), respectively, and therefore it is possible to maintain substantially the same barrier height as when $SiO_2$ is employed. Moreover, $Al_2O_3$ is a high-k material whose relative dielectric constant $\in_{Al2O3}$ is about 8.5, and therefore the film thickness of the gate insulation film 39 can be obtained while excellently maintaining an interface state between the gate insulation film 39 and the body region 32. As a result, the leakage current can be made even smaller than when $SiO_2$ is employed.

Additionally, the MIS transistor 21 has a vertical structure, and therefore a high current can be allowed to easily flow, and high withstanding voltage and low on-resistance can be easily secured.

Additionally, in a process for producing the MIS transistor 21, the gate insulation film 39 is formed according to the CVD method, and therefore the film thickness of a part on the side surface 37 in the gate insulation film 39 can be more easily controlled than when that is formed according to the sputtering method.

In the second preferred embodiment, as shown in FIG. 7, a gate insulation film 53 made of $SiO_2$ may be employed instead of the gate insulation film 39 made of the high-k material.

Figure 8:
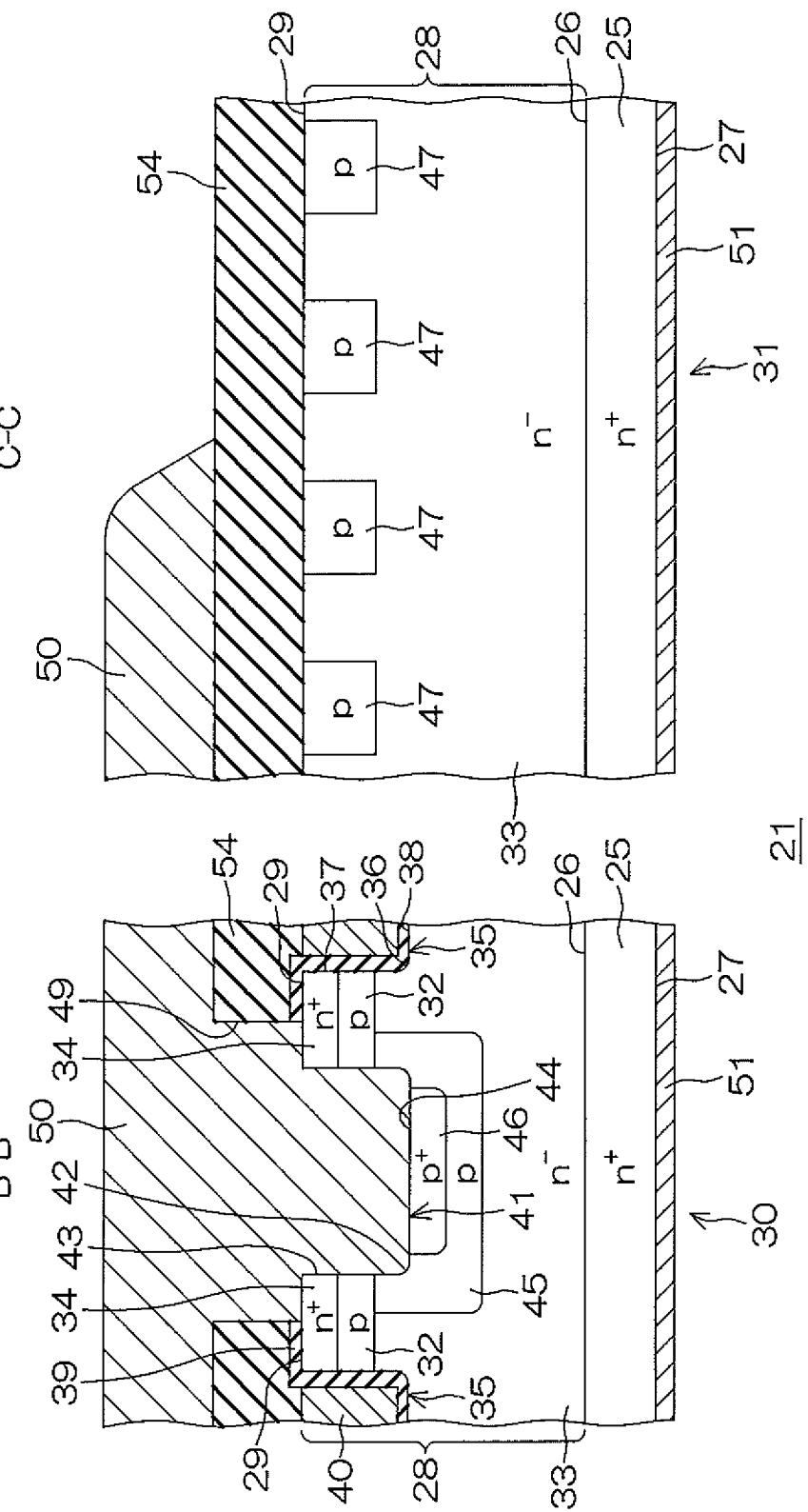
FIG. 8 is schematic sectional views showing a second modification of the trench-gate type MIS transistor of FIG. 5.

Additionally, as shown in FIG. 8, an interlayer insulation film 54 made of $SiO_2$ may be employed instead of the interlayer insulation film 48 made of the high-k material.

Figure 9:
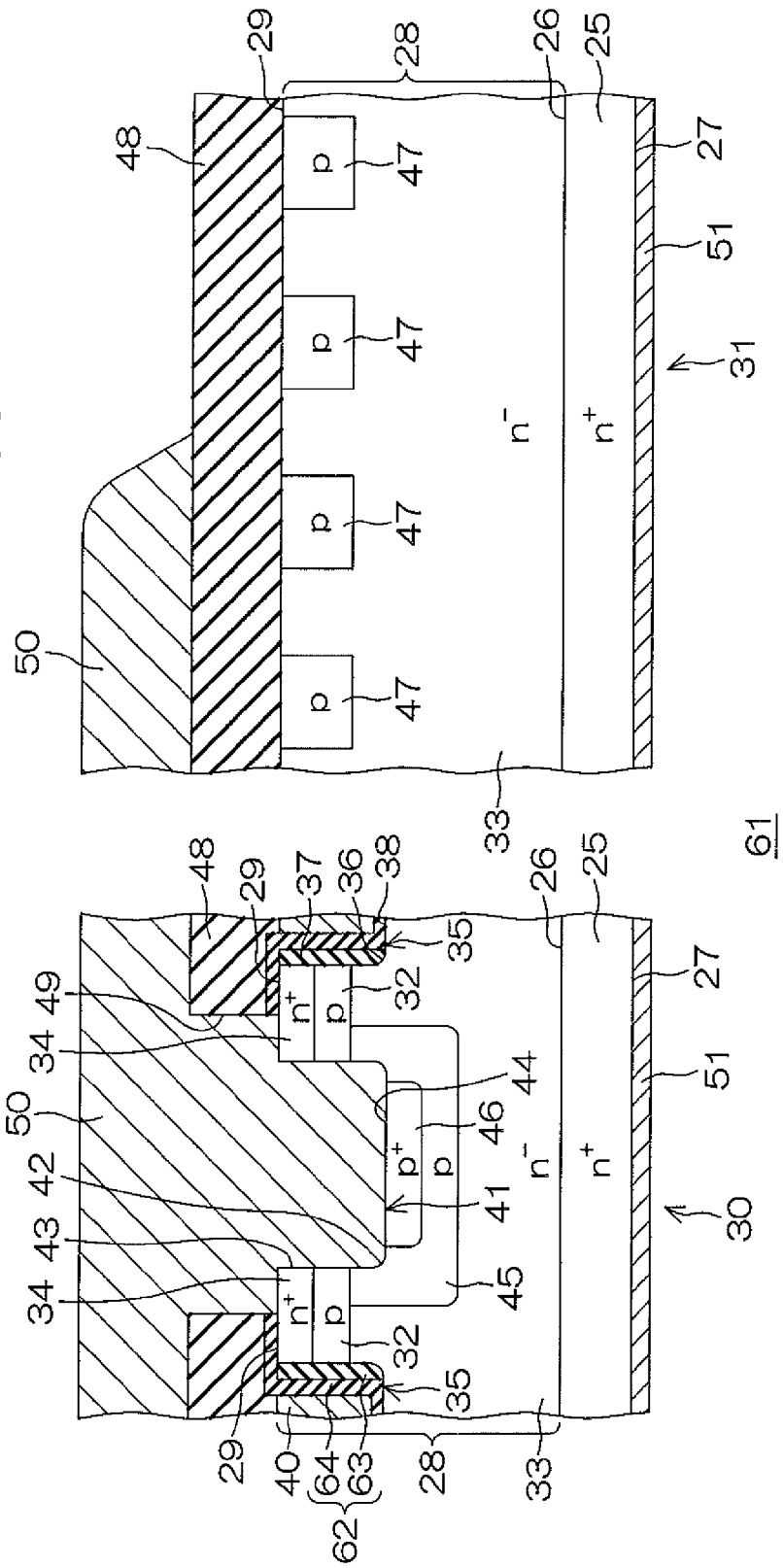
FIG. 9 is schematic sectional views of a trench-gate type MIS transistor according to a third preferred embodiment of the present invention.

FIG. 9 is schematic sectional views of a trench-gate type MIS transistor according to a third preferred embodiment of the present invention. In FIG. 9, the same reference sign as in FIG. 5 is given to each component equivalent to that of FIG. 5. Only differences between the structure of FIG. 9 and that of FIG. 5 will be hereinafter described, and a description of each component having the same reference sign will be omitted.

In the MIS transistor 61 shown in FIG. 9, a gate insulation film 62 formed on the inner surface of the gate trench 35 has a two-layer structure consisting of an $SiO_2$ film and a high-k film in a part on the side surface 37 of the gate trench 35, and has a single-layer structure consisting of only the high-k film in a part on the bottom surface 38.

In other words, in the third preferred embodiment, the high-k film is formed only at a part contiguous to the bottom surface 38 of the gate trench 35 and a part contiguous to the corner portions 36 of both ends thereof in the gate insulation film 62.

FIG. 10A to FIG. 10I are schematic sectional views showing a part of steps of producing the trench-gate type MIS transistor of FIG. 9, and each view shows a cutting plane at the same position as in FIG. 9.

To produce the MIS transistor 61, SiC crystals are grown on the surface (Si plane) 26 of the SiC substrate 25 while being doped with n type impurities (for example, N (nitrogen), P (phosphorus), As (arsenic), etc.) according to an epitaxial growth method, such as the CVD method, the LPE method, or the MBE method, as shown in FIG. 10A. As a result, then type SiC epitaxial layer 28 is formed on the SiC substrate 25.

Thereafter, p type impurities (for example, Al (aluminum), B (boron), etc.) are implanted into the SiC epitaxial layer 28 from the surface 29 of the SiC epitaxial layer 28.

Thereafter, n type impurities are implanted into the SiC epitaxial layer 28 from the surface 29 of the SiC epitaxial layer 28.

Thereafter, the SiC epitaxial layer 28 is heat-treated at, for example, 1400° C. to 2000° C. As a result, ions of the p type and n type impurities implanted into the surface layer part of the SiC epitaxial layer 28 are activated, and, in accordance with impurity-implanted areas, the body region 32, the source region 34, and the guard ring 47 are simultaneously formed. The drift region 33 maintaining a state without being changed after epitaxial growth is formed at a base layer part of the SiC epitaxial layer 28.

Thereafter, as shown in FIG. 10B, the SiC epitaxial layer 28 is etched by use of a mask that has an opening in an area in which the gate trench 35 and the source trench 41 are to be formed. As a result, the SiC epitaxial layer 28 undergoes dry etching from the surface (Si plane) 29, and the gate trench 35 and the source trench 41 are simultaneously formed. At the same time, many unit cells are formed in the SiC epitaxial layer 28. For example, a mixed gas ($SF_6/O_2$ gas) containing $SF_6$ (sulfur hexafluoride) and $O_2$ (oxygen) or a mixed gas ($SF_6/O_2$/HBr gas) containing $SF_6$, $O_2$, and HBr (hydrogen bromide) can be used as the etching gas.

Thereafter, p type impurities are implanted into the drift region 33 from the bottom surface 44 of the source trench 41. Implantation is performed at a first stage at which ions relatively low in dose amount are implanted and at a second stage at which ions relatively high in dose amount are implanted. Thereafter, the SiC epitaxial layer 28 is heat-treated at, for example, 1400° C. to 2000° C. As a result, ions of the p type impurities implanted into the drift region 33 are activated, and the p type region 45 and the body contact region 46 are simultaneously formed.

Thereafter, as shown in FIG. 10C, an $SiO_2$ film 63 serving as a first insulation film is formed on the whole area of the surface 29 of the SiC epitaxial layer 28 (which includes the inner surface of the gate trench 35 and the inner surface of the source trench 41) according to a thermal oxidation method.

Thereafter, as shown in FIG. 10D, a part on the Si plane of the SiC epitaxial layer 28 in the $SiO_2$ film 63 is selectively removed by etching. More specifically, a part on the surface 29 of the SiC epitaxial layer 28 in the $SiO_2$ film 63 is removed, and a part on the bottom surface 38 of the gate trench 35 and on a partial area of the corner portions 36 of both ends of the gate trench 35 is removed, and a part on the bottom surface 44 of the source trench 41 and on a partial area of the corner portions 42 of both ends of the source trench 41 is removed. As a result, the $SiO_2$ film 63 remains in the side surface 37 of the gate trench 35 and in the side surface 43 of the source trench 41, and the bottom surfaces 38 and 44 and the parts of the corner portions 36 and 42 are exposed.

Figure 10E:
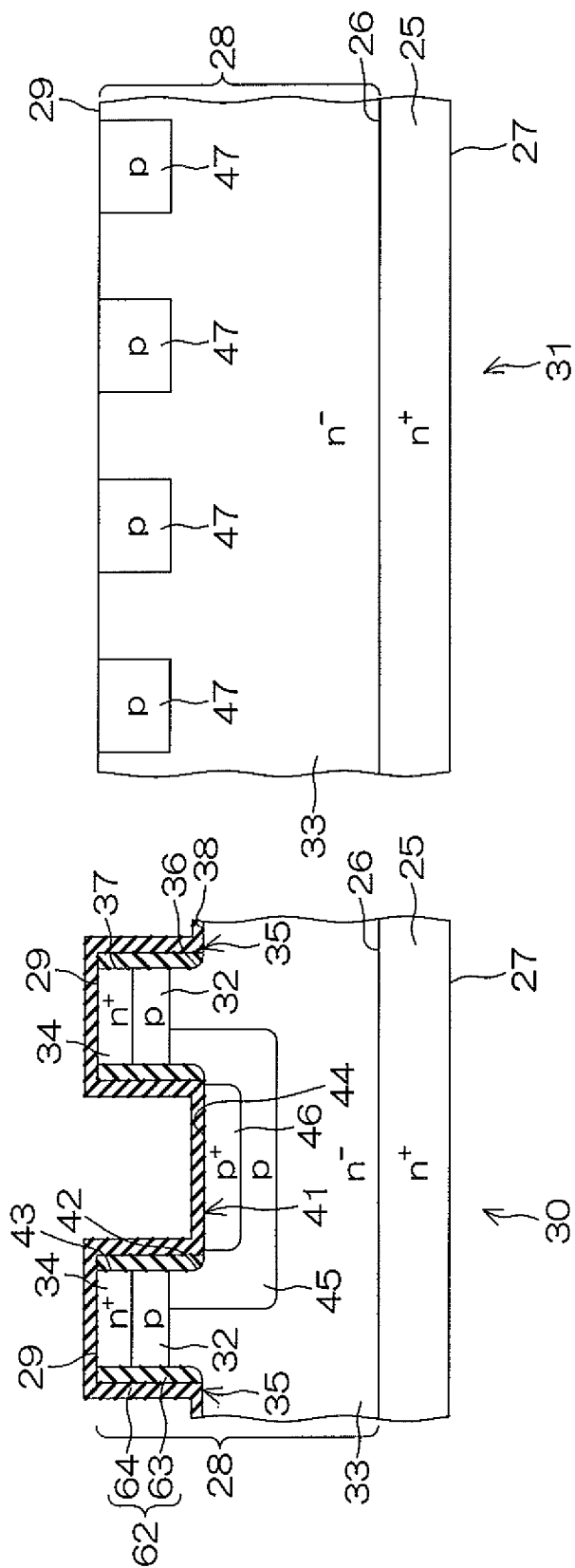
FIG. 10E is views showing a step subsequent to that of FIG. 10D.

Thereafter, as shown in FIG. 10E, a high-k material is deposited from above the SiC epitaxial layer 28 according to the CVD method. As a result, a high-k film 64 serving as a second insulation film is formed such that the bottom surface 38 of the gate trench 35 and the bottom surface 44 of the source trench 41 are covered therewith, and a gate insulation film 62 is formed.

Thereafter, as shown in FIG. 10F, the doped polysilicon material 52 is deposited from above the SiC epitaxial layer 28 according to the CVD method. The polysilicon material 52 is continuously deposited until at least the gate trench 35 and the source trench 41 are completely filled therewith. Thereafter, the deposited polysilicon material 52 undergoes etchback until an etchback surface becomes flush with the surface 29 of the SiC epitaxial layer 28.

Figure 10G:
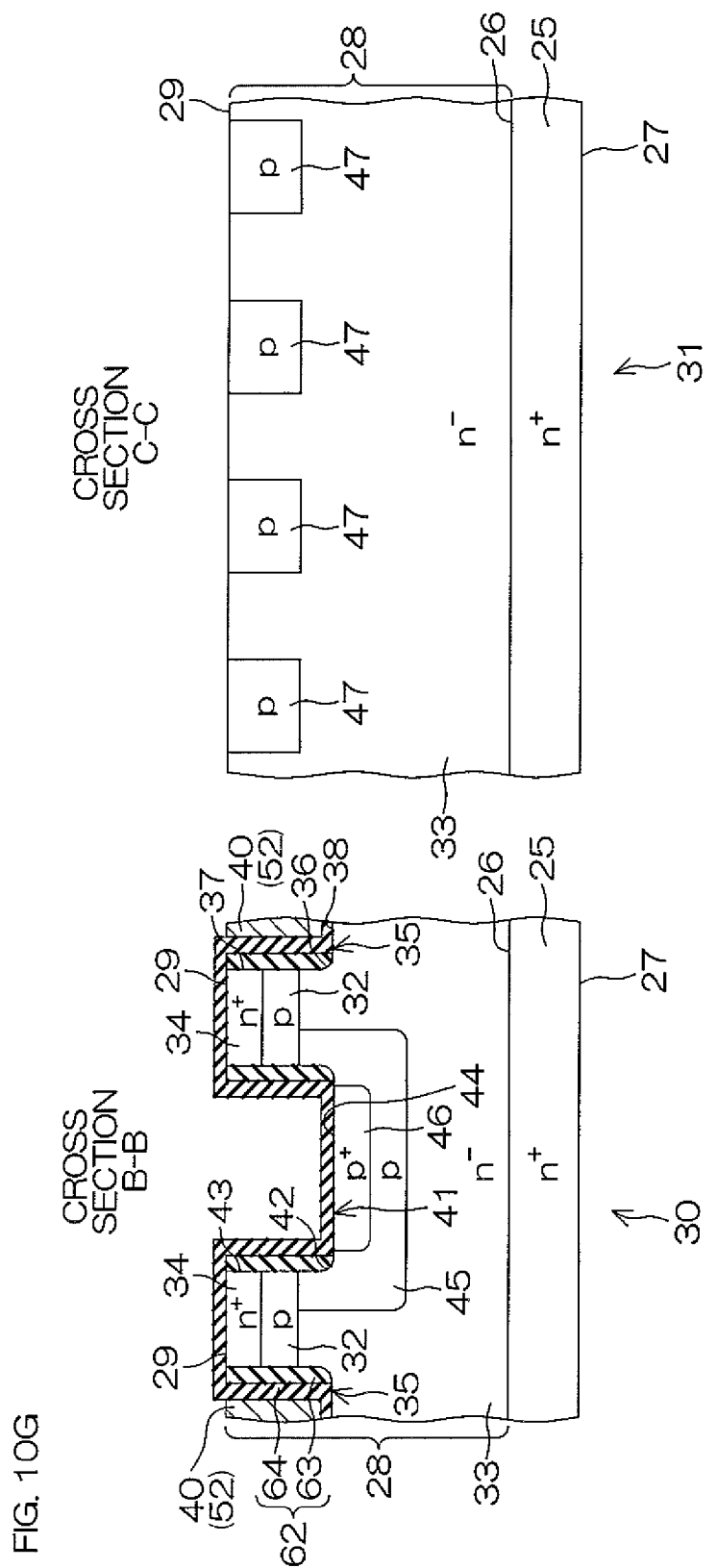
FIG. 10G is views showing a step subsequent to that of FIG. 10F.
Figure 10:
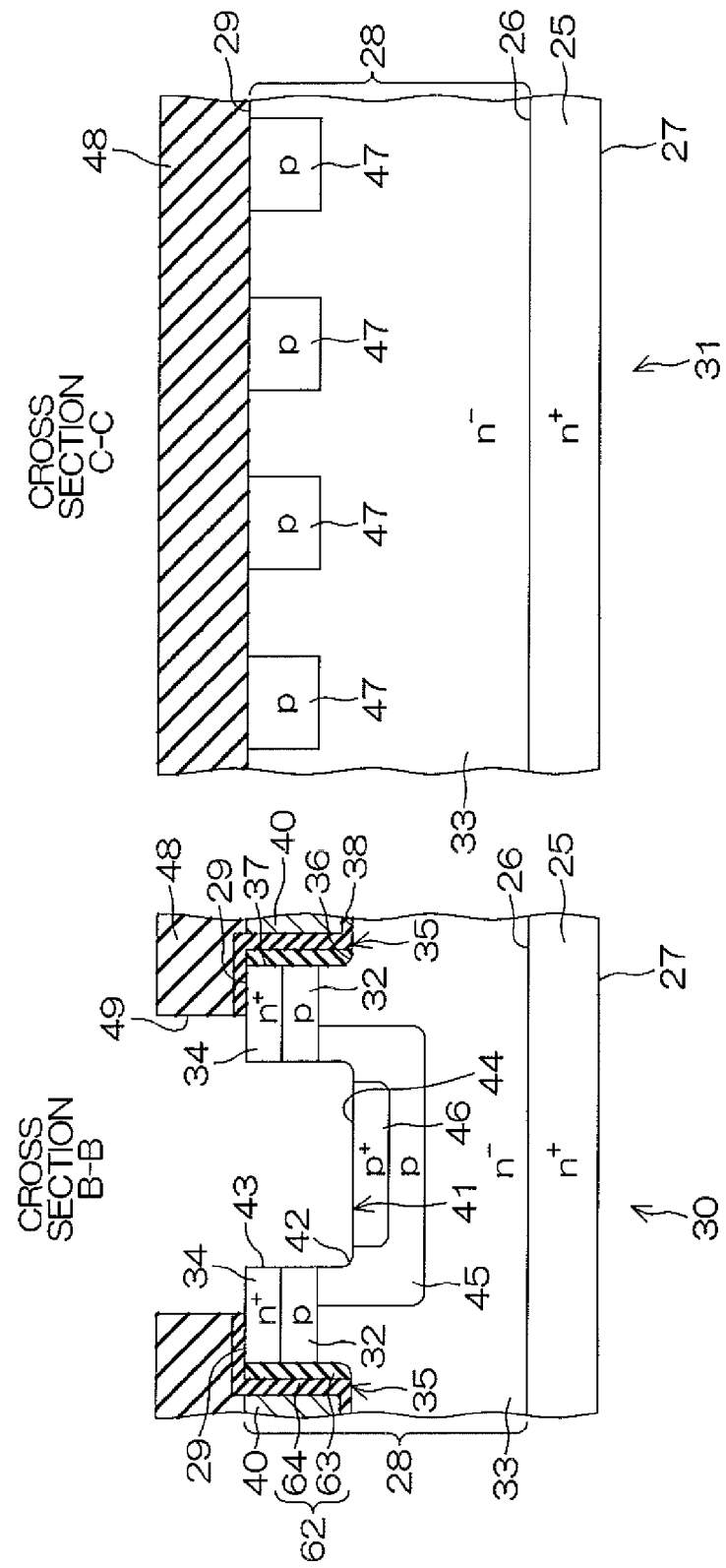
FIG. 10A is schematic sectional views showing a part of steps of producing the trench-gate type MIS transistor of FIG. 9, and each view shows a cutting plane at the same position as in FIG. 9.
FIG. 10B is views showing a step subsequent to that of FIG. 10A.
FIG. 10C is views showing a step subsequent to that of FIG. 10B.
FIG. 10D is views showing a step subsequent to that of FIG. 10C.
FIG. 10F is views showing a step subsequent to that of FIG. 10E.
FIG. 10H is views showing a step subsequent to that of FIG. 10G.
FIG. 10I is views showing a step subsequent to that of FIG. 10H.

Thereafter, as shown in FIG. 10G, only the polysilicon material 52 remaining in the source trench 41 is removed by dry etching. As a result, the gate electrode 40 made of the polysilicon material 52 remaining in the gate trench 35 is formed.

Thereafter, as shown in FIG. 10H, a high-k material is deposited from above the SiC epitaxial layer 28 according to the CVD method. As a result, the interlayer insulation film 48 is formed.

Thereafter, as shown in FIG. 10I, the interlayer insulation film 48 and the gate insulation film 62 continuously undergo patterning by a well-known patterning technique. As a result, the contact hole 49 is formed in the interlayer insulation film 48 and the gate insulation film 62.

Thereafter, the source electrode 50, the drain electrode 51, etc., are formed, and, as a result, the MIS transistor 61 of FIG. 9 is obtained.

The same operational effect as in the MIS transistor 21 of the second preferred embodiment can be fulfilled by the structure of the MIS transistor 61.

Additionally, according to the third preferred embodiment, the gate insulation film 62 has a two-layer structure consisting of the $SiO_2$ film and the high-k film in a part on the side surface 37 of the gate trench 35. Therefore, the insulation film contiguous to the side surface 37 is the $SiO_2$ film 63 even if the high-k film 64 with which the bottom surface 38 and the corner portions 36 of both ends of the gate trench 35 are covered is made of a high-k material (e.g., $HfO_2$, $ZrO_2$, etc., described in the second preferred embodiment) having difficulty in creating a high barrier height with respect to SiC.

Therefore, the breakdown of the gate insulation film 62 in the bottom surface 38 and the corner portions 36 of both ends at which an electric field is liable to concentrate can be reduced while maintaining a relatively high barrier height with respect to the SiC epitaxial layer 28 near the channel (the body region 32).

Additionally, according to the third preferred embodiment, the bottom surface 38 of the gate trench 35 is formed as an Si plane, and therefore a part on the bottom surface (Si plane) 38 of the gate trench 35 in the $SiO_2$ film 63 becomes thinner than a part on the side surface 37 of the gate trench 35 in the $SiO_2$ film 63 when the $SiO_2$ film 63 is formed (FIG. 10C). Therefore, if a gate insulation film is formed by allowing the bottom surface part of the $SiO_2$ film 63 to remain, the possibility that the breakdown of the insulation film will occur will be enhanced in the bottom surface 38 and the corner portions 36 of both ends of the gate trench 35 at which an electric field is relatively liable to concentrate.

Therefore, in the third preferred embodiment, a part on the bottom surface 38 of the gate trench 35 in the $SiO_2$ film 63 is removed (see FIG. 10D), and the high-k film 64 is formed such that a part exposed by the removal of it is covered therewith (see FIG. 10E). As a result, an area at which an electric field is liable to concentrate can be easily covered with the high-k film 64.

Figure 11:
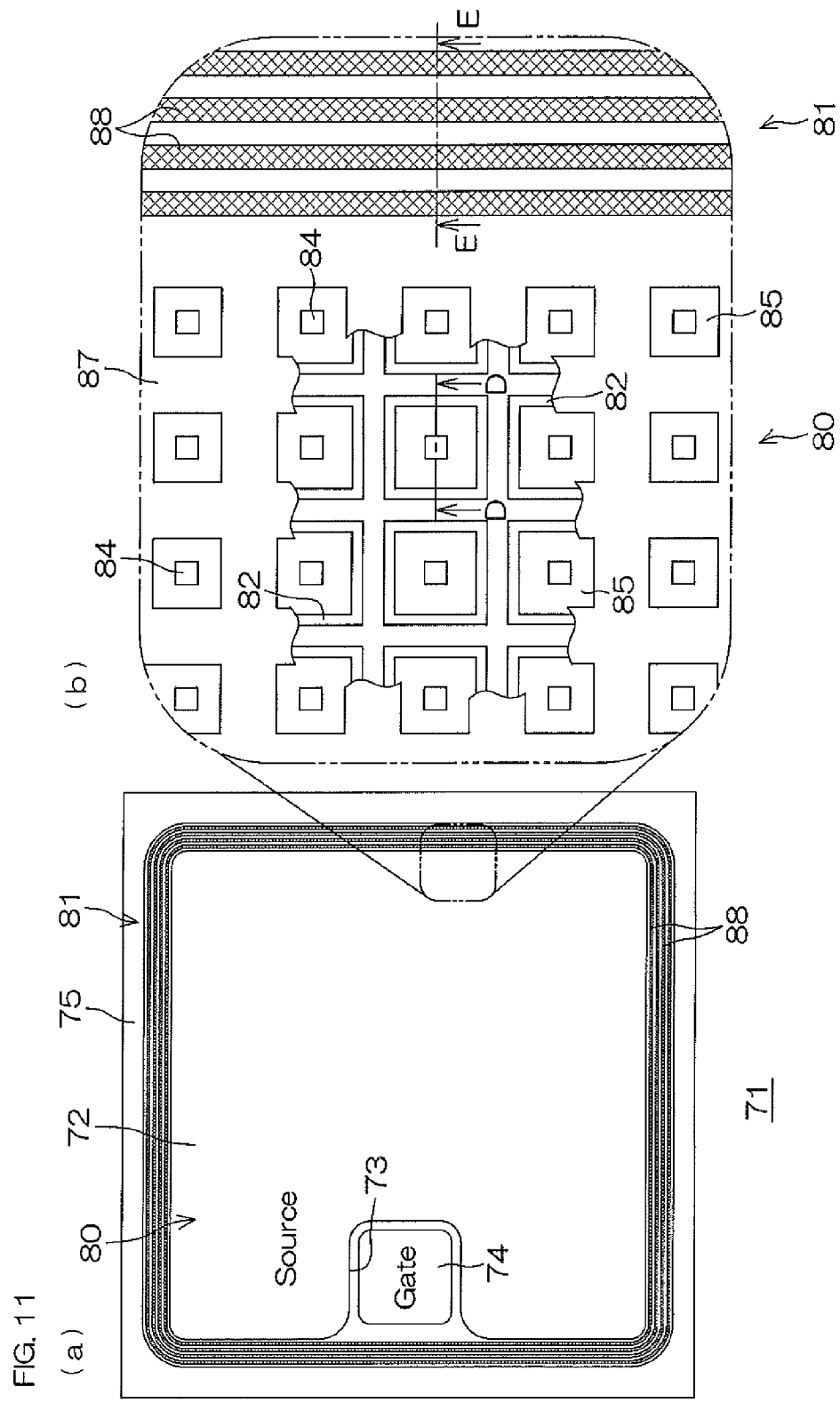
FIG. 11(a) and FIG. 11(b) are schematic plan views of a planar-gate type MIS transistor according to a fourth preferred embodiment of the present invention, FIG. 11(a) being an overall view, FIG. 11(b) being an internal enlarged view.

FIG. 11(a) and FIG. 11(b) are schematic plan views of a planar-gate type MIS transistor according to a fourth preferred embodiment of the present invention, FIG. 11(a) being an overall view, FIG. 11(b) being an internal enlarged view. FIG. 12 is sectional views of the planar-gate type MIS transistor of FIG. 11, showing cutting planes along cutting-plane lines D-D and E-E of FIG. 11(b), respectively.

The MIS transistor 71 is a planar-gate type DMISFET in which SiC is employed, and, as shown in FIG. 11(a), is shaped like, for example, a square chip when viewed planarly. The chip-shaped MIS transistor 71 has a length of several millimeters (mm) in each of up, down, right, and left directions in the sheet of FIG. 11(a).

A source pad 72 is formed on the surface of the MIS transistor 71. The source pad 72 has a substantially square shape when viewed planarly in which its four corners are bent outwardly, and is formed such that substantially all area of the surface of the MIS transistor 71 is covered therewith. In the source pad 72, a removal region 73 is formed near the center of its one side. This removal region 73 is a region in which the source pad 72 is not formed.

A gate pad 74 is disposed in the removal region 73. A gap is made between the gate pad 74 and the source pad 72, which are insulated from each other.

Next, an internal structure of the MIS transistor 71 will be described.

The MIS transistor 71 includes an n$^+$ type SiC substrate 75 (whose concentration is, for example, $1\times10^{18}$ to $1\times10^{21}$ cm$^{-3}$). The SiC substrate 75 functions as a drain of the MIS transistor 71 in the fourth preferred embodiment, and its surface (upper surface) 76 is an Si plane, whereas its reverse surface (lower surface) 77 is a C plane.

An n$^-$ type SiC epitaxial layer 78 (whose concentration is, for example, $1\times10^{15}$ to $1\times10^{17}$ cm$^{-3}$) that has a lower concentration than the SiC substrate 75 is stacked on the surface 76 of the SiC substrate 75. The thickness of the SiC epitaxial layer 78 serving as a breakdown voltage holding layer is, for example, 1 μm to 100 μm. The SiC epitaxial layer 78 is formed on the SiC substrate 75 by means of so-called epitaxial growth. In the SiC epitaxial layer 78 formed on the surface 76 that is an Si plane, the Si plane is grown as a growth principal plane. Therefore, the surface 79 of the SiC epitaxial layer 78 formed by growth is an Si plane in the same way as the surface 76 of the SiC substrate 75.

As shown in FIG. 11(a), an active region 80 that is disposed at the central part of the SiC epitaxial layer 78 when viewed planarly and that functions as the MIS transistor 71 and a transistor-surrounding region 81 that surrounds the active region 80 are formed in the MIS transistor 71.

Many p type body regions 82 (whose concentration is, for example, $1.0\times10^{16}$ cm$^{-3}$ to $1.0\times10^{19}$ cm$^{-3}$) are formed and arranged at a surface layer part of the SiC epitaxial layer 78 in the active region 80 in a matrix manner in row-wise and column-wise directions at constant pitches. Each body region 82 has a square shape when viewed planarly, and has a length of, for example, about 7.2 μm in each of up, down, right, and left directions in the sheet of FIG. 11(b).

On the other hand, the region closer to the SiC substrate 75 than the body region 82 in the SiC epitaxial layer 78 is an n$^-$ type drift region 83 in which a state without being changed after epitaxial growth is maintained.

A p$^+$ type body contact region 84 (whose concentration is, for example, $1.0\times10^{18}$ cm$^{-3}$ to $2.0\times10^{21}$ cm$^{-3}$) is formed at the central part of each body region 82, and an n$^+$ type source region 85 (whose concentration is, for example, $1.0\times10^{18}$ cm$^{-3}$ to $1.0\times10^{21}$ cm$^{-3}$) is formed in such a manner as to surround the body contact region 84. The body contact region 84 has a square shape when viewed planarly, and has a length of, for example, about 1.6 μm in each of up, down, right, and left directions in the sheet of FIG. 11(b).

The source region 85 has a square annular shape when viewed planarly, and has a length of, for example, about 5.7 μm in each of up, down, right, and left directions in the sheet of FIG. 11(b).

In the active region 80, each region between the body regions 82 arranged in a matrix manner at constant pitches (each body-to-body region sandwiched between the side surfaces of the body regions 82 next to each other) is grid-like, and has a predetermined width (for example, 2.8 μm).

A grid-like gate insulation film 86 is formed on the body-to-body regions and along the body-to-body regions. The gate insulation film 86 stretches between the body regions 82 next to each other, and covers a part surrounding the source region 85 in the body region 82 (i.e., a peripheral edge of the body region 82) and an outer peripheral edge of the source region 85. The gate insulation film 86 is made of a high-k material (SiN, Al$_2$O$_3$, AlON, etc.), and has a substantially uniform thickness of about 400 Å.

A gate electrode 87 is formed on the gate insulation film 86. The gate electrode 87 is formed in a grid-like manner along the grid-like gate insulation film 86, and faces the peripheral edge of each body region 82 with the gate insulation film 86 therebetween. The gate electrode 87 is made of polysilicon, and is doped with, for example, highly-concentrated p type impurities. The thickness of the gate electrode 87 is, for example, about 6000 Å.

In the MIS transistor 71, a boundary between unit cells is set at the center in a width direction of the body-to-body region. Each unit cell has a length of about 10 μm in each of up, down, right, and left directions in the sheet of FIG. 11(b). In each unit cell, the depth direction of the body region 82 is a gate length direction, and the circumferential direction of the body region 82 perpendicular to the gate length direction is a gate width direction.

In the transistor-surrounding region 81, a plurality of p type guard rings 88 (four in the fourth preferred embodiment) are formed at the surface layer part of the SiC epitaxial layer 78 apart from the active region 80 in such a way as to surround the unit cells (the active region 80) arranged in a matrix manner. These guard rings 88 can be formed through the same ion implantation step as the step of forming the p type body region 82.

Each guard ring 88 is formed to have a planarly-viewed quadrangular annular shape along the outer periphery of the MIS transistor 71 when viewed planarly. The depth of the guard ring 88 from the surface 79 of the SiC epitaxial layer 78 is substantially the same as that of the body region 82, and is, for example, 2000 Å or more, and is, preferably, 3000 Å to 10000 Å.

An interlayer insulation film 89 is stacked on the SiC epitaxial layer 78 such that the gate electrode 87 is covered therewith. The interlayer insulation film 89 is made of a high-k material (e.g., SiN, Al$_2$O$_3$, or AlON).

A contact hole 90 by which the source region 85 and the body contact region 84 are exposed is formed in the interlayer insulation film 89 and the gate insulation film 86.

A source electrode 91 serving as a first electrode is formed on the interlayer insulation film 89. The source electrode 91 is in contact with the body contact regions 84 and the source regions 85 of all unit cells through each contact hole 90 in the lump. In other words, the source electrode 91 serves as a wire shared among all unit cells.

An interlayer insulation film (not shown) is formed on the source electrode 91, and the source electrode 91 is electrically connected to the source pad 72 (see FIG. 11(a)) through this interlayer insulation film (not shown). On the other hand, the gate pad 74 (see FIG. 11(a)) is electrically connected to the gate electrode 87 through a gate wire (not shown) laid on this interlayer insulation film (not shown).

The source electrode 91 has a structure in which, for example, a Ti/TiN layer and an Al layer are stacked in order from the contact side with the SiC epitaxial layer 78.

A drain electrode 92 serving as a second electrode is formed on the reverse surface 77 of the SiC substrate 75 such that the whole area of the reverse surface 77 is covered therewith. This drain electrode 92 is an electrode shared among all unit cells. A laminated structure (Ti/Ni/Au/Ag) in which, for example, Ti, Ni, Au, and Ag are stacked in order from the side of the SiC substrate 75 can be employed as the drain electrode 92.

In the MIS transistor 71, a voltage greater than a threshold voltage is applied to the gate electrode 87 in a state in which a predetermined potential difference has been generated between the source electrode 91 and the drain electrode 92 (at a source-drain interval). As a result, an annular channel is formed at the peripheral edge of the body region 82 of each unit cell. Thus, electrons (carriers) move from the source electrode 91 to the drain electrode 92 through the source region 85, the channel, and the drift region 83 in the active region 80, and an electric current flows.

FIG. 13A to FIG. 13D are schematic sectional views showing a part of steps of producing the planar-gate type MIS transistor of FIG. 12, and each view shows a cutting plane at the same position as in FIG. 12.

Figure 13A:
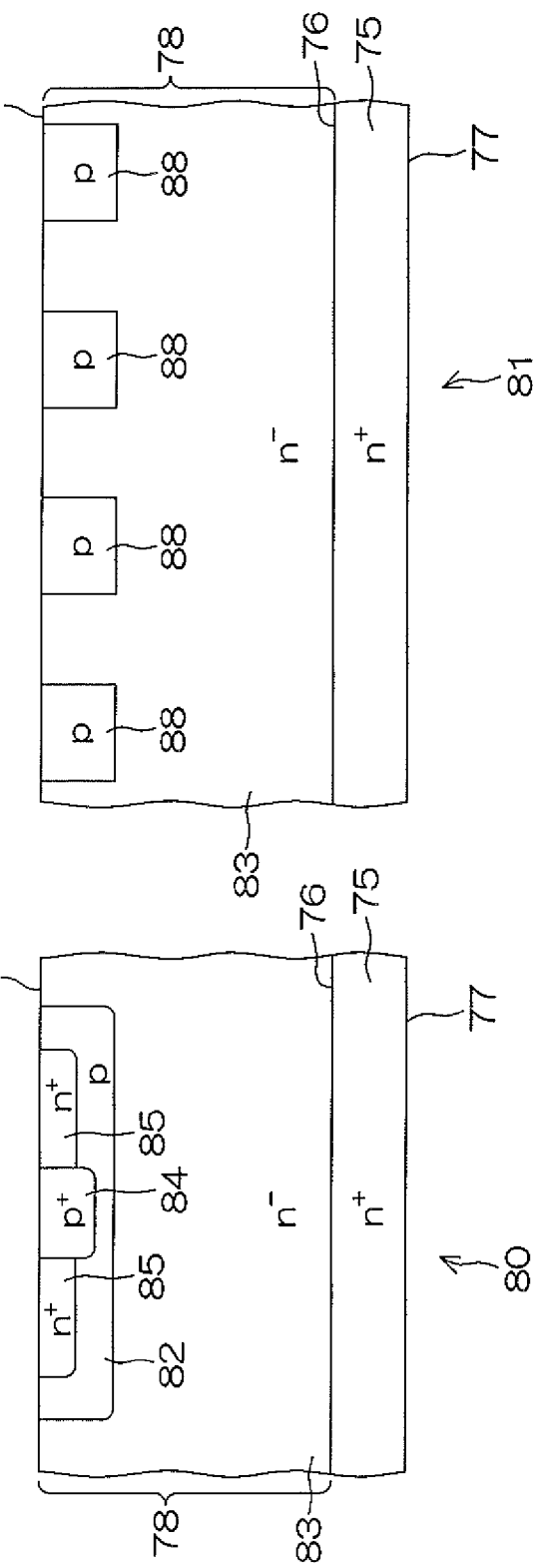
FIG. 13A is schematic sectional views showing a part of steps of producing the planar-gate type MIS transistor of FIG. 12, and each view shows a cutting plane at the same position as in FIG. 12.

To produce the MIS transistor 71, SiC crystals are grown on the surface (Si plane) 76 of the SiC substrate 75 while being doped with n type impurities (for example, N (nitrogen), P (phosphorus), As (arsenic), etc.) according to an epitaxial growth method, such as the CVD method, the LPE method, or the MBE method, as shown in FIG. 13A. As a result, an n⁻ type SiC epitaxial layer 78 is formed on the SiC substrate 75.

Thereafter, p type impurities (for example, Al (aluminum), B (boron), etc.) are implanted into the SiC epitaxial layer 78 from the surface 79 of the SiC epitaxial layer 78.

Thereafter, n type impurities are implanted into the SiC epitaxial layer 78 from the surface 79 of the SiC epitaxial layer 78.

Thereafter, p type impurities are implanted into the SiC epitaxial layer 78 from the surface 79 of the SiC epitaxial layer 78.

Thereafter, the SiC epitaxial layer 78 is heat-treated at, for example, 1400° C. to 2000° C. As a result, ions of the p type and n type impurities implanted into the surface layer part of the SiC epitaxial layer 78 are activated, and, in accordance with impurity-implanted areas, the body region 82, the body contact region 84, the source region 85, and the guard ring 88 are simultaneously formed. The drift region 83 maintaining a state without being changed after epitaxial growth is formed at a base layer part of the SiC epitaxial layer 78.

Figure 13B:
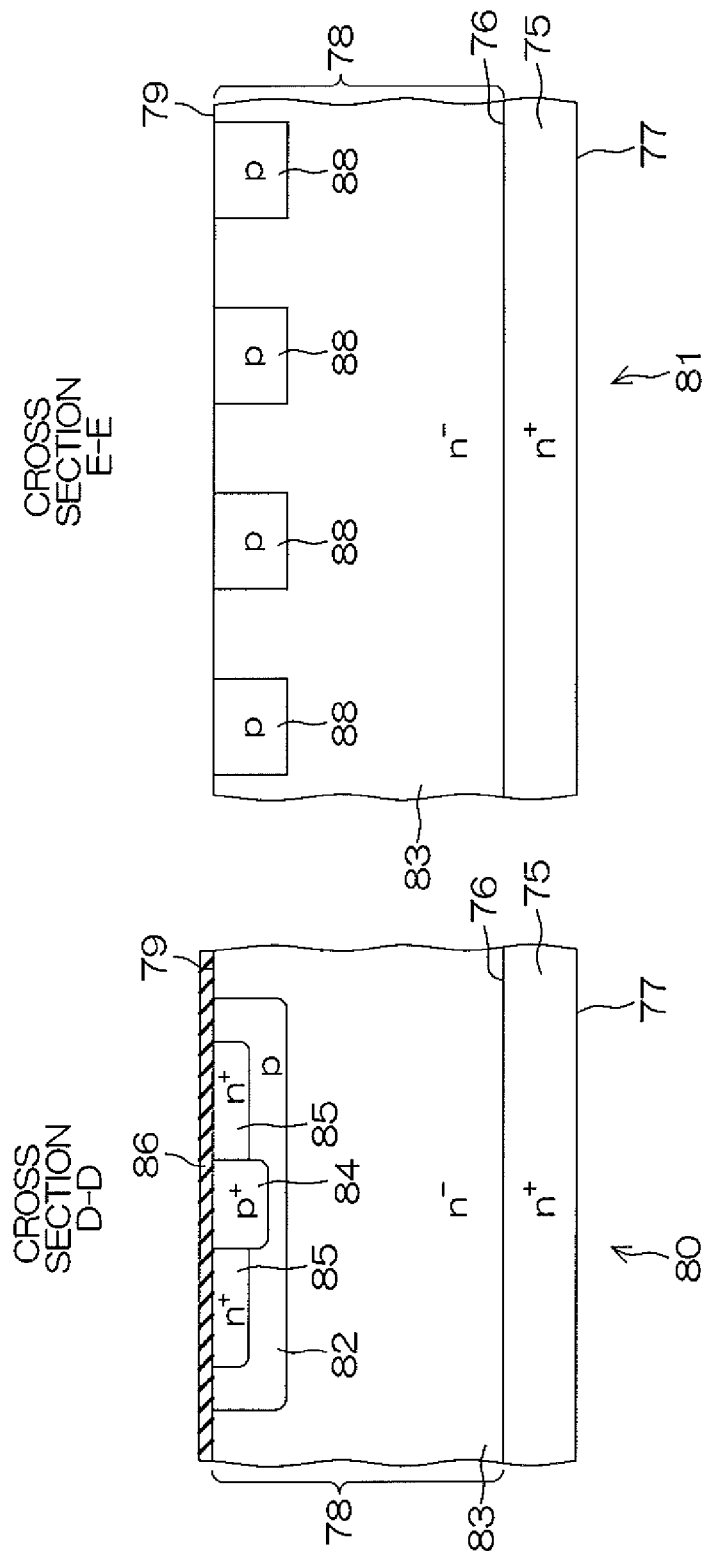
FIG. 13B is views showing a step subsequent to that of FIG. 13A.

Thereafter, as shown in FIG. 13B, a high-k material is deposited from above the SiC epitaxial layer 78 according to the CVD method. Thereafter, this high-k material undergoes patterning by a well-known patterning technique. As a result, the gate insulation film 86 is formed.

Thereafter, as shown in FIG. 13C, a doped polysilicon material is deposited from above the SiC epitaxial layer 78 according to the CVD method. Thereafter, this polysilicon material undergoes patterning by the well-known patterning technique. As a result, the gate electrode 87 is formed.

Figure 13D:
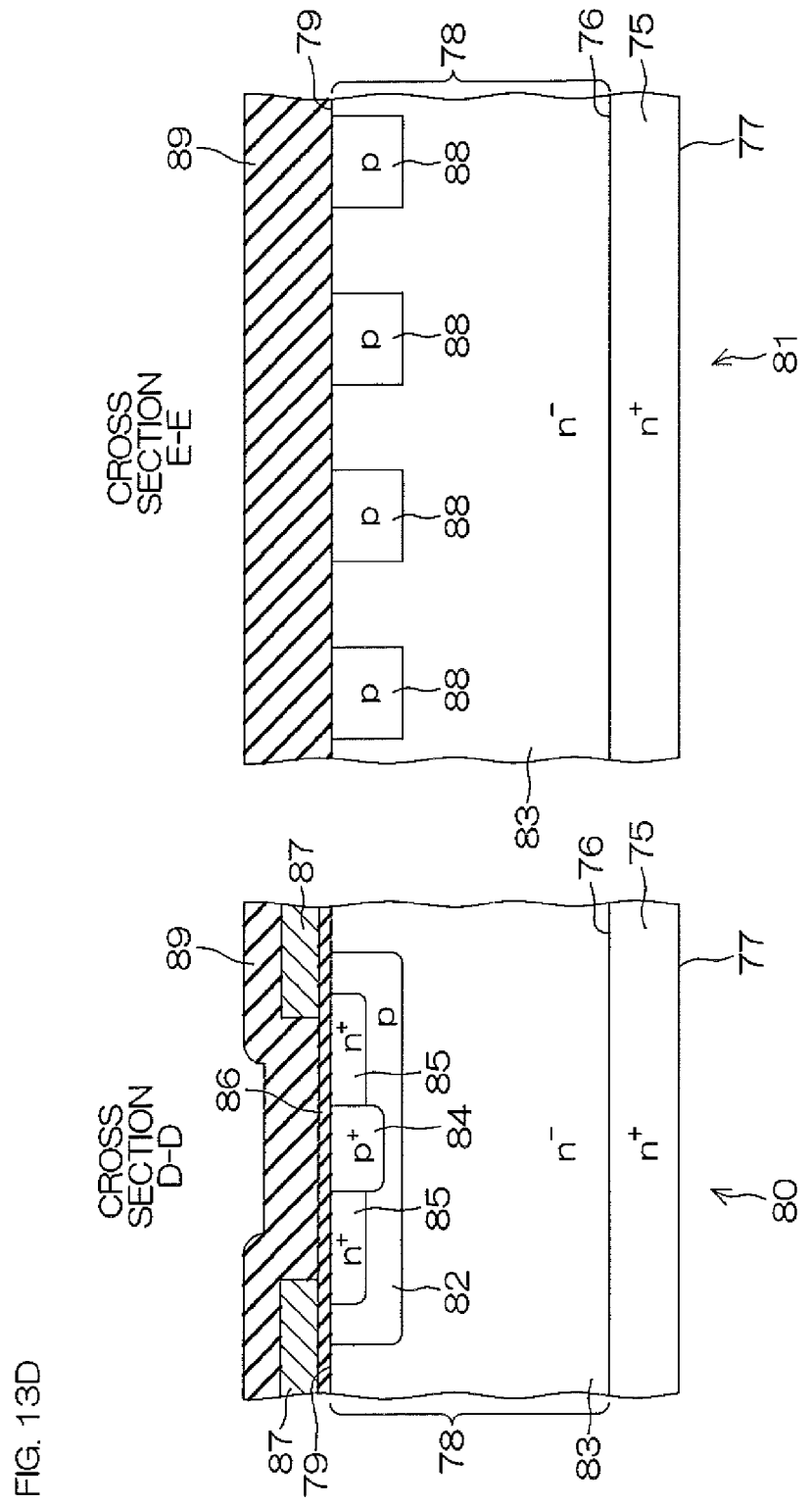
FIG. 13D is views showing a step subsequent to that of FIG. 13C.

Thereafter, as shown in FIG. 13D, a high-k material is deposited from above the SiC epitaxial layer 78 according to the CVD method. As a result, the interlayer insulation film 89 is formed.

Thereafter, the interlayer insulation film 89 and the gate insulation film 86 continuously undergo patterning, and hence the contact hole 90 is formed, and the source electrode 91, the drain electrode 92, etc., are formed, and, as a result, the MIS transistor 71 of FIG. 12 is obtained.

As described above, according to the fourth preferred embodiment, the gate insulation film 86 and the interlayer insulation film 89 that are contiguous to the SiC epitaxial layer 78 are made of a high-k material (e.g., SiN, $Al_2O_3$, or AlON). Therefore, as is proven by a comparison between Formulas (1) and (2) in the first preferred embodiment, an electric field $E_{High-k}$ to be applied to the gate insulation film 86 and the interlayer insulation film 89 can be weakened even if a great reverse voltage is applied between the source electrodes 91 and the drain electrode 92 so that an avalanche breakdown occurs. As a result, the breakdown of the gate insulation film 86 and the breakdown of the interlayer insulation film 89 can be reduced. Therefore, a MIS transistor having high avalanche resistance can be provided.

Particularly in a planar-gate type structure, such as that of the MIS transistor 71 of the fourth preferred embodiment, an electric field is liable to concentrate at the transistor-surrounding region 81 that surrounds the active region 80.

Therefore, if the whole of the interlayer insulation film 89 is made of a high-k material as in the fourth preferred embodiment, the interlayer insulation film 89 made of the high-k material can also be brought into contact with the transistor-surrounding region 81 of the SiC epitaxial layer 78. Therefore, the breakdown of the interlayer insulation film 89 can be effectively reduced.

FIG. 14(a) and FIG. 14(b) are schematic plan views of a trench-gate type MIS transistor 101 according to a fifth preferred embodiment of the present invention, FIG. 14(a) being an overall view, FIG. 14(b) being an internal enlarged view. FIG. 15 is sectional views of the trench-gate type MIS transistor of FIGS. 14(a) and 14(b), showing cutting planes along cutting-plane lines F-F, G-G, and H-H of FIG. 14(b), respectively.

The MIS transistor 101 is a trench-gate type DMISFET (Double diffused Metal Insulator Semiconductor Field Effect Transistor) in which SiC is employed, and, as shown in FIG. 14(a), is shaped like, for example, a square chip when viewed planarly. The chip-shaped MIS transistor 101 has a length of several millimeters (mm) in each of up, down, right, and left directions in the sheet of FIG. 14(a).

A source pad 102 is formed on the surface of the MIS transistor 101. The source pad 102 has a substantially square shape when viewed planarly in which its four corners are bent outwardly, and is formed such that substantially all area of the surface of the MIS transistor 101 is covered therewith. In the source pad 102, a removal region 103 is formed near the center of its one side. This removal region 103 is a region in which the source pad 102 is not formed.

A gate pad 104 is disposed in the removal region 103. A gap is made between the gate pad 104 and the source pad 102, which are insulated from each other.

Next, an internal structure of the MIS transistor 101 will be described.

The MIS transistor 101 includes an n⁺ type SiC substrate 105 (whose concentration is, for example, $1 \times 10^{18}$ to $1 \times 10^{21}$ cm⁻³). The SiC substrate 105 functions as a drain of the MIS transistor 101 in the fifth preferred embodiment, and its surface (upper surface) 106 is an Si plane, whereas its reverse surface (lower surface) 107 is a C plane.

An n⁻ type SiC epitaxial layer 108 (whose concentration is, for example, $1\times10^{15}$ to $1\times10^{17}$ cm$^{-3}$) that has a lower concentration than the SiC substrate 105 is stacked on the surface 106 of the SiC substrate 105. The thickness of the SiC epitaxial layer 108 serving as a semiconductor layer is, for example, 1 μm to 100 μm. The SiC epitaxial layer 108 is formed on the SiC substrate 105 by means of so-called epitaxial growth. In the SiC epitaxial layer 108 formed on the surface that is an Si plane, the Si plane is grown as a growth principal plane. Therefore, the surface 109 of the SiC epitaxial layer 108 formed by growth is an Si plane in the same way as the surface 106 of the SiC substrate 105.

As shown in FIG. 14(*a*), an active region 110 that is disposed at the central part of the SiC epitaxial layer 108 when viewed planarly and that functions as the MIS transistor 101 and a transistor-surrounding region 111 that surrounds the active region 110 are formed in the MIS transistor 101.

In the active region 110, a gate trench 112 is formed in the SiC epitaxial layer 108 in a grid-like manner (see FIG. 14(*b*)). The SiC epitaxial layer 108 is partitioned by the gate trench 112 into a plurality of cells 113 each of which has a quadrangular shape (a square shape).

The cells 113 include a Schottky cell 114 and a pn diode cell 115 that is relatively smaller in plane area than the Schottky cell 114. For example, the Schottky cell 114 has an area equivalent to that of four pn diode cells 115, and the length of one side of the Schottky cell 114 is equivalent to twice the length of one side of the pn diode cell 115. More specifically, the pn diode cell 115 dimensionally has a length of about 6 μm in each of up, down, right, and left directions in the sheet of FIG. 14(*b*), whereas the Schottky cell 114 dimensionally has a length of about 12 μm in each direction.

One cell group consists of one Schottky cell 114 and a plurality of pn diode cells 115 (twelve pn diode cells 115 in this preferred embodiment) encircling the one Schottky cell 114, and the cell groups are arranged in a matrix manner. The pn diode cells 115 are shared between the adjoining cell groups. In other words, the pn diode cells 115 encircling the Schottky cell 114 of a certain cell group are used also as the pn diode cells 115 encircling the Schottky cell 114 of one cell group next to the certain cell group.

The SiC epitaxial layer 108 has, in order from its surface side (109) to its reverse surface side (116), an n⁺ type source region 117 (whose concentration is, for example, $1\times10^{18}$ to $1\times10^{21}$ cm$^{-3}$), a p type body region 118 (whose concentration is, for example, $1.0\times10^{16}$ cm$^{-3}$ to $1.0\times10^{19}$ cm$^{-3}$), and a drift region 119 that are elements shared between the Schottky cell 114 and the pn diode cell 115.

The drift region 119 is an n⁻ type region maintaining a state without being changed after epitaxial growth, and is connected integrally at the bottom portions of all cells 113, and is shared thereamong. In other words, the gate trench 112 exposes the source region 117 and the body region 118 to the side surface 124, and partitions each cell 113 so that its deepest part is positioned at a halfway part of the drift region 119.

The thus formed gate trench 112 includes a linear portion 120 that extends linearly in the row-wise direction and in the column-wise direction along four side surfaces of each cell 113 through each space between the adjoining cells 113 and an intersection portion 121 at which the linear portion 120 extending in the row-wise direction and the linear portion 120 extending in the column-wise direction intersect.

A gate insulation film 122 made of a high-k material (SiN, Al$_2$O$_3$, AlON, etc.) is formed on the inner surface of the gate trench 112 such that its whole area is covered therewith. The gate insulation film 122 has its part on a bottom surface 123 of the gate trench 112 thicker than its part on a side surface 124 of the gate trench 112.

The inside of the gate insulation film 122 in the gate trench 112 is completely filled with polysilicon, and, as a result, the gate electrode 125 is buried in the gate trench 112. A structure of the vertical MIS transistor 101 (first and second MIS transistor structures) is thus created in which the source region 117 and the drift region 119 are disposed apart from each other with the body region 118 therebetween in the vertical direction perpendicular to the surface 109 of the SiC epitaxial layer 108 in each Schottky cell 114 and each pn diode cell 115.

An HD source trench 126 that serves as a second source trench square-shaped when viewed planarly and that reaches the drift region 119 from the surface 109 of the SiC epitaxial layer 108 through the source region 117 and the body region 118 is formed in the central part of the Schottky cell 114 (see a G-G cross section and an H-H cross section of FIGS. 14(*b*) and 15). The depth of the HD source trench 126 is the same as that of the gate trench 112.

A p type HD breakdown voltage holding region (a second breakdown voltage holding region) 127 (whose concentration is, for example, $1\times10^{17}$ to $9\times10^{19}$ cm$^{-3}$) is formed at the HD source trench 126. The HD breakdown voltage holding region 127 is formed by allowing the side surface 129 and the bottom surface 128 of the HD source trench 126 to intersect with each other, and has an annular shape so as to reach an annular edge part 130 surrounding the periphery of the bottom surface 128 and so as to reach the body region 118 exposed to the side surface 129 of the HD source trench 126 from the edge part 130. As a result, a Schottky region 131 that is made of a part of the drift region 119 and that is square-shaped when viewed planarly is formed at the central part of the bottom surface 128 of the HD source trench 126 surrounded by the HD breakdown voltage holding region 127.

The Schottky region 131 is formed with an area in which a depletion layer generated from a pn junction portion (a body diode 132) between the Schottky region 131 and the HD breakdown voltage holding region 127 is not connected to another, and the length $L_1$ of its one side is, for example, 4 μm or more.

On the other hand, a Di source trench 133 that serves as a first source trench square-shaped when viewed planarly and that reaches the drift region 119 from the surface 109 of the SiC epitaxial layer 108 through the source region 117 and the body region 118 is formed in the central part of the pn diode cell 115 (see the F-F cross section and the H-H cross section of FIGS. 14(*b*) and 15). The depth of the Di source trench 133 is the same as that of the gate trench 112. The area of the Di source trench 133 is smaller than that of the Schottky region 131, and the length $L_2$ of its one side is about 3 μm.

A p type Di breakdown voltage holding region 134 (a first breakdown voltage holding region) 134 (whose concentration is, for example, $1\times10^{17}$ to $9\times10^{19}$ cm$^{-3}$) is formed at the Di source trench 133. The Di breakdown voltage holding region 134 is formed on the whole of a bottom surface 135 of the Di source trench 133 and is formed by allowing the bottom surface 135 and a side surface 136 to intersect with each other, and has a vessel shape so as to reach an annular edge part 137 surrounding the periphery of the bottom surface 135 and the body region 118 exposed to the side surface 136 of the Di source trench 133 from the edge part 137.

Additionally, a p+ type bottom body contact region 138 (whose concentration is, for example, $1.0 \times 10^{18}$ cm$^{-3}$ to $2.0 \times 10^{21}$ cm$^{-3}$) is formed at a surface layer part of the Di breakdown voltage holding region 134 in the central part of the bottom surface 135 in the Di source trench 133. An electrode is brought into ohmic contact with the bottom body contact region 138, and, as a result, a contact can be made with the body region 118 of the pn diode cell 115 through the Di breakdown voltage holding region 134 (i.e., an electrical contact can be made).

The Di breakdown voltage holding region 134 is formed at the Di source trench 133, and therefore the pn diode cell 115 contains a body diode 139 that is arranged by the pn junction between the Di breakdown voltage holding region 134 and the drift region 119 and that includes the bottom body contact region 138 serving as an anode-side contact and the SiC substrate 105 serving as a cathode-side contact.

A G breakdown voltage holding region (relay region) 140 is formed at each intersection portion 121 of the gate trench 112 that makes partition into the cells 113.

The G breakdown voltage holding region 140 is formed on the whole of the bottom surface 123 of the gate trench 112 in the intersection portion 121, and is formed to lead from the bottom surface 123 to a corner edge 141 of the gate trench 112 formed at the lower part of each corner portion of each cell 113 facing the intersection portion 121 and to the body region 118 directly above the corner edge 141.

In other words, the G breakdown voltage holding region 140 is formed in a square shape slightly larger than the intersection portion 121 of the gate trench 112 when viewed planarly, and each corner thereof enters each corner portion of each cell 113 facing the intersection portion 121. The concentration of the G breakdown voltage holding region 140 is higher than that of the body region 118, and is higher than that of the drift region 119, and is, for example, $1 \times 10^{17}$ to $9 \times 10^{19}$ cm$^{-3}$.

The relay of the G breakdown voltage holding region 140 makes it possible to make a contact with the HD breakdown voltage holding region 127 of the Schottky cell 114 through the bottom body contact region 138→the Di breakdown voltage holding region 134→the body region 118 of the pn diode cell 115→the G breakdown voltage holding region 140→the body region 118 of the Schottky cell 114 as shown by the solid arrow of the H-H cross section of FIG. 15.

In the transistor-surrounding region 111, a plurality of p type guard rings 142 (four in the fifth preferred embodiment) are formed at the surface layer part of the SiC epitaxial layer 108 apart from the active region 110 in such a way as to surround the active region 110. These guard rings 142 can be formed through the same ion implantation step as the step of forming the p type body region 118. Each guard ring 142 is formed to have a planarly-viewed quadrangular annular shape along the outer periphery of the MIS transistor 101 when viewed planarly.

An interlayer insulation film 143 made of a high-k material (SiN, Al$_2$O$_3$, AlON, etc.) is stacked on the SiC epitaxial layer 108 such that the gate electrode 125 is covered therewith.

Contact holes 144 and 145 larger in diameter than the HD source trench 126 and the Di source trench 133 are formed in the interlayer insulation film 143 and the gate insulation film 122.

A source electrode 146 is formed on the interlayer insulation film 143. The source electrode 146 enters all the HD source trenches 126 and the Di source trenches 133 through the contact holes 144 and 145 in the lump.

In the Schottky cell 114, the source electrode 146 is in contact with the Schottky region 131, the HD breakdown voltage holding region 127, and the source region 117 in order from the bottom side of the HD source trench 126. Additionally, in the pn diode cell 115, this is in contact with the bottom body contact region 138, the Di breakdown voltage holding region 134, and the source region 117 in order from the bottom side of the Di source trench 133. In other words, the source electrode 146 serves as a wire shared among all the cells 113.

The interlayer insulation film 143 (not shown) is formed on the source electrode 146, and the source electrode 146 is electrically connected to the source pad 102 (see FIG. 14($a$)) through this interlayer insulation film 143 (not shown). On the other hand, the gate pad 104 (see FIG. 14($a$)) is electrically connected to the gate electrode 125 through a gate wire (not shown) laid on the interlayer insulation film 143 (not shown).

The source electrode 146 has a polysilicon layer 147 serving as a barrier forming layer, an intermediate layer 148, and a metal layer 149 in order from the contact side with the SiC epitaxial layer 108.

The polysilicon layer 147 is a doped layer formed by use of doped polysilicon that has been doped with impurities, and is a highly-concentrated doped layer that has been doped with highly-concentrated impurities of, for example, $1 \times 10^{15}$ cm$^{-3}$ or more and, preferably, $1 \times 10^{19}$ to $1 \times 10^{21}$ cm$^{-3}$. N type impurities, such as N (nitrogen), P (phosphorus), and As (arsenic), or p type impurities, such as Al (aluminum) and B (boron), can be used as impurities when the polysilicon layer 147 is formed to be a doped layer (including a highly-concentrated doped layer). The thickness of the polysilicon layer 147 is, for example, 5000 Å to 10000 Å.

In the fifth preferred embodiment, the polysilicon layer 147 is formed in such a way as to cover the whole area of the surface of the cell 113 exposed in the contact holes 144 and 145, and is in contact with all of the Schottky region 131, the HD breakdown voltage holding region 127, and the source region 117 in the HD source trench 126 and in contact with all of the bottom body contact region 138, the Di breakdown voltage holding region 134, and the source region 117 in the Di source trench 133.

In the Schottky cell 114, the polysilicon layer 147 makes a Schottky junction with the source region 117. As a result, the polysilicon layer 147 forms a heterojunction (for example, the height of a junction barrier is 1 eV to 1.5 eV) having a smaller junction barrier than diffusion potential (for example, 2.8 eV to 3.2 eV) of a body diode 150 contained in the Schottky cell 114 and in the pn diode cell 115 (i.e., a diode formed by a pn junction between the body region 118 and the drift region 119) between the Schottky region 131 and the polysilicon layer 147. As a result, in the Schottky cell 114, a heterojunction diode (HD) 151 is formed between the source electrode 146 and the Schottky region 131.

Additionally, the polysilicon layer 147 makes an ohmic contact between the bottom body contact region 138 and the source region 117 in the pn diode cell 115.

The intermediate layer 148 is the metal layer 149 stacked on the polysilicon layer 147, and consists of a single layer that contains Ti (titanium) or consists of multiple layers that contain Ti. The layer containing Ti can be made by use of, for example, Ti or TiN (titanium nitride). The thickness of the intermediate layer 148 is, for example, 200 nm to 500 nm.

The metal layer 149 is stacked on the intermediate layer 148, and can be made of, for example, Al (aluminum), Au (gold), Ag (silver), Cu (copper), Mo (molybdenum), an alloy of these metals, or a metal material containing these metals. The metal layer 149 is used as a topmost layer of the source electrode 146. The thickness of the metal layer 149 is, for example, 1 μm to 5 μm.

In the fifth preferred embodiment, the polysilicon layer 147, the intermediate layer 148, and the metal layer 149 mentioned above are combined together so as to have a laminated structure (polysilicon/Ti/TiN/Al) in which polysilicon (polysilicon layer 147), Ti (intermediate layer 148), TiN (intermediate layer 148), and Al (metal layer 149) are stacked in this order. Preferably, the metal layer 149 has an Mo layer in addition thereto. Mo has a high melting point, and therefore, if the Mo layer is contained in the metal layer 149, the metal layer 149 can be restrained from being melted by heat generated when a high current flows through the source electrode 146.

A drain electrode 152 is formed on the reverse surface 107 of the SiC substrate 105 such that the whole area of the reverse surface 107 is covered therewith. This drain electrode 152 is an electrode shared among all the cells 113. A laminated structure (Ti/Ni/Au/Ag) in which, for example, Ti, Ni, Au, and Ag are stacked in order from the side of the SiC substrate 105 can be employed as the drain electrode 152.

This MIS transistor 101 is used as, for example, a switching device for a driving circuit (inverter circuit) of an electric motor (one example of an inductive load). In this case, switching between turn-on and turn-off of an electric current that is applied to the electric motor is performed by turn-on and turn-off of a predetermined voltage (voltage greater than a gate threshold voltage) applied onto the gate pad 104 in a state in which a drain voltage by which the drain side becomes positive is applied between the source pad 102 (source electrode 146) and the drain electrode 152 (i.e., is applied to the source-drain interval).

When an electric current flowing through the electric motor is interrupted (i.e., when a gate voltage is turned off), a counter electromotive force is generated in a motor coil of the electric motor. There is a case in which a voltage by which the source side becomes positive is applied to the source-drain interval because of this counter electromotive force.

In this case, if an electric current flows to the motor coil in the form of, for example, a return current by the rectifying operation of the body diode 150, the following defects will be produced.

In detail, there is a case in which, when holes move from the p type body region 118 that is a component of the body diode 150 to the n type drift region 119 so that an electric current flows, many carriers, i.e., many electrons and holes that have moved from the p type body region 118 recombine together near the gate trench 112 (for example, beside the gate trench 112) in the n type drift region 119. Therefore, there is a fear that the crystal defect of SiC of the SiC epitaxial layer 108 will expand in a direction parallel to the layered direction of the SiC epitaxial layer 108 because of energy generated by their recombination, and will reach the route (for example, channel) of a drain current during an ON state. If so, there is a fear that on-resistance will rise when the MIS transistor 101 forms a channel near the side surface 124 of the gate trench 112 in the body region 118 and performs a switching operation.

Therefore, in the MIS transistor 101, the polysilicon layer 147 makes a heterojunction with respect to the drift region 119 (Schottky region 131), and the heterojunction diode 151 is contained. Therefore, an electric current preferentially flows to the heterojunction diode 151, and an electric current flowing to the body diode 150 can be reduced or eliminated. Thus, the electric current that has flowed through the MIS transistor 101 can be allowed to flow to the electric motor in the form of, for example, a return current.

Thus, during an OFF state, an electric current flows to the heterojunction diode 151 formed in the HD source trench 126 at the center of the Schottky cell 114, and therefore carriers hardly move near the gate trench 112 (i.e., between the p type body region 118 and the n type drift region 119). Therefore, holes and electrons can be prevented from recombining together in the drift region 119. As a result, the crystal defect of SiC can be restrained from expanding in the SiC epitaxial layer 108, and therefore the on-resistance of the transistor can be restrained from rising. Additionally, an electric current flowing to the body diode 150 can be reduced or eliminated, and therefore the loss can be reduced when the MIS transistor 101 operates.

Moreover, in the MIS transistor 101, the length $L_1$ of one side of the Schottky region 131 that is a component of the heterojunction diode 151 is set so that a depletion layer generated from the body diode 132 is not connected to another. Therefore, when the heterojunction diode 151 operates, its current path can be prevented from being blocked by the depletion layer. As a result, the on-resistance of the heterojunction diode 151 can be lowered.

In an OFF state (i.e., when the gate voltage is 0V), an electric field is applied to the gate insulation film 122 interposed between the gate electrode 125 and the SiC epitaxial layer 108.

This electric field is generated resulting from a potential difference between the gate electrode 125 and the SiC epitaxial layer 108. In the bottom surface 123 of the gate trench 112, equipotential surfaces having extremely high electric potential are distributed on the assumption that the gate electrode 125 is a reference (0V), and the interval between the equipotential surfaces is small, and therefore an extremely large electric field is generated. For example, when the drain voltage is 900V, an equipotential surface of 900V is distributed near the reverse surface 107 of the SiC substrate 105 contiguous to the drain electrode 152, and a voltage drop occurs correspondingly to an approach from the reverse surface 107 of the SiC substrate 105 toward the surface 109 of the SiC epitaxial layer 108, and an equipotential surface of about several tens of volts is distributed near the bottom surface 123 of the gate trench 112. Therefore, an extremely large electric field toward the gate electrode 125 is generated in the bottom surface 123 of the gate trench 112. Specifically in a case in which the gate trench 112 is formed in a grid-like manner and in which the quadrangular-prism-shaped cells 113 are arranged at a window part of the grid-like gate trench 112 in the same way as in the MIS transistor 101, the insulation breakdown of the gate insulation film 122 is particularly liable to occur near the corner edge 141 of the gate trench 112 formed in each corner portion of the cell 113.

Therefore, in the MIS transistor 101, the G breakdown voltage holding region 140 is formed at the corner edge 141 of the gate trench 112. Accordingly, a body diode 155 can be formed near the corner edge 141 of the gate trench 112 by means of a pn junction between the G breakdown voltage holding region 140 and the drift region 119. Additionally, in the MIS transistor 101, the HD breakdown voltage holding region 127 is formed at the edge part 130 of the HD source trench 126 of the Schottky cell 114, and the Di breakdown voltage holding region 134 is formed at the edge part 137 and the bottom surface 135 of the Di source trench 133 of the pn diode cell 115. Therefore, the annular body diode 132 surrounding the edge part 130 of the HD source trench 126 can be formed by the pn junction between the HD breakdown voltage holding region 127 and the drift region 119 and the pn junction between the Di breakdown voltage holding region 134 and the drift region 119. Additionally, the vessel-shaped body diode 139 with which the bottom portion of the Di source trench 133 is covered can be formed.

The presence of the depletion layer generated in these body diodes 132 and 139 can prevent an equipotential surface from entering between the gate trench 112 and the HD source trench 126 and between the gate trench 112 and the Di source trench 133, and can distance it from the gate insulation film 122. As a result, equipotential surfaces can be prevented from densely gathering near the corner edge 141 of the gate trench 112. As a result, an electric field to be applied to the gate insulation film 122 can be reduced, and hence the insulation breakdown can be prevented.

Additionally, in the MIS transistor 101, a channel is not formed at the corner portion of the cell 113 or, alternatively, an electric current flowing through the channel is slight even if a channel is formed there although the G breakdown voltage holding region 140 is formed to reach the body region 118 directly above the corner edge 141. Therefore, the effect of preventing the breakdown of the gate insulation film 122 can be made even higher almost without affecting device performance by forming the G breakdown voltage holding region 140 so as to reach a part directly above the corner edge 141 in the body region 118.

FIG. 16 is schematic sectional views of a trench-gate type MIS transistor 161 according to a sixth preferred embodiment of the present invention, and each view shows a cutting plane at the same position as in FIG. 15. In FIG. 16, the same reference sign as in FIG. 15 is given to each component equivalent to that of FIG. 15, and a description of each component having the same reference sign will be omitted.

The HD source trench 162 of the MIS transistor 161 according to the sixth preferred embodiment includes an HD upper trench (second upper trench) 163 having a depth from the surface 109 of the SiC epitaxial layer 108 to the body region 118 and an HD lower trench (second lower trench) 164 that is narrower than the HD upper trench 163 and that has a depth from the body region 118 to the drift region 119 although the HD source trench 126 has a plane shape and has its side surface provided with no level difference in the fifth preferred embodiment mentioned above. Accordingly, the HD source trench 162 has a two-stage structure in which the side surface of the HD upper trench 163 spreads by one stage outwardly from the side surface of the HD lower trench 164.

In a stepped part between the HD upper trench 163 and the HD lower trench 164, the body region 118 is annularly exposed, and a $p^+$ type HD body contact region 165 is formed at its exposed part.

Likewise, the Di source trench 166 of the MIS transistor 161 includes a Di upper trench (first upper trench) 167 having a depth from the surface 109 of the SiC epitaxial layer 108 to the body region 118 and a Di lower trench (first lower trench) 168 that is narrower than the Di upper trench 167 and that has a depth from the body region 118 to the drift region 119. Accordingly, the Di source trench 166 has a two-stage structure in which the side surface of the Di upper trench 167 spreads by one stage outwardly from the side surface of the Di lower trench 168.

In a stepped part between the Di upper trench 167 and the Di lower trench 168, the body region 118 is annularly exposed, and a $p^+$ type Di body contact region 169 is formed at its exposed part.

As described above, the same operational effect as in the aforementioned MIS transistor 101 can be fulfilled by the MIS transistor 161.

Additionally, in the MIS transistor 161, each trench 162 and 166 has a two-stage structure, and the HD body contact region 165 and the Di body contact region 169 are formed, and therefore a contact can be made directly with the body region 118 of the Schottky cell 114 and with the body region 118 of the pn diode cell 115. As a result, the electric potential of the body region 118 can be accurately controlled.

Additionally, it is possible to exclude the bottom body contact region 138 of the pn diode cell 115 and the G breakdown voltage holding region 140 of the intersection portion 121 of the gate trench 112.

FIG. 17(a) and FIG. 17(b) are schematic plan views of a planar-gate type MIS transistor 181 according to a seventh preferred embodiment of the present invention, FIG. 17(a) being an overall view, FIG. 17(b) being an internal enlarged view. FIG. 18 is sectional views of the planar-gate type MIS transistor 181 of FIGS. 17(a) and 17(b), showing cutting planes along cutting-plane lines I-I and J-J of FIG. 17(b), respectively. In FIGS. 17 and 18, the same reference sign as in FIGS. 14 and 15 is given to each component equivalent to that of FIGS. 14 and 15, and a description of each component having the same reference sign will be omitted.

The present invention can be applied also to a planar-gate type transistor, such as the MIS transistor 181 according to the seventh preferred embodiment, although examples of the trench-gate type MIS transistors 101 and 161 have been taken in the fifth and sixth preferred embodiments mentioned above.

In the planer type MIS transistor 181, a gate insulation film 182 made of a high-k material (SiN, $Al_2O_3$, AlON, etc.) is formed on the surface 109 of the SiC epitaxial layer 108 instead of being formed on the inner surface of the gate trench 112, and a gate electrode 183 is formed thereon.

As described above, the same operational effect as in the aforementioned MIS transistor 101 can be fulfilled by the MIS transistor 181.

Figure 19:
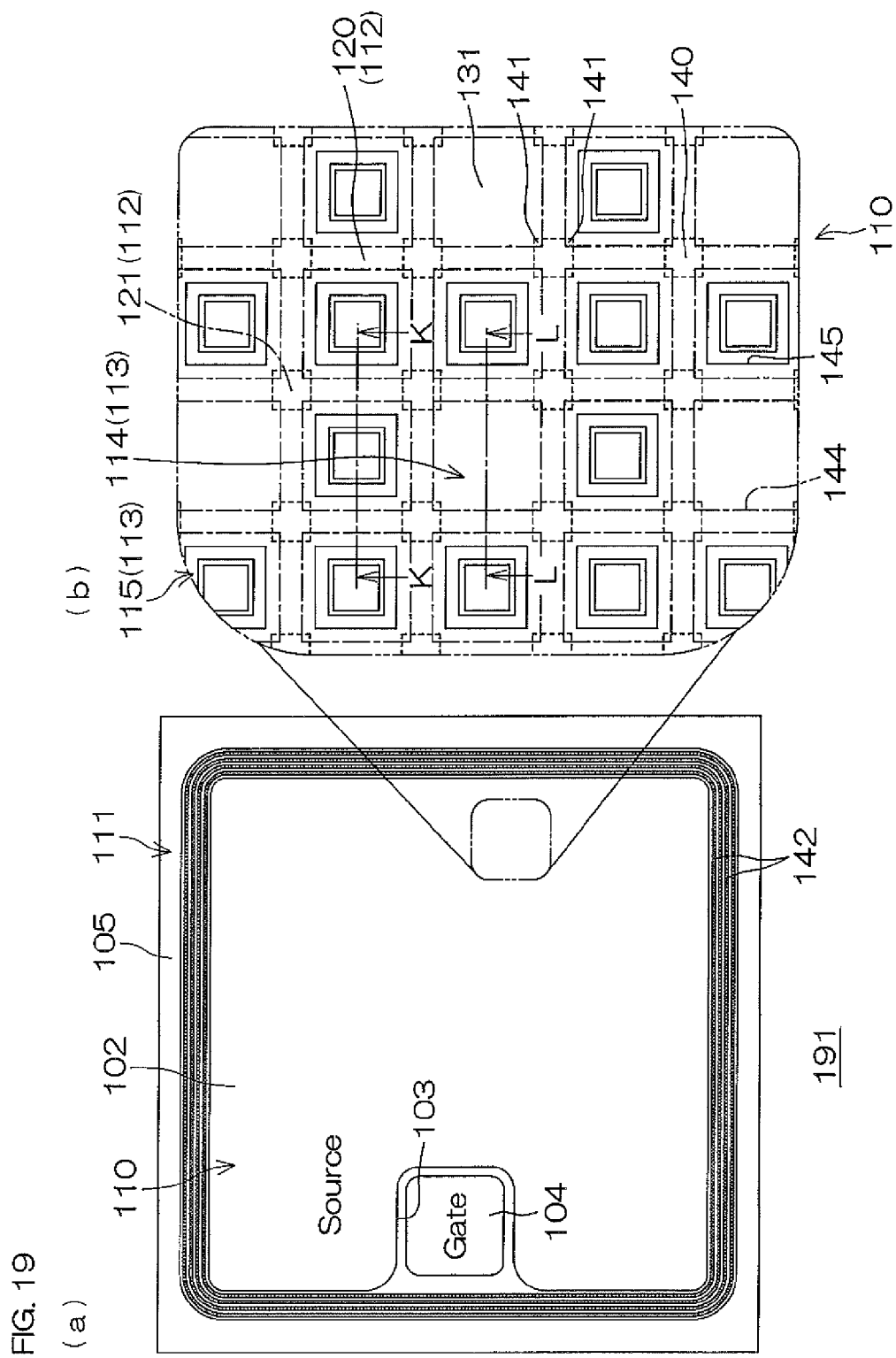
FIG. 19(a) and FIG. 19(b) are schematic plan views of a trench-gate type MIS transistor according to an eighth preferred embodiment of the present invention, FIG. 19(a) being an overall view, FIG. 19(b) being an internal enlarged view.

FIG. 19(a) and FIG. 19(b) are schematic plan views of a trench-gate type MIS transistor 191 according to an eighth preferred embodiment of the present invention, FIG. 19(a) being an overall view, FIG. 19(b) being an internal enlarged view. FIG. 20 is sectional views of the trench-gate type MIS transistor 191 of FIGS. 19(a) and 19(b), showing cutting planes along cutting-plane lines K-K and L-L of FIG. 19(b), respectively. In FIGS. 19 and 20, the same reference sign as in FIGS. 14 and 15 is given to each component equivalent to that of FIGS. 14 and 15, and a description of each component having the same reference sign will be omitted.

The area of the Schottky cell 114 and that of the pn diode cell 115 may be equal to each other although an example in which the Schottky cell 114 is larger in area than the pn diode cell 115 has been taken in the fifth to seventh preferred embodiments mentioned above.

In the MIS transistor 191 according to the eighth preferred embodiment, the planarly-viewed quadrangular Schottky cells 114 and the planarly-viewed quadrangular pn diode cells 115 that are equal in size to each other are arranged in a matrix manner, and the Schottky cell 114 is encircled by the pn diode cells 115.

The structure of the MIS transistor 101 in which the source region 117, the body region 118, and the drift region 119 are provided and in which the HD source trench 126 is formed is not formed in the Schottky cell 114. The Schottky region 131 appears in the same plane as the surface 109 of the SiC epitaxial layer 108.

As described above, the same operational effect as in the aforementioned MIS transistor 101 can be fulfilled by the MIS transistor 191.

Additionally, in the MIS transistor 191, the space for forming the MIS transistor structure is not required, and therefore the Schottky region 131 having a sufficient area can be exposed even if the cell 113 is not large, and therefore the resistance of the heterojunction diode 151 can be reduced.

Figure 21:
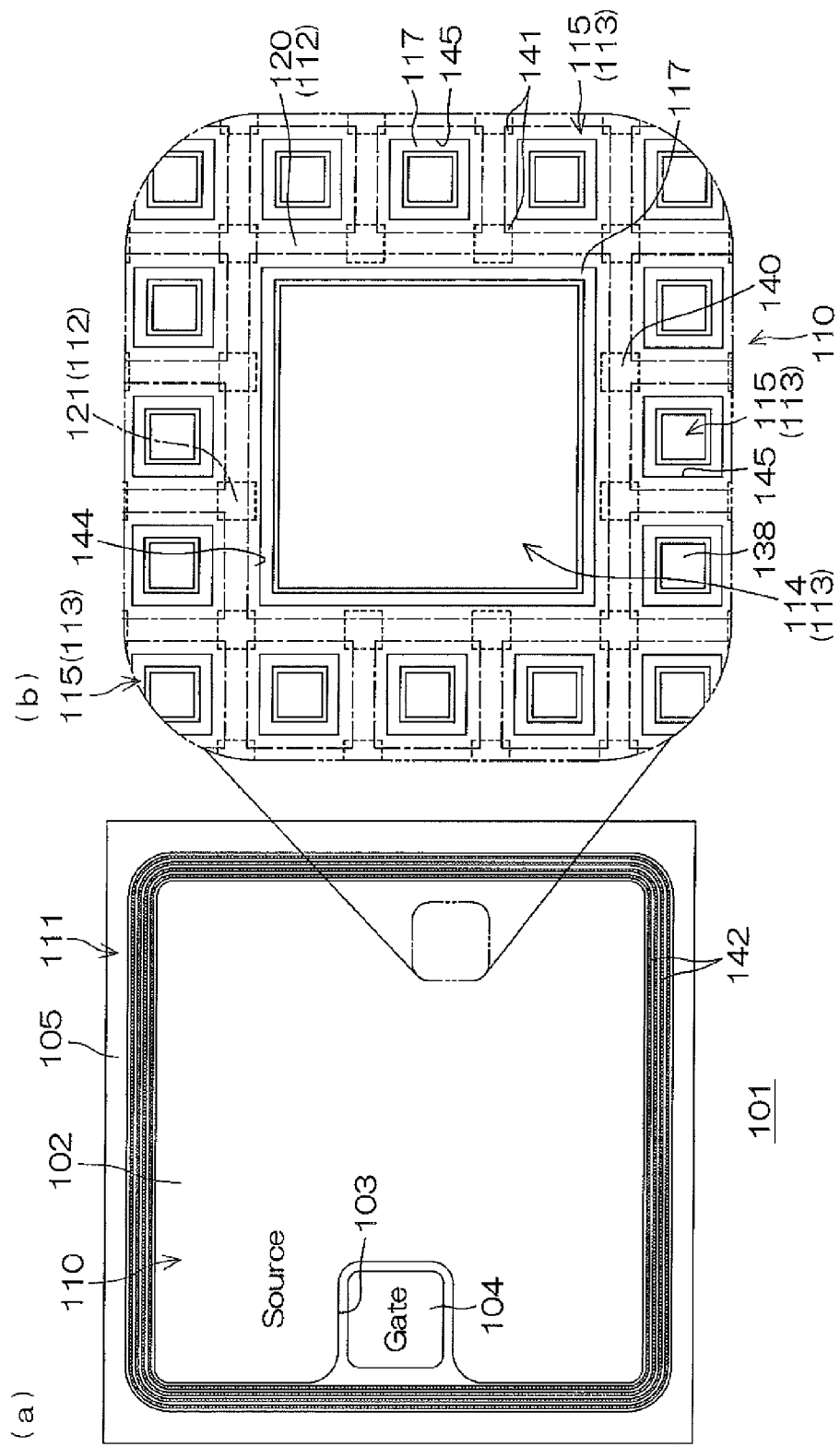
FIG. 21(a) and FIG. 21(b) are views showing a modification of the layout of the MIS transistor of FIGS. 14(a) and 14(b), FIG. 21(a) being an overall view, FIG. 21(b) being an internal enlarged view.

In the fifth to eighth preferred embodiments mentioned above, for example, the Schottky cell 114 may have an area equivalent to that of nine pn diode cells 115, and the length of one side of the Schottky cell 114 may be equivalent to three times the length of one side of the pn diode cell 115 as shown in FIGS. 21(*a*) and 21(*b*).

Figure 22:
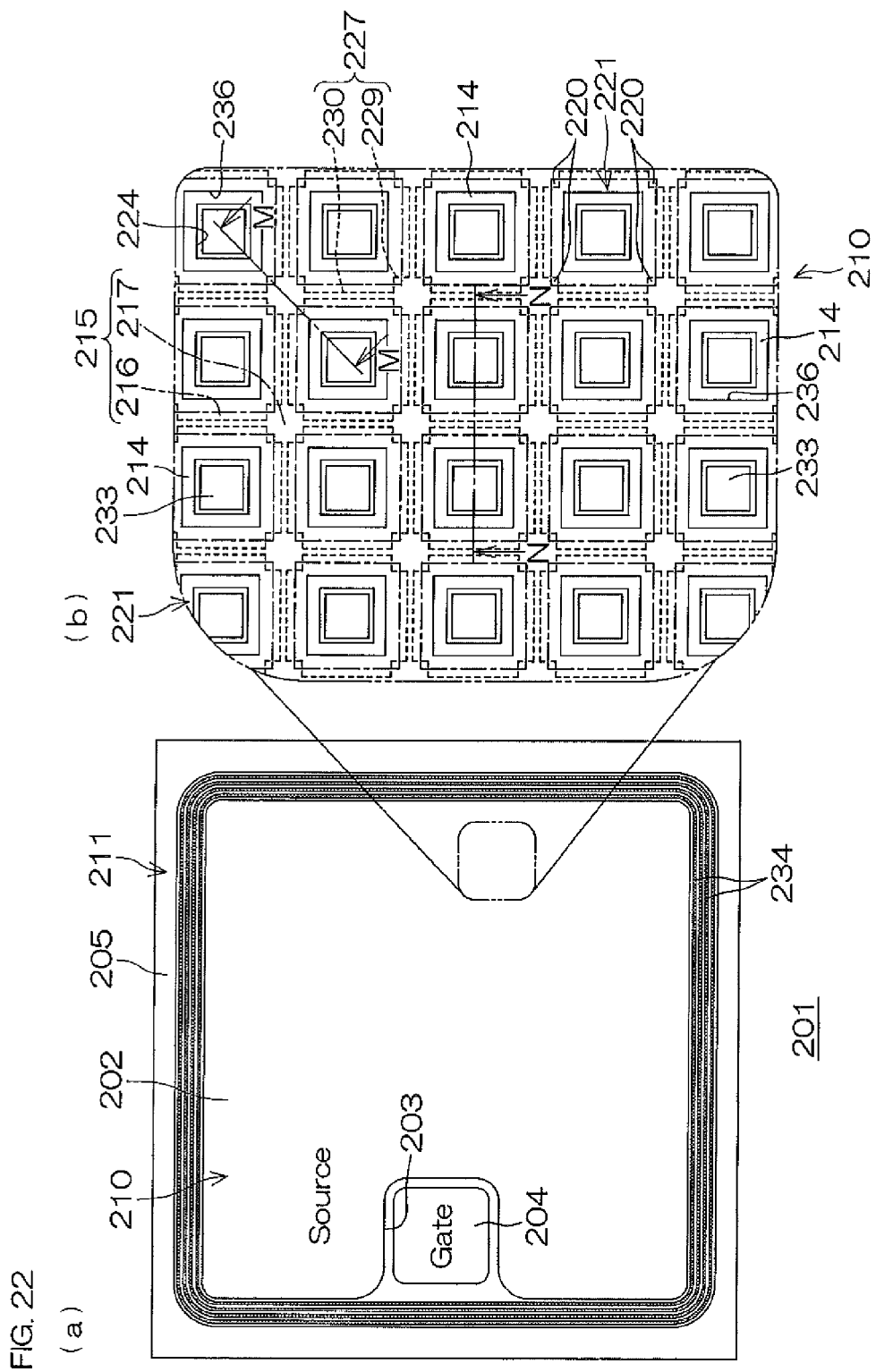
FIG. 22(a) and FIG. 22(b) are schematic plan views of a trench-gate type MIS transistor according to a ninth preferred embodiment of the present invention, FIG. 22(a) being an overall view, FIG. 22(b) being an internal enlarged view.

FIG. 22(*a*) and FIG. 22(*b*) are schematic plan views of a trench-gate type MIS transistor according to a ninth preferred embodiment of the present invention, FIG. 22(*a*) being an overall view, FIG. 22(*b*) being an internal enlarged view. FIG. 2 is sectional views of the trench-gate type MIS transistor of FIGS. 22(*a*) and 22(*b*), showing cutting planes along cutting-plane lines M-M and N-N of FIG. 22(*b*), respectively.

The MIS transistor 201 is a trench-gate type DMISFET (Double diffused Metal Insulator Semiconductor Field Effect Transistor) in which SiC is employed, and, as shown in FIG. 22(*a*), is shaped like, for example, a square chip when viewed planarly. The chip-shaped MIS transistor 201 has a length of several millimeters (mm) in each of up, down, right, and left directions in the sheet of FIG. 22(*a*).

A source pad 202 is formed on the surface of the MIS transistor 201. The source pad 202 has a substantially square shape when viewed planarly in which its four corners are bent outwardly, and is formed such that substantially all area of the surface of the MIS transistor 201 is covered therewith. In the source pad 202, a removal region 203 is formed near the center of its one side. This removal region 203 is a region in which the source pad 202 is not formed.

A gate pad 204 is disposed in the removal region 203. A gap is made between the gate pad 204 and the source pad 202, which are insulated from each other.

Next, an internal structure of the MIS transistor 201 will be described.

The MIS transistor 201 includes an n$^+$ type SiC substrate 205 (whose concentration is, for example, $1\times10^{18}$ to $1\times10^{21}$ cm$^{-3}$). The SiC substrate 205 functions as a drain of the MIS transistor 201 in the ninth preferred embodiment, and its surface (upper surface) 206 is an Si plane, whereas its reverse surface (lower surface) 207 is a C plane.

An n$^-$ type SiC epitaxial layer 208 (whose concentration is, for example, $1\times10^{15}$ to $1\times10^{17}$ cm$^{-3}$) that has a lower concentration than the SiC substrate 205 is stacked on the surface 206 of the SiC substrate 205. The thickness of the SiC epitaxial layer 208 serving as a semiconductor layer is, for example, 1 μm to 100 μm. The SiC epitaxial layer 208 is formed on the SiC substrate 205 by means of so-called epitaxial growth. In the SiC epitaxial layer 208 formed on the surface 206 that is an Si plane, the Si plane is grown as a growth principal plane. Therefore, the surface 209 of the SiC epitaxial layer 208 formed by growth is an Si plane in the same way as the surface 206 of the SiC substrate 205.

As shown in FIG. 22(*a*), an active region 210 that is disposed at the central part of the SiC epitaxial layer 208 when viewed planarly and that functions as the MIS transistor 201 and a transistor-surrounding region 211 that surrounds the active region 210 are formed in the MIS transistor 201.

Many p type body regions 212 (whose concentration is, for example, $1.0\times10^{16}$ cm$^{-3}$ to $1.0\times10^{19}$ cm$^{-3}$) are formed and arranged at a surface layer part of the SiC epitaxial layer 208 in the active region 210 in a matrix manner in row-wise and column-wise directions at constant pitches. Each body region 212 has a square shape when viewed planarly, and has a length of, for example, about 7.2 μm in each of up, down, right, and left directions in the sheet of FIG. 22(*b*).

On the other hand, the region closer to the SiC substrate 205 than to the body region 212 in the SiC epitaxial layer 208 is an n$^-$ type drift region 213 in which a state without being changed after epitaxial growth is maintained.

An n$^+$ type source region 214 (whose concentration is, for example, $1\times10^{18}$ to $1\times10^{21}$ cm$^{-3}$) is formed in a substantially whole area closer to the surface 209 in each body region 212.

A gate trench 215 that reaches the drift region 213 from the surface 209 of the SiC epitaxial layer 208 through each source region 214 and each body region 212 is formed in a grid-like manner in such a way as to surround each body region 212.

Specifically, the gate trench 215 includes a linear portion 216 that extends linearly in the row-wise direction and in the column-wise direction along four side surfaces of each body region 212 through each space between the adjoining body regions 212 and an intersection portion 217 at which the linear portion 216 extending in the row-wise direction and the linear portion 216 extending in the column-wise direction intersect. When attention is paid to the body regions 212 arranged in two rows and in two columns when viewed planarly, the intersection portion 217 is a square-shaped portion, when viewed planarly, that is surrounded by the inner corners of the thus-arranged four body regions 212 and that is partitioned by extension lines of the four sides of the body region 212. The gate trench 215 has a cross section of the letter U in which the side surface 218 and the bottom surface 219 that face each other are continuous surfaces through a curved plane.

As a result, many unit cells 221 each of which has a rectangular parallelepiped shape (a square shape when viewed planarly) and each of which has four corner portions 220 in each window part surrounded by the grid-like gate trench 215 are formed in the SiC epitaxial layer 208. In the unit cell 221, the depth direction of the gate trench 215 is a gate length direction, and the circumferential direction of each unit cell 221 perpendicular to the gate length direction is a gate width direction.

A gate insulation film 222 made of a high-k material (SiN, Al$_2$O$_3$, AlON, etc.) is formed on the inner surface of the gate trench 215 such that its whole area is covered therewith.

The inside of the gate insulation film 222 is completely filled with a polysilicon material doped with highly-concentrated n type impurities, and, as a result, a gate electrode 223 is buried in the gate trench 215. A vertical MIS transistor structure is thus created in which the source region 214 and the drift region 213 are arranged apart from each other with the body region 212 therebetween in a vertical direction perpendicular to the surface 209 of the SiC epitaxial layer 208.

A source trench 224 that has a square shape when viewed planarly and that reaches the drift region 213 from the surface 209 of the SiC epitaxial layer 208 through each source region 214 and each body region 212 is formed in the central part of each unit cell 221. The depth of the source trench 224 is the same as that of the gate trench 215 in the ninth preferred embodiment. The gate trench 224 has a cross section of the letter U in which the side surface 225 and the bottom surface 226 that face each other are continuous surfaces through a curved plane in the same way as the gate trench 215.

A p type gate breakdown voltage holding region 227 and a source breakdown voltage holding region 228 serving as a first breakdown voltage holding region are formed in the SiC epitaxial layer 208 by implanting p type impurities into the SiC epitaxial layer 208.

The gate breakdown voltage holding region 227 is formed along the grid-like gate trench 215, and integrally includes a first region 229 serving as a second breakdown voltage holding region formed at the intersection portion 217 of the gate trench 215 and a second region 230 serving as a third breakdown voltage holding region formed at the linear portion 216 of the gate trench 215.

The first region 229 is formed to reach the body region 212 disposed directly above the corner edge 231 through the bottom surface 219 of the gate trench 215 in the intersection portion 217 and through the corner edge 231 of the gate trench 215 formed at the lower part of each corner portion 220 of the four unit cells 221 facing the intersection portion 217 from the bottom surface 219. In other words, the first region 229 is formed in a square shape slightly larger than the intersection portion 217 of the gate trench 215 when viewed planarly, and its each corner enters each corner portion 220 of the four unit cells 221 facing the intersection portion 217. The concentration of the first region 229 is higher than that of the body region 212, and is higher than that of the drift region 213, and is, for example, $1\times10^{17}$ to $9\times10^{19}$ cm$^{-3}$. The thickness $T_1$ along a direction toward the SiC substrate 205 from the bottom surface of the gate trench 215 in the first region 229 is, for example, about 0.8 μm.

The second region 230 is formed to have a linear shape having a constant width by which the centers of the sides of the adjoining intersection portions 217 are connected together when viewed planarly, and has a width (for example, 0.8 μm) narrower than the width of the linear portion 216 (distance between the side surfaces of the gate trench 215 facing each other, for example, 1 μm). The concentration of the second region 230 is higher than that of the body region 212, and is higher than that of the first region 229, and is, for example, $2\times10^{17}$ to $1\times10^{20}$ cm$^{-3}$. The thickness $T_2$ along a direction toward the SiC substrate 205 from the bottom surface of the gate trench 215 in the second region 230 is smaller than the thickness $T_1$ of the first region 229 (i.e., $T_1>T_2$), and is, for example, about 0.7 μm.

The source breakdown voltage holding region 228 is formed to reach an edge part 232 of the source trench 224 at which the bottom surface 226 and the side surface 225 intersect and reach the body region 212 forming a part of the side surface 225 of the source trench 224 from the edge part 232 so as to expose the bottom surface 226 of the source trench 224.

As a result, a drift exposure region 233 that has a square shape when viewed planarly and that consists of a part of the drift region 213 is formed at the central part of the bottom surface 226 of the source trench 224.

The concentration of the source breakdown voltage holding region 228 is equal to that of the first region 229 of the gate breakdown voltage holding region 227 (for example, $1\times10^{17}$ to $9\times10^{19}$ cm$^{-3}$). The thickness $T_3$ along a direction toward the SiC substrate 205 from the bottom surface of the source trench 224 in the source breakdown voltage holding region 228 is equal to the thickness $T_1$ of the first region 229 of the gate breakdown voltage holding region 227 (for example, about 0.8 μm).

In the transistor-surrounding region 211, a plurality of p type guard rings 234 (four in the ninth preferred embodiment) are formed at the surface layer part of the SiC epitaxial layer 208 apart from the active region 210 in such a way as to surround the unit cells 221 (the active region 210) arranged in a matrix manner. These guard rings 234 can be formed through the same ion implantation step as the step of forming the p type body region 212.

Each guard ring 234 is formed to have a planarly-viewed quadrangular annular shape along the outer periphery of the MIS transistor 201 when viewed planarly.

An interlayer insulation film 235 made of a high-k material (SiN, $Al_2O_3$, AlON, etc.) is stacked on the SiC epitaxial layer 208 such that the gate electrode 223 is covered therewith.

A contact hole 236 larger in diameter than the source trench 224 is formed in the interlayer insulation film 235 and the gate insulation film 222. As a result, the whole of the source trench 224 of each unit cell 221 (i.e., the side surface 225 and the bottom surface 226 of the source trench 224) and the peripheral edge of the source trench 224 in the surface 209 of the SiC epitaxial layer 208 are exposed in the contact hole 236, and a level difference corresponding to a difference in level between the surface 209 and the bottom surface 226 is formed.

A source electrode 237 is formed on the interlayer insulation film 235. The source electrode 237 enters the source trenches 224 of all unit cells 221 through each contact hole 236 in the lump, and, in each unit cell 221, is in contact with the drift exposure region 233, the source breakdown voltage holding region 228, the body region 212, and the source region 214 in order from the bottom side of the source trench 224. In other words, the source electrode 237 serves as a wire shared among all unit cells 221.

An interlayer insulation film (not shown) is formed on the source electrode 237, and the source electrode 237 is electrically connected to the source pad 202 (see FIG. 22(a)) through this interlayer insulation film (not shown). On the other hand, the gate pad 204 (see FIG. 22(a)) is electrically connected to the gate electrode 223 through a gate wire (not shown) laid on this interlayer insulation film (not shown).

The source electrode 237 has a polysilicon layer 238 serving as a barrier forming layer, an intermediate layer 239, and a metal layer 240 in order from the contact side with the SiC epitaxial layer 208.

The polysilicon layer 238 is a doped layer formed by use of doped polysilicon that has been doped with impurities, and is a highly-concentrated doped layer that has been doped with highly-concentrated impurities of, for example, $1\times10^{15}$ cm$^{-3}$ or more and, preferably, $1\times10^{19}$ to $1\times10^{21}$ cm$^{-3}$. N type impurities, such as N (nitrogen), P (phosphorus), and As (arsenic), or p type impurities, such as Al (aluminum) and B (boron), can be used as impurities when the polysilicon layer 238 is formed to be a doped layer (including a highly-concentrated doped layer). The thickness of the polysilicon layer 238 is, for example, 5000 Å to 10000 Å.

In the ninth preferred embodiment, the polysilicon layer 238 is formed in such a way as to cover the whole area of the surface of the unit cell 221 exposed in the contact hole 236, and is in contact with all of the drift exposure region 233, the source breakdown voltage holding region 228, and the source region 214 in the source trench 224.

In other words, the polysilicon layer 238 has a first part 241 that is in contact with the source breakdown voltage holding region 228 in the side surface 225 of the source trench 224 and that is in contact with the source region 214 in the peripheral edge of the source trench 224 in the side surface 225 and the surface 209 of the SiC epitaxial layer 208, and has a second part 242 that is in contact with the drift exposure region 233 in the bottom surface 226 of the source trench 224.

In the polysilicon layer 238, the first part 241 makes an ohmic contact both with the source breakdown voltage holding region 228 and with the source region 214. On the other hand, the second part 242 makes a heterojunction (for example, the height of a junction barrier is 1 eV to 1.5 eV) having a smaller junction barrier than diffusion potential (for example, 2.8 eV to 3.2 eV) of a body diode 243 contained in the MIS transistor 201 (i.e., a pn diode formed by a junction between the body region 212 and the drift region 213) between the drift exposure region 233 and the second part 242.

The intermediate layer 239 is a metal layer stacked on the polysilicon layer 238, and consists of a single layer that contains Ti (titanium) or consists of multiple layers that contain Ti. The layer containing Ti can be made by use of, for example, Ti or TiN (titanium nitride). The thickness of the intermediate layer 239 is, for example, 200 nm to 500 nm.

The metal layer 240 is stacked on the intermediate layer 239, and can be made of, for example, Al (aluminum), Au (gold), Ag (silver), Cu (copper), Mo (molybdenum), an alloy of these metals, or a metal material containing these metals. The metal layer 240 is used as a topmost layer of the source electrode 237. The thickness of the metal layer 240 is, for example, 1 µm to 5 µm.

In the ninth preferred embodiment, the polysilicon layer 238, the intermediate layer 239, and the metal layer 240 mentioned above are combined together so as to have a laminated structure (Poly-Si/Ti/TiN/Al) in which Poly-Si (polysilicon layer 238), Ti (intermediate layer 239), TiN (intermediate layer 239), and Al (metal layer 240) are stacked in this order. Preferably, the metal layer 240 has an Mo layer in addition thereto. Mo has a high melting point, and therefore, if the Mo layer is contained in the metal layer 240, the metal layer 240 can be restrained from being melted by heat generated when a high current flows through the source electrode 237.

A drain electrode 244 is formed on the reverse surface 207 of the SiC substrate 205 such that the whole area of the reverse surface 207 is covered therewith. This drain electrode 244 is an electrode shared among all the unit cells 221. A laminated structure (Ti/Ni/Au/Ag) in which, for example, Ti, Ni, Au, and Ag are stacked in order from the side of the SiC substrate 205 can be employed as the drain electrode 244.

This MIS transistor 201 is used as, for example, a switching device for a driving circuit (inverter circuit) of an electric motor (one example of an inductive load). In this case, switching between turn-on and turn-off of an electric current that is applied to the electric motor is performed by turn-on and turn-off of a predetermined voltage (voltage greater than a gate threshold voltage) applied onto the gate pad 204 in a state in which a drain voltage by which the drain side becomes positive is applied between the source pad 202 (source electrode 237) and the drain electrode 244 (i.e., is applied to the source-drain interval).

When an electric current flowing through the electric motor is interrupted (i.e., when a gate voltage is turned off), a counter electromotive force is generated in a motor coil of the electric motor. There is a case in which a voltage by which the source side becomes positive is applied to the source-drain interval because of this counter electromotive force.

In this case, if an electric current flows to the motor coil in the form of, for example, a return current by the rectifying operation of the body diode 243, the following defects will be produced.

In detail, there is a case in which, when holes move from the p type body region 212 that is a component of the body diode 243 to the n type drift region 213 so that an electric current flows, many carriers, i.e., many electrons and holes that have moved from the p type body region 212 recombine together near the gate trench 215 (for example, beside the gate trench 215) in the n type drift region 213. Therefore, there is a fear that the crystal defect of SiC of the SiC epitaxial layer 208 will expand in a direction parallel to the layered direction of the SiC epitaxial layer 208 because of energy generated by their recombination, and will reach the route (for example, channel) of a drain current during an ON state. If so, there is a fear that on-resistance will rise when the MIS transistor 201 forms a channel near the side surface 218 of the gate trench 215 in the body region 212 and performs a switching operation.

Therefore, in the ninth preferred embodiment, the polysilicon layer 238 makes a heterojunction with respect to the drift region 213 (the drift exposure region 233). Therefore, an electric current preferentially flows to the heterojunction part between the drift region 213 and the second part 242 of the polysilicon layer 238, and an electric current flowing to the body diode 243 can be reduced or eliminated. Thus, the electric current that has flowed through the MIS transistor 201 can be allowed to flow to the electric motor in the form of, for example, a return current.

Thus, during an OFF state, an electric current flows to the drift region 213 from the second part 242 of the polysilicon layer 238 formed in the source trench 224 at the center of the unit cell 221 surrounded by the gate trench 215, and therefore carriers hardly move near the gate trench 215 (i.e., between the p type body region 212 and the n type drift region 213). Therefore, holes and electrons can be prevented from recombining together in the drift region 213. As a result, the crystal defect of SiC can be restrained from expanding in the SiC epitaxial layer 208, and therefore the on-resistance of the transistor 201 can be restrained from rising.

In an OFF state (i.e., when the gate voltage is 0V), an electric field is applied to the gate insulation film 222 interposed between the gate electrode 223 and the SiC epitaxial layer 208.

This electric field is generated resulting from a potential difference between the gate electrode 223 and the SiC epitaxial layer 208. In the bottom surface 219 of the gate trench 215, equipotential surfaces having extremely high electric potential are distributed on the assumption that the gate electrode 223 is a reference (0V), and the interval between the equipotential surfaces is small, and therefore an extremely large electric field is generated. For example, when the drain voltage is 900V, an equipotential surface of 900V is distributed near the reverse surface 207 of the SiC substrate 205 contiguous to the drain electrode 244, and a voltage drop occurs correspondingly to an approach from the reverse surface 207 of the SiC substrate 205 toward the surface 209 of the SiC epitaxial layer 208, and an equipotential surface of about several tens of volts is distributed near the bottom surface 219 of the gate trench 215. Therefore, an extremely large electric field toward the gate electrode 223 is generated in the bottom surface 219 of the gate trench 215. Specifically in a case in which the gate trench 215 is formed in a grid-like manner and in which the quadrangular-prism-shaped unit cells 221 are arranged at a window part of the grid-like gate trench 215 in the same way as in the ninth preferred embodiment, the insulation breakdown of the gate insulation film 222 is particularly liable to occur near the corner edge 231 of the gate trench 215 formed in each corner portion 220 of the unit cell 221.

Specifically, the distance $D_1$ between the source trenches 224 next to each other on the diagonal of the intersection portion 217 of the gate trench 215 (see the M-M cross section of FIG. 23) becomes greater than the distance $D_2$ between the source trenches 224 next to each other with the linear portion 216 of the gate trench 215 therebetween (see the N-N cross section of FIG. 23) (for example, the distance $D_1$ is 1.4 times the distance $D_2$ in the ninth preferred embodiment). Therefore, equipotential surfaces enter an area directly under the corner edge 231 of the gate trench 215 having a relatively wide space, and densely gather thereat. As a result, the insulation breakdown of the gate insulation film 222 is particularly liable to occur near the corner edge 231 of the gate trench 215.

Therefore, in the MIS transistor 201 of the ninth preferred embodiment, the gate breakdown voltage holding region 227 (first region 229) is formed at the corner edge 231 of the gate trench 215. Accordingly, a body diode 248 can be formed near the corner edge 231 of the gate trench 215 by means of a junction (pn junction) between the first region 229 and the drift region 213. Additionally, in the MIS transistor 201, the source breakdown voltage holding region 228 is formed at the edge part 232 of the source trench 224 formed at the central part of each unit cell 221. Therefore, an annular body diode 249 surrounding the edge part 232 of the source trench 224 can be formed by a junction (pn junction) between the source breakdown voltage holding region 228 and the drift region 213.

The presence of a depletion layer generated in these body diodes 248 and 249 can prevent an equipotential surface from entering between the corner edge 231 of the gate trench 215 and the edge part 232 of the source trench 224, and can distance it from the gate insulation film 222. As a result, equipotential surfaces can be prevented from densely gathering near the corner edge 231 of the gate trench 215. As a result, an electric field to be applied to the gate insulation film 222 can be reduced, and hence the insulation breakdown can be restrained. Additionally, the concentration of the first region 229 is higher than that of the drift region 213, and therefore a depletion layer generated by a junction (pn junction) between the first region 229 and the drift region 213 can be prevented from excessively spreading in the SiC epitaxial layer 208.

Additionally, in the MIS transistor 201, a channel is not formed at the corner portion 220 of the unit cell 221 or, alternatively, an electric current flowing through the channel is slight even if a channel is formed there although the first region 229 is formed to reach the body region 212 directly above the corner edge 231 through the corner edge 231. Therefore, the effect of preventing the breakdown of the insulation film 222 can be made even higher almost without affecting device performance by forming the gate breakdown voltage holding region 227 (first region 229) so as to reach a part directly above the corner edge 231 in the body region 212.

On the other hand, the gate breakdown voltage holding region 227 (second region 230) smaller in width than the linear portion 216 is formed at the linear portion 216 of the gate trench 215. As a result, a depletion layer to be generated by a junction (pn junction) between the second region 230 and the drift region 213 can be allowed to occur along the linear portion 216 of the gate trench 215. Therefore, an electric field generated directly under the linear portion 216 of the gate trench 215 can be moderated by this depletion layer. As a result, an electric field generated in the gate insulation film 222 can be evenly moderated over the whole.

Moreover, the gate breakdown voltage holding region 227 (second region 230) is not formed at the side surface 218 (i.e., part at which a channel is formed in the unit cell 221) of the linear portion 216 of the gate trench 215. Therefore, channel characteristics can also be controlled accurately.

Additionally, the concentration of the second region 230 is higher than that of the first region 229, and the thickness $T_2$ of the second region 230 is smaller than the thickness $T_1$ of the first region 229 ($T_1 > T_2$), and therefore channel resistance can be prevented from rising.

Additionally, the gate breakdown voltage holding region 227 and the source breakdown voltage holding region 228 can be simultaneously formed according to the aforementioned production method. As a result, the structure of the MIS transistor 201 to prevent the insulation breakdown of the gate insulation film 222 can be easily created.

Figure 24:
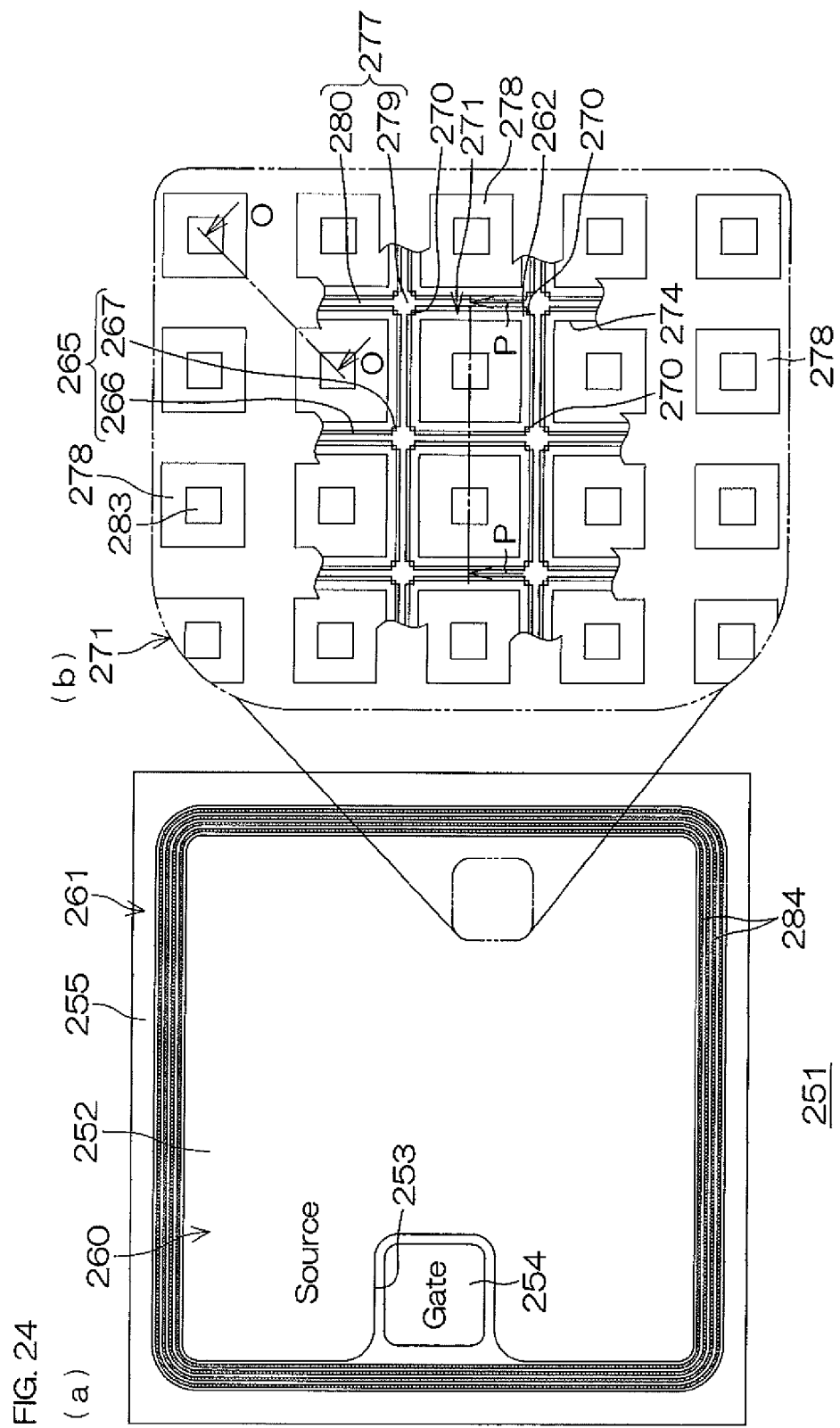
FIG. 24(a) and FIG. 24(b) are schematic plan views of a planar-gate type MIS transistor according to a tenth preferred embodiment of the present invention, FIG. 24(a) being an overall view, FIG. 24(b) being an internal enlarged view.

FIG. 24(a) and FIG. 24(b) are schematic plan views of a planar-gate type MIS transistor according to a tenth preferred embodiment of the present invention, FIG. 24(a) being an overall view, FIG. 24(b) being an internal enlarged view. FIG. 25 is sectional views of the planar-gate type MIS transistor of FIGS. 24(a) and 24(b), showing cutting planes along cutting-plane lines O-O and P-P of FIG. 24(b), respectively.

The MIS transistor 251 is a planar-gate type DMISFET in which SiC is employed, and, as shown in FIG. 24(a), is shaped like, for example, a square chip when viewed planarly. The chip-shaped MIS transistor 251 has a length of several millimeters (mm) in each of up, down, right, and left directions in the sheet of FIG. 24(a).

A source pad 252 is formed on the surface of the MIS transistor 251. The source pad 252 has a substantially square shape when viewed planarly in which its four corners are bent outwardly, and is formed such that substantially all area of the surface of the MIS transistor 251 is covered therewith. In the source pad 252, a removal region 253 is formed near the center of its one side. This removal region 253 is a region in which the source pad 252 is not formed.

A gate pad 254 is disposed in the removal region 253. A gap is made between the gate pad 254 and the source pad 252, which are insulated from each other.

Next, an internal structure of the MIS transistor 251 will be described.

The MIS transistor 251 includes an n$^+$ type SiC substrate 255 (whose concentration is, for example, $1 \times 10^{18}$ to $1 \times 10^{21}$ cm$^{-3}$). The SiC substrate 255 functions as a drain of the MIS transistor 251 in the tenth preferred embodiment, and its surface (upper surface) 256 is an Si plane, whereas its reverse surface (lower surface) 257 is a C plane.

An n$^-$ type SiC epitaxial layer 258 (whose concentration is, for example, $1 \times 10^{15}$ to $1 \times 10^{17}$ cm$^{-3}$) that has a lower concentration than the SiC substrate 255 is stacked on the surface 256 of the SiC substrate 255. The thickness of the SiC epitaxial layer 258 serving as a semiconductor layer is, for example, 1 μm to 100 μm. The SiC epitaxial layer 258 is formed on the SiC substrate 255 by means of so-called epitaxial growth. In the SiC epitaxial layer 258 formed on the surface 256 that is an Si plane, the Si plane is grown as a growth principal plane. Therefore, the surface 259 of the SiC epitaxial layer 258 formed by growth is an Si plane in the same way as the surface 256 of the SiC substrate 255.

As shown in FIG. 24(a), an active region 260 that is disposed at the central part of the SiC epitaxial layer 258 when viewed planarly and that functions as the MIS transistor 251 and a transistor-surrounding region 261 that surrounds the active region 260 are formed in the MIS transistor 251.

Many p type body regions 262 (whose concentration is, for example, $1.0 \times 10^{16}$ cm$^{-3}$ to $1.0 \times 10^{19}$ cm$^{-3}$) are formed and arranged at a surface layer part of the SiC epitaxial layer 258 in the active region 260 in a matrix manner in row-wise and column-wise directions at constant pitches. Each body region 262 has a square shape when viewed planarly, and has a length of, for example, about 7.2 μm in each of up, down, right, and left directions in the sheet of FIG. 24(b).

On the other hand, the region closer to the SiC substrate 255 than to the body region 262 in the SiC epitaxial layer 258 is an n$^-$ type drift region 263 in which a state without being changed after epitaxial growth is maintained.

An n$^+$ type source region 264 (whose concentration is, for example, $1 \times 10^{18}$ to $1 \times 10^{21}$ cm$^{-3}$) is formed in a substantially whole area closer to the surface 259 in each body region 262.

In the active region 260, each region (a body-to-body region 265) between the body regions 262 arranged in a matrix manner at constant pitches is grid-like, and has a predetermined width (for example, 2.8 μm).

Specifically, the body-to-body region 265 includes a linear portion 266 that extends linearly in the row-wise direction and in the column-wise direction along four side surfaces of each body region 262 through each space between the adjoining body regions 262 and an intersection portion 267 at which the linear portion 266 extending in the row-wise direction and the linear portion 266 extending in the column-wise direction intersect. When attention is paid to the body regions 262 arranged in two rows and in two columns when viewed planarly, the intersection portion 267 is a square-shaped portion, when viewed planarly, that is surrounded by the inner corners of the thus-arranged four body regions 262 and that is partitioned by extension lines of the four sides of the body region 262.

As a result, many unit cells 271 each of which has a square shape when viewed planarly and each of which has four corner portions 270 in each window part surrounded by the grid-like body-to-body region 265 are formed in the SiC epitaxial layer 258. In other words, a boundary between the unit cells 271 is set at the center in a width direction of the body-to-body region 265. Each unit cell has a length of about 10 μm in each of up, down, right, and left directions in the sheet of FIG. 24(b). In each unit cell 271, the depth direction of the body region 262 is a gate length direction, and the circumferential direction of the body region 262 perpendicular to the gate length direction is a gate width direction.

A grid-like gate insulation film 272 is formed on the body-to-body regions 265 and along the body-to-body regions 265. The gate insulation film 272 stretches between the body regions 262 next to each other, and covers a part surrounding the source region 264 in the body region 262 (i.e., a peripheral edge of the body region 262) and an outer peripheral edge of the source region 264. The gate insulation film 272 is made of a high-k material (SiN, Al$_2$O$_3$, AlON, etc.), and has a substantially uniform thickness of about 400 Å.

A gate electrode 273 is formed on the gate insulation film 272. The gate electrode 273 is formed in a grid-like manner along the grid-like gate insulation film 272, and faces the peripheral edge of each body region 262 with the gate insulation film 272 therebetween. The gate electrode 273 is made of polysilicon, and is doped with, for example, highly-concentrated n type impurities. The thickness of the gate electrode 273 is, for example, about 6000 Å.

A source trench 274 that has a square shape when viewed planarly and that reaches the drift region 263 from the surface 259 of the SiC epitaxial layer 258 through each source region 264 and each body region 262 is formed in the central part of each unit cell 271. The source trench 274 has a cross section of the letter U in which the side surface 275 and the bottom surface 276 that face each other are continuous surfaces through a curved plane.

A p type gate breakdown voltage holding region 277 and a source breakdown voltage holding region 278 serving as a first breakdown voltage holding region are formed in the SiC epitaxial layer 258 by implanting p type impurities into the SiC epitaxial layer 258.

The gate breakdown voltage holding region 277 is formed along the grid-like body-to-body region 265, and integrally includes a first region 279 serving as a fourth breakdown voltage holding region formed at the intersection portion 267 of the body-to-body region 265 and a second region 280 serving as a fifth breakdown voltage holding region formed at the linear portion 266 of the body-to-body region 265.

The first region 279 is formed to reach a corner part 281 of the body region 262 formed at each corner portion 270 of four unit cells 271 facing the intersection portion 267. In other words, the first region 279 is formed in a square shape slightly larger than the intersection portion 267 of the body-to-body region 265 when viewed planarly, and its each corner enters each corner portion 270 of the four unit cells 271 facing the intersection portion 267. The concentration of the first region 279 is higher than that of the body region 262, and is higher than that of the drift region 263, and is, for example, $1 \times 10^{18}$ to $1 \times 10^{19}$ cm$^{-3}$. The thickness $T_4$ along a direction toward the SiC substrate 255 from the surface 259 of the SiC epitaxial layer 258 in the first region 279 is, for example, about 0.8 μm.

The second region 280 is formed to have a linear shape having a constant width by which the centers of the sides of the adjoining intersection portions 267 are connected together when viewed planarly, and has a width (for example, 1.5 μm) narrower than the width of the linear portion 266 (for example, 3.0 μm). The concentration of the second region 280 is higher than that of the body region 262, and is higher than that of the first region 279, and is, for example, $2 \times 10^{18}$ to $2 \times 10^{19}$ cm$^{-3}$. The thickness $T_5$ along a direction toward the SiC substrate 255 from the surface 259 of the SiC epitaxial layer 258 in the second region 280 is smaller than the thickness $T_4$ of the first region 279 (i.e., $T_4 \geq T_5$).

The source breakdown voltage holding region 278 is formed to reach an edge part 282 of the source trench 274 at which the bottom surface 276 and the side surface 275 intersect and reach the body region 262 forming a part of the side surface 275 of the source trench 274 from the edge part 282 so as to expose the bottom surface 276 of the source trench 274.

As a result, a drift exposure region 283 that has a square shape when viewed planarly and that consists of a part of the drift region 263 is formed at the central part of the bottom surface 276 of the source trench 274.

The concentration of the source breakdown voltage holding region 278 is equal to that of the first region 279 of the gate breakdown voltage holding region 277 (for example, $1 \times 10^{18}$ to $1 \times 10^{19}$ cm$^{-3}$). The thickness $T_6$ along a direction toward the SiC substrate 255 from the bottom surface of the source trench 274 in the source breakdown voltage holding region 278 is, for example, about 0.8 μm, and the deepest part of the source breakdown voltage holding region 278 is disposed to be deeper than the deepest part of the gate breakdown voltage holding region 277 (the first region 279 and the second region 280).

In the transistor-surrounding region 261, a plurality of p type guard rings 284 (four in the tenth preferred embodiment) are formed at the surface layer part of the SiC epitaxial layer 258 apart from the active region 260 in such a way as to surround the unit cells 271 (the active region 260) arranged in a matrix manner. These guard rings 284 can be formed through the same ion implantation step as the step of forming the p type body region 262.

Each guard ring 284 is formed to have a planarly-viewed quadrangular annular shape along the outer periphery of the MIS transistor 251 when viewed planarly.

An interlayer insulation film 285 made of a high-k material (SiN, Al$_2$O$_3$, AlON, etc.) is stacked on the SiC epitaxial layer 258 such that the gate electrode 273 is covered therewith.

A contact hole 286 larger in diameter than the source trench 274 is formed in the interlayer insulation film 285 and the gate insulation film 272. As a result, the whole of the source trench 274 of each unit cell 271 (i.e., the side surface 275 and the bottom surface 276 of the source trench 274) and the peripheral edge of the source trench 274 in the surface 259 of the SiC epitaxial layer 258 are exposed in the contact hole 286, and a level difference corresponding to a difference in level between the surface 259 and the bottom surface 276 is formed.

A source electrode 287 is formed on the interlayer insulation film 285. The source electrode 287 enters the source trenches 274 of all unit cells 271 through each contact hole 286 in the lump, and, in each unit cell 271, is in contact with the drift exposure region 283, the source breakdown voltage holding region 278, the body region 262, and the source region 264 in order from the bottom side of the source trench 274. In other words, the source electrode 287 serves as a wire shared among all unit cells 271.

An interlayer insulation film (not shown) is formed on the source electrode 287, and the source electrode 287 is electrically connected to the source pad 252 (see FIG. 24(a)) through this interlayer insulation film (not shown). On the other hand, the gate pad 254 (see FIG. 24(a)) is electrically connected to the gate electrode 273 through a gate wire (not shown) laid on this interlayer insulation film (not shown).

The source electrode 287 has a polysilicon layer 288 serving as a barrier forming layer, an intermediate layer 289, and a metal layer 290 in order from the contact side with the SiC epitaxial layer 258.

The polysilicon layer 288 is a doped layer formed by use of doped polysilicon that has been doped with impurities, and is a highly-concentrated doped layer that has been doped with highly-concentrated impurities of, for example, $1 \times 10^{15}$ cm$^{-3}$ or more and, preferably, $1 \times 10^{19}$ to $1 \times 10^{21}$ cm$^{-3}$. N type impurities, such as N (nitrogen), P (phosphorus), and As (arsenic), or p type impurities, such as Al (aluminum) and B (boron), can be used as impurities when the polysilicon layer 288 is formed to be a doped layer (including a highly-concentrated doped layer). The thickness of the polysilicon layer 288 is, for example, 5000 Å to 10000 Å.

In the tenth preferred embodiment, the polysilicon layer 288 is formed in such a way as to cover the whole area of the surface of the unit cell 271 exposed in the contact hole 286, and is in contact with all of the drift exposure region 283, the source breakdown voltage holding region 278, and the source region 264 in the source trench 274.

In other words, the polysilicon layer 288 has a first part 291 that is in contact with the source breakdown voltage holding region 278 in the side surface 275 of the source trench 274 and that is in contact with the source region 264 in the peripheral edge of the source trench 274 in the side surface 275 and the surface 259 of the SiC epitaxial layer 258 and a second part 292 that is in contact with the drift exposure region 283 in the bottom surface 276 of the source trench 274.

In the polysilicon layer 288, the first part 291 makes an ohmic contact both with the source breakdown voltage holding region 278 and with the source region 264. On the other hand, the second part 292 makes a heterojunction (for example, the height of a junction barrier is 1 eV to 1.5 eV) having a smaller junction barrier than diffusion potential (for example, 2.8 eV to 3.2 eV) of a body diode 293 contained in the MIS transistor 251 (i.e., a pn diode formed by a junction between the source breakdown voltage holding region 278 and the drift region 263) between the drift exposure region 283 and the second part 292.

The intermediate layer 289 is a metal layer stacked on the polysilicon layer 288, and consists of a single layer that contains Ti (titanium) or consists of multiple layers that contain Ti. The layer containing Ti can be made by use of, for example, Ti or TiN (titanium nitride). The thickness of the intermediate layer 289 is, for example, 200 nm to 500 nm.

The metal layer 290 is stacked on the intermediate layer 289, and can be made of, for example, Al (aluminum), Au (gold), Ag (silver), Cu (copper), Mo (molybdenum), an alloy of these metals, or a metal material containing these metals. The metal layer 290 is used as a topmost layer of the source electrode 287. The thickness of the metal layer 290 is, for example, 1 μm to 5 μm.

In the tenth preferred embodiment, the polysilicon layer 288, the intermediate layer 289, and the metal layer 290 mentioned above are combined together so as to have a laminated structure (Poly-Si/Ti/TiN/Al) in which Poly-Si (polysilicon layer 288), Ti (intermediate layer 289), TiN (intermediate layer 289), and Al (metal layer 290) are stacked in this order. Preferably, the metal layer 290 has an Mo layer in addition thereto. Mo has a high melting point, and therefore, if the Mo layer is contained in the metal layer 290, the metal layer 290 can be restrained from being melted by heat generated when a high current flows through the source electrode 287.

A drain electrode 294 is formed on the reverse surface 257 of the SiC substrate 255 such that the whole area of the reverse surface 257 is covered therewith. This drain electrode 294 is an electrode shared among all the unit cells 271. A laminated structure (Ti/Ni/Au/Ag) in which, for example, Ti, Ni, Au, and Ag are stacked in order from the side of the SiC substrate 255 can be employed as the drain electrode 294.

The same operational effect as in the MIS transistor 201 of the ninth preferred embodiment can be fulfilled by the structure of the MIS transistor 251.

In other words, in the tenth preferred embodiment, the polysilicon layer 288 makes a heterojunction with respect to the drift region 263 (the drift exposure region 283). Therefore, when a counter electromotive force is applied to the source-drain interval, an electric current preferentially flows to the heterojunction part between the drift region 263 and the second part 292 of the polysilicon layer 288, and an electric current flowing to the body diode 293 can be reduced or eliminated. Thus, the electric current that has flowed through the MIS transistor 251 can be allowed to flow to the electric motor in the form of, for example, a return current.

Thus, during an OFF state, an electric current flows to the drift region 263 from the second part 292 of the polysilicon layer 288 formed in the source trench 274 at the center of the unit cell 271 surrounded by the body-to-body region 265, and therefore carriers hardly move near the body-to-body region 265 (i.e., between the p type body region 262 and the n type drift region 263). Therefore, holes and electrons can be prevented from recombining together in the drift region 263. As a result, the crystal defect of SiC can be restrained from expanding in the SiC epitaxial layer 258, and therefore the on-resistance of the transistor 251 can be restrained from rising.

Additionally, in an OFF state (i.e., when the gate voltage is 0V), specifically in a case in which the body-to-body region 265 is formed in a grid-like manner and in which the planarly-viewed quadrangular unit cells 271 are arranged at a window part of the grid-like body-to-body region 265 in the same way as in the tenth preferred embodiment, the insulation breakdown of the gate insulation film 272 is particularly liable to occur near the corner part 281 of the body region 262 formed in each corner portion 270 of the unit cell 271.

Specifically, the distance $D_3$ between the source trenches 274 next to each other on the diagonal of the intersection portion 267 of the body-to-body region 265 (see the O-O cross section of FIG. 25) becomes greater than the distance $D_4$ between the source trenches 274 next to each other with the linear portion 266 of the body-to-body region 265 therebetween (see the P-P cross section of FIG. 25) (for example, the distance $D_3$ is 1.4 times the distance $D_4$ in the tenth preferred embodiment). Therefore, equipotential surfaces enter an area directly under the corner part 281 of the body region 262 having a relatively wide space, and densely gather thereat. As a result, the insulation breakdown of the gate insulation film 272 is particularly liable to occur near the corner part 281 of the body region 262.

Therefore, in the MIS transistor 251 of the tenth preferred embodiment, the gate breakdown voltage holding region 277 (first region 279) is formed at the corner part 281 of the body region 262. Accordingly, a body diode 298 can be formed near the corner part 281 of the body region 262 by means of a junction (pn junction) between the first region 279 and the drift region 263. Additionally, in the MIS transistor 251, the source breakdown voltage holding region 278 is formed at the edge part 282 of the source trench 274 formed at the central part of each unit cell 271. Therefore, an annular body diode 299 surrounding the edge part 282 of the source trench 274 can be formed by a junction (pn junction) between the source breakdown voltage holding region 278 and the drift region 263.

The presence of a depletion layer generated in these body diodes 298 and 299 can prevent an equipotential surface from entering between the corner part 281 of the body region 262 and the edge part 282 of the source trench 274, and can distance it from the gate insulation film 272. As a result, equipotential surfaces can be prevented from densely gathering near the corner part 281 of the body region 262. As a result, an electric field to be applied to the gate insulation film 272 can be reduced, and hence the insulation breakdown can be restrained. Additionally, the concentration of the first region 279 is higher than that of the drift region 263, and therefore a depletion layer generated by a junction (pn junction) between the first region 279 and the drift region 263 can be prevented from excessively spreading in the SiC epitaxial layer 258.

On the other hand, the gate breakdown voltage holding region 277 (second region 280) smaller in width than the linear portion 266 is formed at the linear portion 266 of the body-to-body region 265. As a result, a depletion layer to be generated by a junction (pn junction) between the second region 280 and the drift region 263 can be allowed to occur along the linear portion 266 of the body-to-body region 265. Therefore, an electric field generated directly under the linear portion 266 of the body-to-body region 265 can be moderated by this depletion layer. As a result, an electric field generated in the gate insulation film 272 can be evenly moderated over the whole.

Moreover, the gate breakdown voltage holding region 277 (second region 280) is not formed at the peripheral edge (i.e., part at which a channel is formed in the unit cell 271) of the body region 262. Therefore, channel characteristics can also be controlled accurately.

Although the preferred embodiments of the present invention have been described as above, the present invention can be embodied in other modes.

For example, an arrangement may be employed in which the conductivity type of each semiconductor part of the Schottky barrier diode 1 and the MIS transistors 21, 61, 71, 101, 161, 181, 191, 201, 247, 251, and 297 is inverted. For example, in the MIS transistor 21, the p type part may be an n type part, and the n type part may be a p type part.

Additionally, in the devices 1, 21, 61, 71, 101, 161, 181, 191, 201, 247, 251, and 297, a layer of which a breakdown voltage holding layer consists may be a layer made of a wide bandgap semiconductor other than SiC, and, more specifically, may be a layer made of GaN (bandgap $Eg_{GaN}$=about 3.4 eV) or diamond (bandgap $Eg_{dia}$=about 5.5 eV) without being limited to an epitaxial layer made of SiC. Additionally, it may be a compound semiconductor typified by a Group III-V compound or a Group II-VI compound.

Additionally, another preferred embodiment of the present invention may be carried out so that a part contiguous to a device outer-peripheral part, such as an interlayer insulation film of a JFET (junction field effect transistor), an interlayer insulation film of a bipolar transistor, or an interlayer insulation film of a thyristor, is made of a high-k material.

The semiconductor power device of the present invention can be built into a power module that is used in an inverter circuit forming a driving circuit to drive an electric motor used as a power source for use in, for example, electric vehicles (including hybrid vehicles), trains, or industrial robots. Additionally, the semiconductor power device of the present invention can be built into a power module that is used in an inverter circuit in which electric power generated by solar batteries, wind generators, or other power generators (particularly, private electric generators) is converted so as to match electric power of a commercial power source.

The preferred embodiments of the present invention are merely specific examples used to clarify the technical contents of the present invention, and the present invention should not be understood as being limited to these examples, and the spirit and scope of the present invention are to be determined solely by the appended claims.

Additionally, the components shown in each preferred embodiment of the present invention can be combined together within the scope of the present invention.

REFERENCE SIGNS LIST

1 . . . Schottky barrier diode, 3 . . . Cathode electrode, 4 . . . SiC epitaxial layer, 5 . . . Active region, 7 . . . Field region, 8 . . . Field insulation film, 9 . . . Anode electrode, 10 . . . Schottky metal, 12 . . . Peripheral edge (of field insulation film), 13 . . . Inner edge (of field region), 17 . . . Outer edge (of Schottky metal), 21 . . . MIS transistor, 28 . . . SiC epitaxial layer, 29 . . . Surface (of epitaxial layer), 30 . . . Active region, 31 . . . Transistor-surrounding region, 32 . . . Body region, 33 . . . Drift region, 34 . . . Source region, 35 . . . Gate trench, 36 . . . Both-ends corner portion (of gate trench), 37 . . . Side surface (of gate trench), 38 . . . Bottom surface (of gate trench), 39 . . . Gate insulation film, 40 . . . Gate electrode, 41 . . . Source trench, 48 . . . Interlayer insulation film, 50 . . . Source electrode, 51 . . . Drain electrode, 53 . . . Gate insulation film, 54 . . . Interlayer insulation film, 61 . . . MIS transistor, 62 . . . Gate insulation film, 63 . . . $SiO_2$ film, 64 . . . High-k film, 71 . . . MIS transistor, 78 . . . SiC epitaxial layer, 79 . . . Surface (of epitaxial layer), 80 . . . Active region, 81 . . . Transistor-surrounding region, 82 . . . Body region, 83 . . . Drift region, 85 . . . Source region, 86 . . . Gate insulation film, 87 . . . Gate electrode, 89 . . . Interlayer insulation film, 91 . . . Source electrode, 92 . . . Drain electrode, 101 . . . MIS transistor, 108 . . . SiC epitaxial layer, 109 . . . Surface (of epitaxial layer), 110 . . . Active region, 111 . . . Transistor-surrounding region, 112 . . . Gate trench, 117 . . . Source region, 118 . . . Body region, 119 . . . Drift region, 122 . . . Gate insulation film, 123 . . . Bottom surface (of gate trench), 124 . . . Side surface (of gate trench), 125 . . . Gate electrode, 126 . . . SBD source trench, 143 . . . Interlayer insulation film, 152 . . . Drain electrode, 161 . . . MIS transistor, 162 . . . SBD source trench, 166 . . . Di source trench, 181 . . . MIS transistor, 182 . . . Gate insulation film, 183 . . . Gate electrode, 191 . . . MIS transistor, 201 . . . MIS transistor, 208 . . . SiC epitaxial layer, 209 . . . Surface (of epitaxial layer), 210 . . . Active region, 211 . . . Transistor-surrounding region, 212 . . . Body region, 213 . . . Drift region, 214 . . . Source region, 215 . . . Gate trench, 218 . . . Side surface (of gate trench), 219 . . . Bottom surface (of gate trench), 222 . . . Gate insulation film, 223 . . . Gate electrode, 224 . . . Source trench, 235 . . . Interlayer insulation film, 247 . . . MIS transistor, 251 . . . MIS transistor, 258 . . . SiC epitaxial layer, 259 . . . Surface (of epitaxial layer), 260 . . . Active region, 261 . . . Transistor-surrounding region, 262 . . . Body region, 263 . . . Drift region, 264 . . . Source region, 272 . . . Gate insulation film, 273 . . . Gate electrode, 274 . . . Source trench, 285 . . . Interlayer insulation film, 287 . . . Source electrode, 297 . . . MIS transistor

The invention claimed is:

1. A method for producing a semiconductor power device, the semiconductor power device having a semiconductor layer and a trench-gate type transistor structure formed in the semiconductor layer, the trench-gate type transistor structure comprising: a first conductivity type source region; a second conductivity type body region contiguous to the source region; a first conductivity type drift region contiguous to the body region; a gate trench formed in such a way as to straddle the source region, the body region, and the drift region; a gate insulation film formed on an inner surface of the gate trench; and a gate electrode facing the body region with the gate insulation film therebetween, the method comprising:

a step of forming the gate trench from a surface of the semiconductor layer toward an inside thereof;

a step of forming a first insulation film on the inner surface of the gate trench, the first insulation film having a bottom portion formed on a bottom surface of the gate trench and a side portion formed on a side surface of the gate trench;

a step of removing the bottom portion of the first insulation film; and a step of forming a second insulation film having a dielectric constant higher than $SiO_2$ in such a way as to cover the bottom surface of the gate trench exposed by removing the bottom portion of the first insulation film.

2. The method for producing the semiconductor power device according to claim 1, wherein the step of forming the first insulation film is a step of forming the first insulation film according to a thermal oxidation method, and the step of forming the second insulation film is a step of forming the second insulation film according to a CVD method.

3. The method for producing the semiconductor power device according to claim 1, wherein the first insulation film is made of $SiO_2$.

4. The method for producing the semiconductor power device according to claim 1, wherein the semiconductor layer is made of a wide bandgap semiconductor.

5. The method for producing the semiconductor power device according to claim 4, wherein the wide bandgap semiconductor includes SiC, GaN or diamond.

6. The method for producing the semiconductor power device according to claim 4, wherein the wide bandgap semiconductor includes SiC, and the surface of the semiconductor layer is an Si (silicon) plane of SiC.

7. The method for producing the semiconductor power device according to claim 1, wherein the step of forming the first insulation film includes a step of forming the first insulation film having a first portion on a side surface of the gate trench and a second portion on the bottom surface of the gate trench which is thinner than the first portion.

8. The method for producing the semiconductor power device according to claim 1, wherein the step of removing the first insulation film includes a step of selectively removing a portion of the first insulation film on corner portions of both ends of the gate trench.

9. The method for producing the semiconductor power device according to claim 1, wherein the step of removing the first insulation film includes a step of removing the first insulation film by etching.

10. The method for producing the semiconductor power device according to claim 1, wherein the second insulation film is made of a high-k dielectric material.

11. The method for producing the semiconductor power device according to claim 10, wherein the high-k dielectric material includes SiN, $Al_2O_3$ or AlON.

12. The method for producing the semiconductor power device according to claim 1, comprising a step of the gate insulation film having a two-layer structure consisting of the first insulation film and the second insulation film on a side surface of the gate trench and a single-layer structure consisting of the second insulation film on the bottom surface of the gate trench by forming the second insulation film.

* * * * *